(12) United States Patent
Kaniwa et al.

(10) Patent No.: US 11,055,628 B2
(45) Date of Patent: Jul. 6, 2021

(54) PROGRAM STORAGE MEDIUM, METHOD, AND SYSTEM FOR PROVIDING LEARNING MODEL DIFFERENCE

(71) Applicant: FUJITSU LIMITED, Kawasaki (JP)

(72) Inventors: Tomo Kaniwa, Kawasaki (JP); Mitsuru Sato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1078 days.

(21) Appl. No.: 15/499,029

(22) Filed: Apr. 27, 2017

(65) Prior Publication Data

US 2017/0351972 A1  Dec. 7, 2017

(30) Foreign Application Priority Data

Jun. 1, 2016  (JP) .............................. JP2016-109821

(51) Int. Cl.
*G06N 20/00* (2019.01)
*G06N 5/02* (2006.01)
(Continued)

(52) U.S. Cl.
CPC ............ *G06N 20/00* (2019.01); *G06F 30/20* (2020.01); *G06F 30/39* (2020.01); *G06N 5/022* (2013.01)

(58) Field of Classification Search
CPC ........ G06N 20/00; G06N 5/022; G06F 30/20; G06F 30/39
See application file for complete search history.

(56) References Cited

U.S. PATENT DOCUMENTS

2014/0279754 A1* 9/2014 Barsoum ................ G06N 20/00
706/12
2015/0169824 A1* 6/2015 Kermani ................ G16B 40/00
702/19
(Continued)

FOREIGN PATENT DOCUMENTS

JP   2004-86896   3/2004
JP   2006-85646   3/2006
(Continued)

OTHER PUBLICATIONS

S. Kuroda, "Economic Analysis by the Neural Network (2) Application of Currency Authorities to Foreign Exchange Market Intervention", Bank of Japan, IMES Discussion Paper Series (1997), No. 97-J-13, Oct. 1997, pp. 1-26**.
(Continued)

*Primary Examiner* — Kamran Afshar
*Assistant Examiner* — Urmana Islam
(74) *Attorney, Agent, or Firm* — Staas & Halsey LLP

(57) ABSTRACT

A learning model difference providing method that causes a computer to execute a process which includes: calculating a mismatch degree between prediction data about arbitrary data included in a plurality of pieces of data that are input by using an application program, the prediction data being obtained by the plurality of pieces of data and a learning model in accordance with a purpose of use of the application program, and data that are specified for the arbitrary data; assessing whether or not the calculated mismatch degree exceeds a first degree; and transmitting the mismatch degree to a providing source of the learning model in a case where the mismatch degree is assessed as exceeding the first degree.

6 Claims, 41 Drawing Sheets

(51) Int. Cl.
*G06F 30/20* (2020.01)
*G06F 30/39* (2020.01)

(56) References Cited

U.S. PATENT DOCUMENTS

2016/0201933 A1\* 7/2016 Hester .................... G05B 15/02
  700/276
2017/0076217 A1\* 3/2017 Krumm .................. G06N 20/00

FOREIGN PATENT DOCUMENTS

| JP | 2006-235848 | 9/2006 |
| JP | 2015-521275 | 7/2015 |
| WO | WO 2010/050334 | 5/2010 |
| WO | WO 2013/160053 A1 | 10/2013 |

OTHER PUBLICATIONS

N. Nozaki et al., "Application of Artificial Intelligence Technology in Product Design", Fujitsu Limited, vol. 67, No. 3, May 1, 2016, pp. 58-65\*\*.

Japanese Office Action dated Jan. 14, 2020 in corresponding Japanese Patent Application No. 2016-109821.

\* cited by examiner

<SELECTION OF TARGET USER OR GROUP>
· SELECT USER ACCOUNT OF TARGET USER: USER LIST
· SELECT GROUP ID OF TARGET GROUP: GROUP LIST

<SELECTION OF PREDICTION ACCURACY ASSESSMENT STAGE>
· SELECT TARGET ASSESSMENT STAGE ID: PREDICTION ACCURACY
  ASSESSMENT STAGE LIST

<DECIDE FOLLOWING AS PREDICTION ACCURACY ASSESSMENT REFERENCE>
· THRESHOLD VALUE OF ALLOWABLE ERROR OF PREDICTION VALUE
  →
· THRESHOLD VALUE TO ASSESS CORRECT VALUE AS FAR FROM PREDICTION
  VALUE
  →
· NUMBER OF PREDICTIONS OUTSIDE OF ALLOWABLE ERROR OF CORRECT
  VALUE/NUMBER OF ALL PREDICTIONS
  →

2300

<SELECTION OF TARGET USER OR GROUP>
· SELECT USER ACCOUNT OF TARGET USER: NONE
· SELECT GROUP ID OF TARGET GROUP: 2: NETWORK

<SELECTION OF PREDICTION ACCURACY ASSESSMENT STAGE>
· SELECT TARGET ASSESSMENT STAGE ID: 2: PACKAGING DESIGN
  COMPLETION TIMING

<DECIDE FOLLOWING AS PREDICTION ACCURACY ASSESSMENT REFERENCE>
· THRESHOLD VALUE OF ALLOWABLE ERROR OF PREDICTION VALUE
  →1
· THRESHOLD VALUE TO ASSESS CORRECT VALUE AS FAR FROM PREDICTION
  VALUE
  →3
· NUMBER OF PREDICTIONS OUTSIDE OF ALLOWABLE ERROR OF CORRECT
  VALUE/NUMBER OF ALL PREDICTIONS
  →0.1

USAGE PURPOSE: PREDICTION OF NUMBER OF LAYERS
INPUT DATA: NUMBER OF COMPONENTS, NUMBER OF COMPONENT PINS,
NUMBER OF NETS, SUBSTRATE AREAS, ...
OUTPUT DATA: PREDICTED NUMBER OF LAYERS

PROGRAM STORAGE MEDIUM, METHOD, AND SYSTEM FOR PROVIDING LEARNING MODEL DIFFERENCE

CROSS-REFERENCE TO RELATED APPLICATION

This application is based upon and claims the benefit of priority of the prior Japanese Patent Application No. 2016-109821, filed on Jun. 1, 2016, the entire contents of which are incorporated herein by reference.

FIELD

The embodiment discussed herein is related to a learning model difference providing program storage medium, a learning model difference providing method, and a learning model difference providing system.

BACKGROUND

In recent years, there is a technique that is referred to as cloud application in which a user receives a service of an application via the Internet. A cloud application is installed in a device that is used by the user. Setting information, editing data, a usage history, and so forth of the cloud application installed in the device are stored in a server on a network.

Further, there is a technique that is referred to as machine learning in which prediction of the future is performed by using regularity and patterns which are obtained from data. For example, in a learning model of the machine learning, input data are received, a prediction value for the received data is calculated, and the prediction value is output.

Further, in related art, there is a technique in which discrimination accuracies of an existing identification apparatus that is created by using learning data of initial settings and a new identification apparatus that is created by using newly set learning data are respectively calculated and the identification apparatus is thereby switched from the existing identification apparatus to an identification apparatus with higher discrimination accuracy (for example, International Publication Pamphlet No. WO 2010/050334). Further, in related art, there is a technique in which plural learning models for calculating prediction amounts of merchandise are provided, evaluation values of the respective learning models are calculated based on prediction errors that are calculated from differences between cumulative prediction amounts in the past and a cumulative achievement amount, and one learning model is thereby selected from the plural learning models based on the evaluation values (for example, Japanese Laid-open Patent Publication No. 2006-85646). Further, in related art, applicable learning models for finding correlations are determined based on input data, prediction results are calculated by applying an arbitrary parameter set to each of the learning models, and the optimal learning model is thereby selected based on the residual between the prediction results and the input data (for example, Japanese Laid-open Patent Publication No. 2006-235848).

However, in related art, there is a problem in that a provider of a learning model of machine learning may not determine whether or not prediction data that are obtained by the learning model are correct. For example, in a case where whether or not the prediction data are correct may not be determined, it is difficult to perform correction and so forth to the learning model.

It is desirable to provide a learning model difference providing program, a learning model difference providing method, and a learning model difference providing system that may provide information about a divergence in the learning model for a provider side of the learning model.

SUMMARY

According to an aspect of the invention, a learning model difference providing method that causes a computer to execute a process. The process includes: calculating a mismatch degree between prediction data about arbitrary data included in a plurality of pieces of data that are input by using an application program, the prediction data being obtained by the plurality of pieces of data and a learning model in accordance with a purpose of use of the application program, and data that are specified for the arbitrary data; assessing whether or not the calculated mismatch degree exceeds a first degree; and transmitting the mismatch degree to a providing source of the learning model in a case where the mismatch degree is assessed as exceeding the first degree.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 23 is an explanatory diagram that illustrates examples of inputs of selection of a target, selection of an accuracy assessment stage, and an accuracy assessment reference;

FIG. 24 is an explanatory diagram that illustrates an information example of a usage method of the learning model;

DESCRIPTION OF EMBODIMENT

An embodiment of a learning model difference providing program, a learning model difference providing method, and a learning model difference providing system according to the present disclosure will hereinafter be described in detail with reference to the attached drawings.

Figure 1:
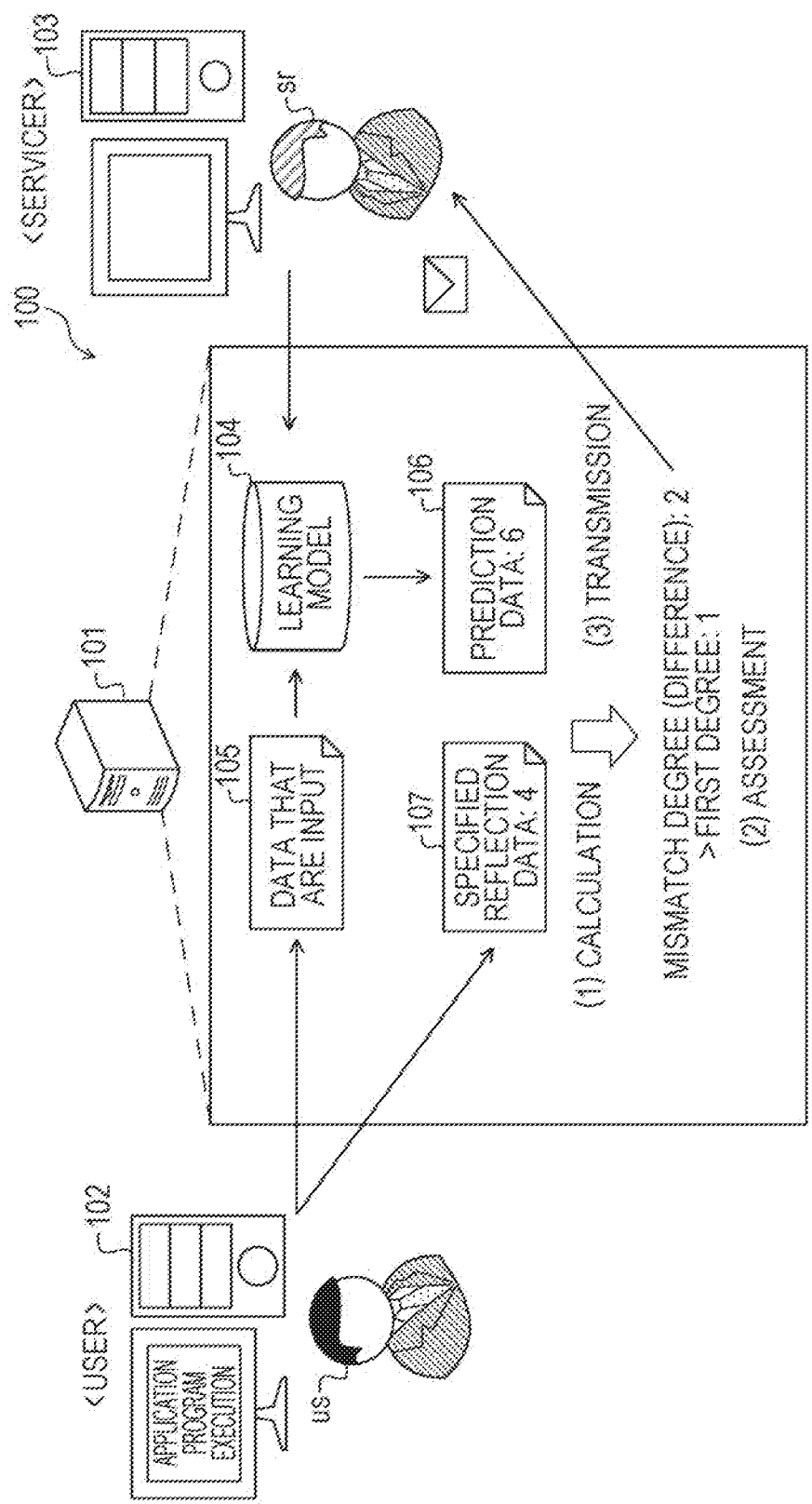
FIG. 1 is an explanatory diagram that illustrates one action example of a learning model difference providing system.

FIG. 1 is an explanatory diagram that illustrates one action example of a learning model difference providing system. A learning model difference providing system 100 is a system that is capable of feeding back information about the divergence between prediction data which are obtained by a prediction model of machine learning in accordance with the purpose of use of an application program and data which are specified by a user us to a provider of a learning model of the machine learning. The prediction model of the machine learning will hereinafter be abbreviated and referred to as learning model. The learning model is a program in which a function which outputs prediction data based on input data when the input data are given is coded.

In related art, there is a problem in that the provider of the learning model may not determine whether or not the prediction data that are obtained by the learning model are correct. For example, in a case where whether or not the prediction data are correct may not be determined, it is difficult to perform correction and so forth to the learning model.

In this embodiment, an information processing device 101 notifies a device of a providing source of the learning model of a mismatch degree in a case where the mismatch degree between a prediction value about data in the data obtained by a learning model 104 based on the input data in the application program and a specified value about the data is high. Accordingly, the information about the divergence of the learning model 104 may be provided to the provider of the learning model. Therefore, the provider may consider correction to the learning model in accordance with the mismatch degree and may support an improvement in prediction accuracy of the learning model.

The learning model difference providing system 100 has a user terminal device 102, the information processing device 101, and a provider terminal device 103. The user terminal device 102 is a first terminal device that executes an installed application program. The user terminal device 102 creates data by using the application program in accordance with an operation of the user us. Here, the user us is a user of the application program and is a user of the learning model 104. The user us may be an individual or a group such as a company. Here, it is assumed that the application program is a cloud application. The information processing device 101 manages data as an electronic file that is created by the application program. Further, the information processing device 101 manages setting information and so forth of the cloud application. The provider terminal device 103 is a device that is usable by the provider of the learning model 104 and is a second terminal device of the providing source of the learning model 104. The provider of the learning model 104 will also be referred to as servicer sr. The servicer sr may be an individual or a company, for example. Here, plural user terminal devices 102 and plural provider terminal devices 103 may be provided. However, here, for easy understanding, it is assumed that one user terminal device 102 and one provider terminal device 103 are provided.

Further, the information processing device 101 calculates the mismatch degree between prediction data 106 about arbitrary data included in data 105, which are obtained by the data 105 which are input and the learning model 104, and reflection data 107 which are specified for the arbitrary data. The data 105 that are input are data that are input by using the application program. The prediction data 106 and the reflection data 107 are numerical values, characters, and character strings. The mismatch degree indicates the degree of the mismatch between the prediction data 106 and the reflection data 107. The mismatch degree is represented by a character or a numerical value, for example. As the mismatch degree, for example, the information that indicates whether or not the prediction data 106 match the reflection data 107 may be raised. Further, as the mismatch degree, for example, the difference value between the prediction data 106 and the reflection data 107 may be raised.

For example, in a case the application program is computer-aided design (CAD), the data 105 that are input by using the application program are design data. Then, arbitrary data included in the design data is an arbitrary item that is included in the design data. The prediction data 106 about the arbitrary data is the prediction value about the item. For example, in a case where the item is an item of the number of substrates, the prediction value is the number of substrates. The learning model 104 predicts the prediction value about the number of substrates while having the design data as the input data, for example. The learning model 104 in accordance with the purpose of use of the CAD may be created in accordance with the kind or the like of a product that is designed by the CAD, for example. The reflection data 107 that are specified for the arbitrary data is the number of substrates that is specified by the user us.

Further, for example, in a case where the application program is a document creation application program, the data 105 that are input by using the application program are document data. The learning model 104 is a kana-kanji conversion candidate of characters, for example. Arbitrary data included in the document data is a character string as a conversion target that is included in the document data. The prediction data 106 about the arbitrary data is a conversion candidate of the character string as the conversion target, for example. Here, as an example of conversion, conversion of input kana characters to kanji characters may be raised. Then, the specified reflection data are kanji characters as a conversion result that is confirmed by the user.

In the example in FIG. 1, the prediction data 106 is six, and the reflection data 107 is four. The information processing device 101 calculates the difference value between the prediction data 106 and the reflection data 107 as the mismatch degree. In the example in FIG. 1, the mismatch degree is two.

Next, the information processing device 101 assesses whether or not the calculated mismatch degree exceeds a first degree. The first degree is predetermined information. The first degree is represented by a character or a numerical value, similarly to the mismatch degree. In the example in FIG. 1, because the mismatch degree is the difference value, the first degree is represented by a numerical value and is one. In the example in FIG. 1, the information processing device 101 assesses the mismatch degree as exceeding the first degree.

Then, in a case where the information processing device 101 assesses the mismatch degree as exceeding the first degree, the information processing device 101 transmits the mismatch degree to the provider terminal device 103. In a process of transmitting the mismatch degree, the information processing device 101 transmits an email, a message, or the like to the provider terminal device 103 while relating the mismatch degree with identification information of the learning model 104, for example. Accordingly, the information about the divergence of the prediction data 106 may be provided to the servicer sr, and creation of the learning model 104 by the servicer sr may thereby be supported.

In FIG. 1, because the application program is the cloud application, an example is described where the user terminal device 102 is different from the information processing device 101. However, in a case where the application program is not the cloud application, the user terminal device 102 may be the same as the information processing device 101.

In this embodiment, while it is presumed that the application program is the cloud application, a description will be made about an example of the learning model difference providing system 100 on an assumption of a case where the cloud application is used by plural users us. Here, before a description about a specific example of the learning model difference providing system 100, a simple description will be made about the cloud application and the learning model 104.

Figure 2:
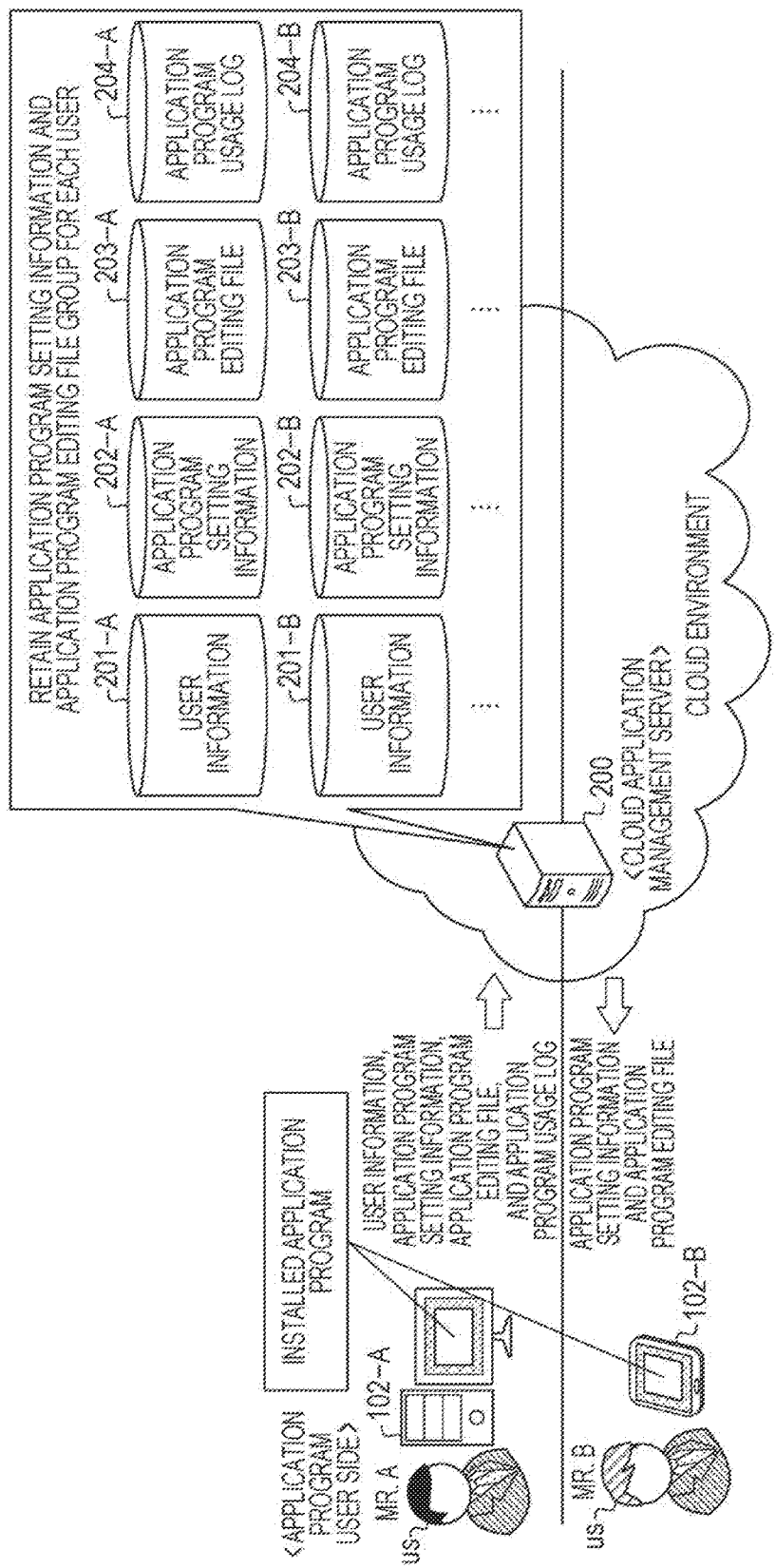
FIG. 2 is an explanatory diagram that illustrates a using environment example of a cloud application.

FIG. 2 is an explanatory diagram that illustrates a using environment example of the cloud application. In recent years, there is a technique that is referred to as cloud application in which the users us receive a service of an application program via the Internet. The cloud application is installed in devices that are used by the users us. As devices that are used by the user us, for example, local devices such as a personal computer (PC) and a portable terminal device, cloud devices, virtual machines (VM), and so forth may be raised.

For example, in a case where the cloud device is used as the device that is used by the user us, the user us may use the cloud application by accessing the cloud device in which the cloud application is installed via the PC or the portable terminal device that is operable by the user us. For example, in a case where the VM is used as the device used by the user us, a server executes the application program, and the device that is operable by the user displays an image of a screen that is transferred from the server as remote desktop. In the example in FIG. 2, the local device such as the PC or the portable terminal device is the user terminal device 102.

Further, user information 201 of each of the user terminal devices 102 is saved in the cloud application management server 200 or the like. Application program setting information 202 of the cloud application that is installed in each of the user terminal devices 102 is saved in the cloud application management server 200 or the like. Accordingly, the user us may use the cloud application in the newest setting state by using the setting information that is saved in the server even in a case where the user us uses any device in which the cloud application is installed. In addition, an application program editing file 203 that is edited by the cloud application is also saved in the server or the like on a cloud. Accordingly, the user us may use the application program editing file 203 or the like that is saved in the cloud application management server 200 even in a case where the user us uses any user terminal device 102 in which the cloud application is installed. Accordingly, the cloud application may be used with the newest application program editing file 203.

Further, the user may save a file in the device that is operable by the user, without uploading the file to the cloud application management server 200. Further, a usage history such as operations and file editing by the user terminal device 102 is saved in the cloud application management server 200 as an application program usage log 204.

Figure 3:
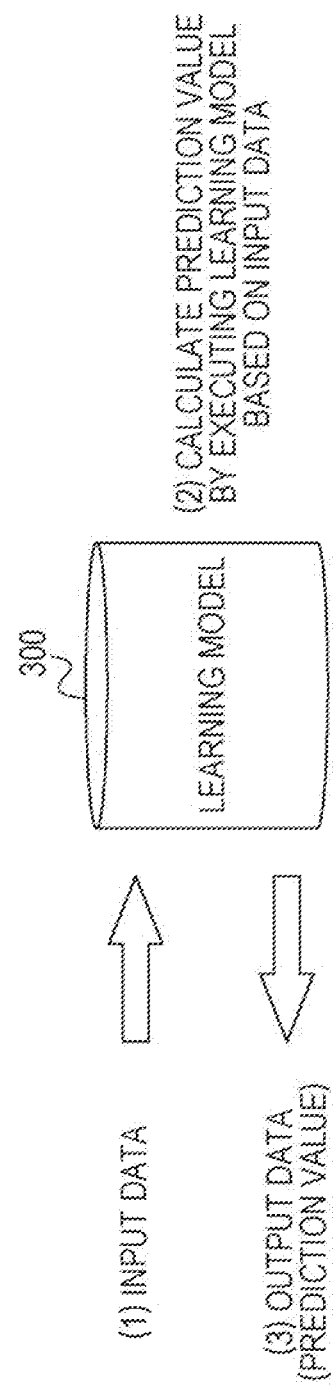
FIG. 3 is an explanatory diagram that illustrates an example of a learning model of machine learning.

FIG. 3 is an explanatory diagram that illustrates an example of the learning model of the machine learning. A learning model 300 is a program in which a function which outputs prediction data based on input data is coded. The learning model 300 is created for each of the purposes of use of the application program.

Further, the machine learning is a technique in which regularity and patterns are found from data and prediction of the future is performed by using the regularity and the patterns. For example, in the learning model 300 of the machine learning, input data are received, prediction data for the received data are calculated, and the predicted data are output.

In practical use of the learning model 300, a user side that uses the learning model 300 and a provider side that creates and provides the learning model 300 are present.

Figure 4:
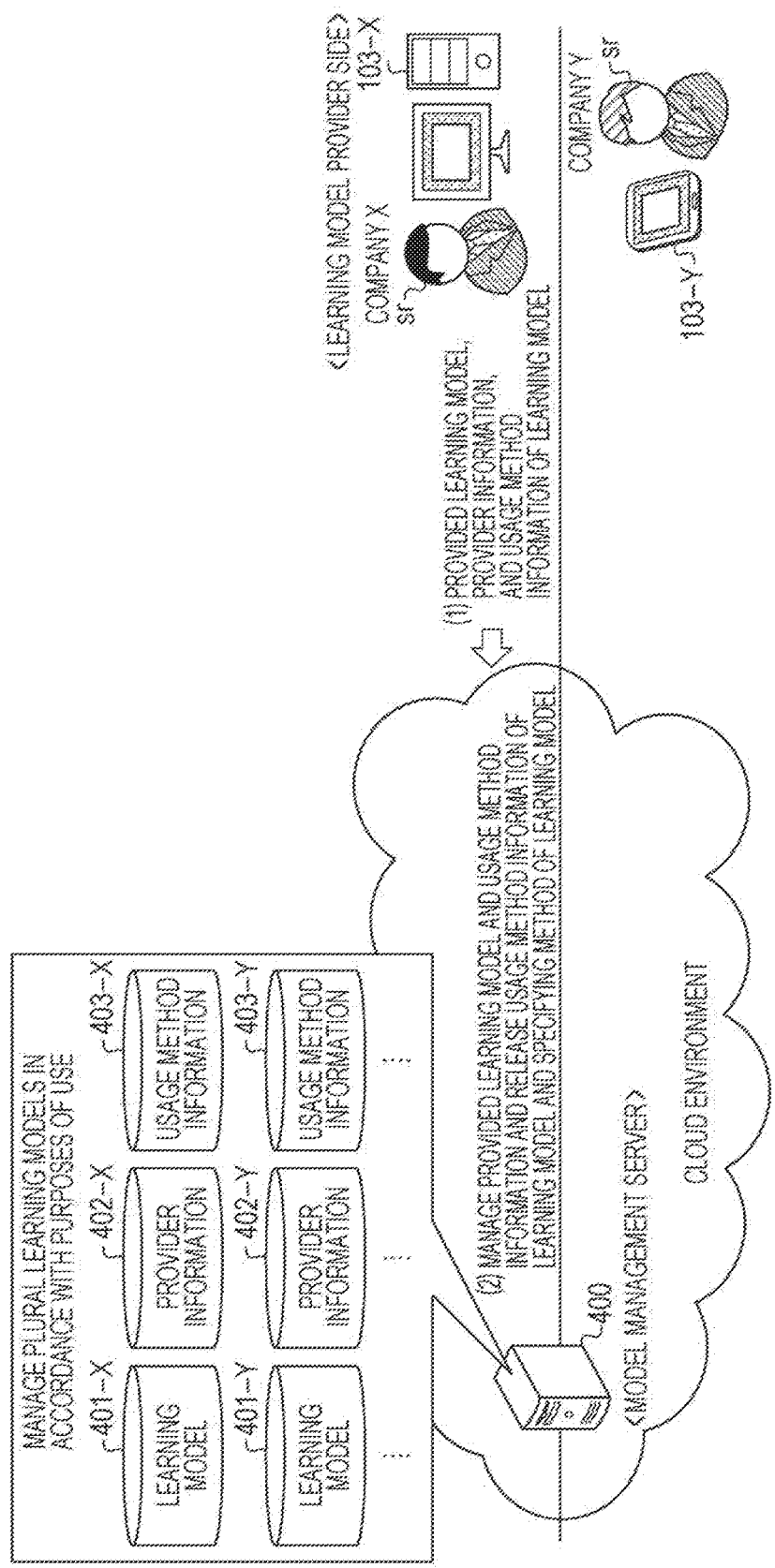
FIG. 4 is an explanatory diagram that illustrates an example of learning model management by a learning model provider side.

FIG. 4 is an explanatory diagram that illustrates an example of learning model management by a learning model provider side. As illustrated in part (1) in FIG. 4, the provider terminal device 103 of a learning model 401 transmits the learning model 401, provider information 402, a usage method information 403 of the learning model 401 to a model management server 400 on the cloud. As a device that is usable by the provider side of the learning model 401, not only a local PC or portable terminal device but also a server, a VM, and so forth on the cloud may be raised.

As illustrated in part (2) in FIG. 4, the model management server 400 on the cloud manages the provided learning model 401 and the usage method information 403. The model management server 400 releases the usage method information 403 of the learning model 401 and a specifying method of the learning model 401 to the user us side of the learning model 401.

Figure 5:
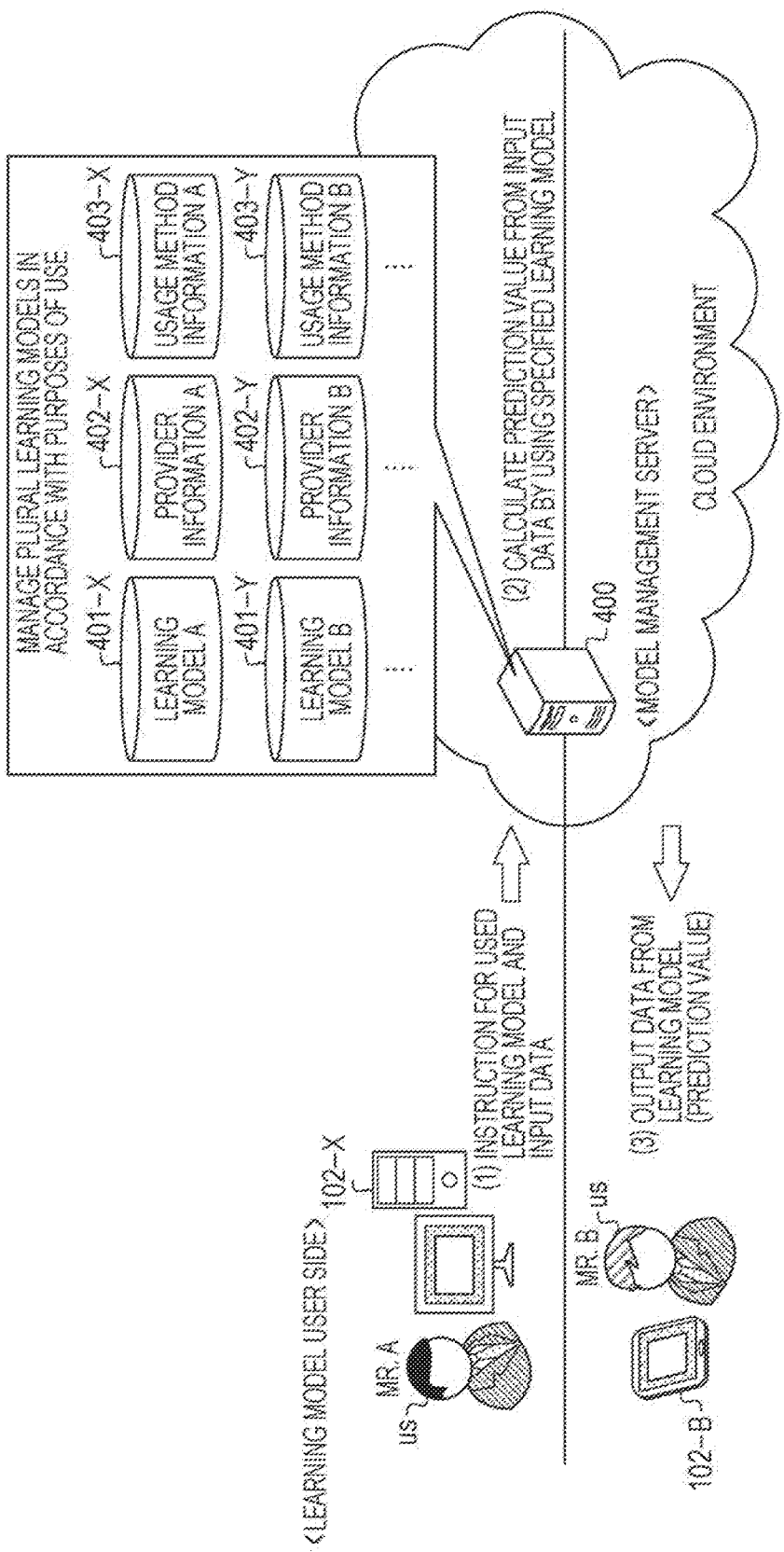
FIG. 5 is an explanatory diagram that illustrates a usage example of the learning model.

FIG. 5 is an explanatory diagram that illustrates a usage example of the learning model. First, as illustrated in part (1) in FIG. 5, the user side of the learning model 401 transmits an instruction for the learning model 401 that is used by the user terminal device 102 and input data that are given to the learning model 401 to the model management server 400.

Next, as illustrated in part (2) in FIG. 5, the model management server 400 uses the specified learning model 401 to calculate the prediction data from the input data. Then, as illustrated in part (3) in FIG. 5, the model management server 400 transmits output data as the prediction data that are calculated from the learning model 401 to the user terminal device 102.

Figure 6:
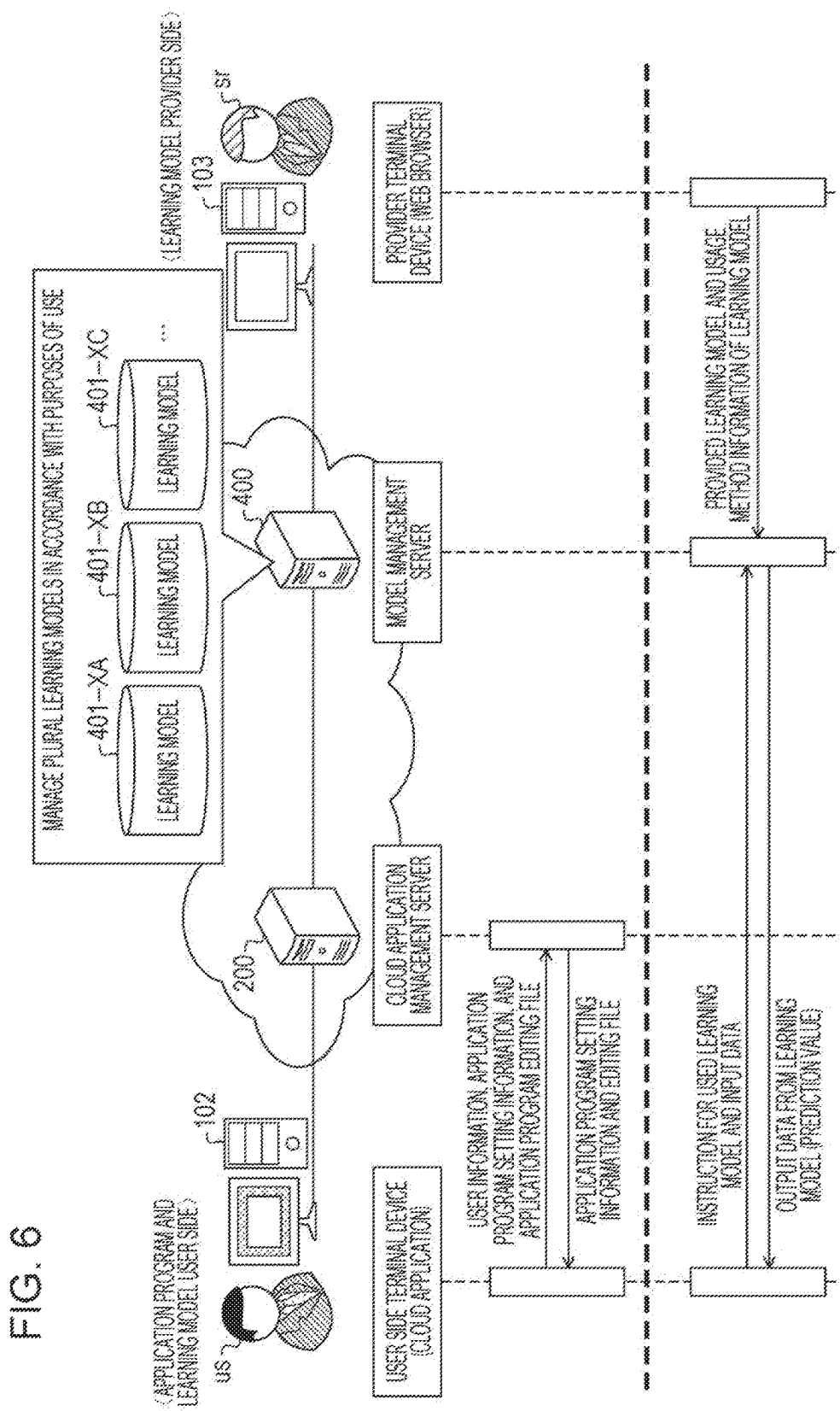
FIG. 6 is an explanatory diagram that illustrates a usage example of learning models on a cloud in the cloud application.

FIG. 6 is an explanatory diagram that illustrates a usage example of learning models on the cloud in the cloud application. The cloud application management server 200 and the model management server 400 may be the same device. However, in this embodiment, a description will be made on an assumption that the cloud application management server 200 and the model management server 400 are different devices in order to distinguish a function of the cloud application from a function of the learning model 401.

The servicer sr that is the provider of the learning model 401 creates and provides the learning model 401 for the cloud application. The model management server 400 preserves and manages plural learning models 401 for purposes of use that relate to the cloud application. The user side of the learning model 401 transmits the specification of the learning model 401 in accordance with the purpose of use of the cloud application and input data of the learning model 401 to the model management server 400 and causes an output value of the learning model 401 to be output from the model management server 400. The user us of the learning model 401 causes the output value of the learning model 401 acquired from the model management server 400 to be reflected on a cloud type editing file.

(Example of Learning Model Difference Providing System 100)

Figure 7:
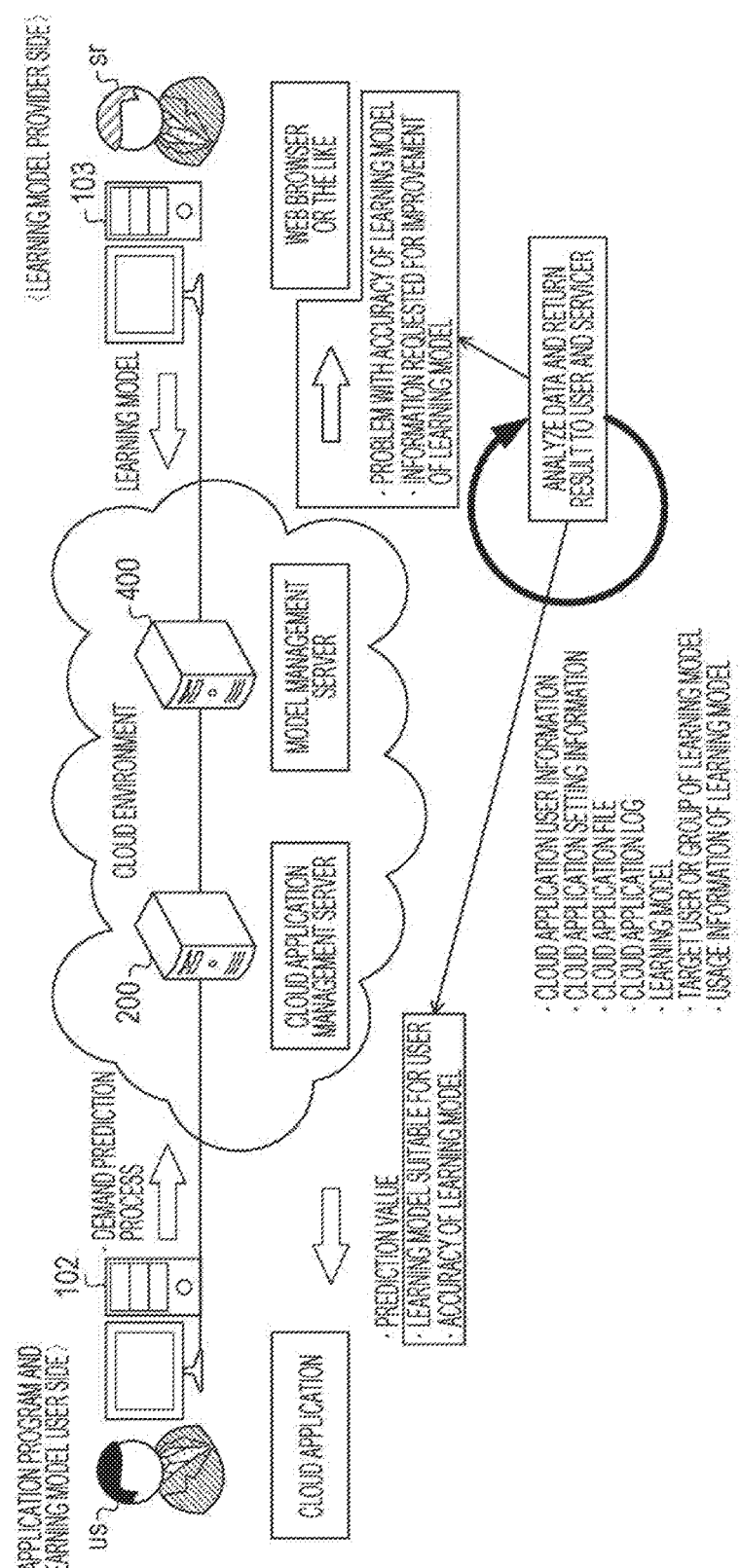
FIG. 7 is an explanatory diagram that illustrates an example of the learning model difference providing system.

FIG. 7 is an explanatory diagram that illustrates an example of the learning model difference providing system. The learning model difference providing system 100 has the user terminal device 102, the cloud application management server 200, the model management server 400, and the provider terminal device 103, for example. The user terminal device 102, the cloud application management server 200, the model management server 400, and the provider terminal device 103 are connected together via a network.

The user terminal device 102 is a device in which the cloud application is installed and is a device that is usable by the user us of the learning model. The user terminal device 102 may be a PC, a portable terminal device, a device on the cloud, a VM, or the like, for example. The provider terminal device 103 is a device that is usable by the provider side of the learning model. The provider terminal device 103 may be a PC, a portable terminal device, a device on the cloud, a VM, or the like, for example.

The cloud application management server 200 manages the setting information, the editing data, the usage history, and so forth of the cloud application by the user terminal device 102. The model management server 400 manages the learning model that is provided by the provider terminal device 103 and outputs the prediction value based on the learning model of an instruction and the input data.

Here, in this embodiment, in a case where the cloud application is the CAD, the cloud application management server 200 will be referred to as CAD management server. In a case where the cloud application is the document creation application program, the cloud application management server 200 will also be referred to as document application program management server.

(Hardware Configuration Example of Terminal Device C)

Next, a description will be made about hardware configuration examples of the terminal devices such as the user terminal device 102 and the provider terminal device 103. Here, the user terminal device 102 and the provider terminal device 103 will be represented as "terminal device c".

Figure 8:
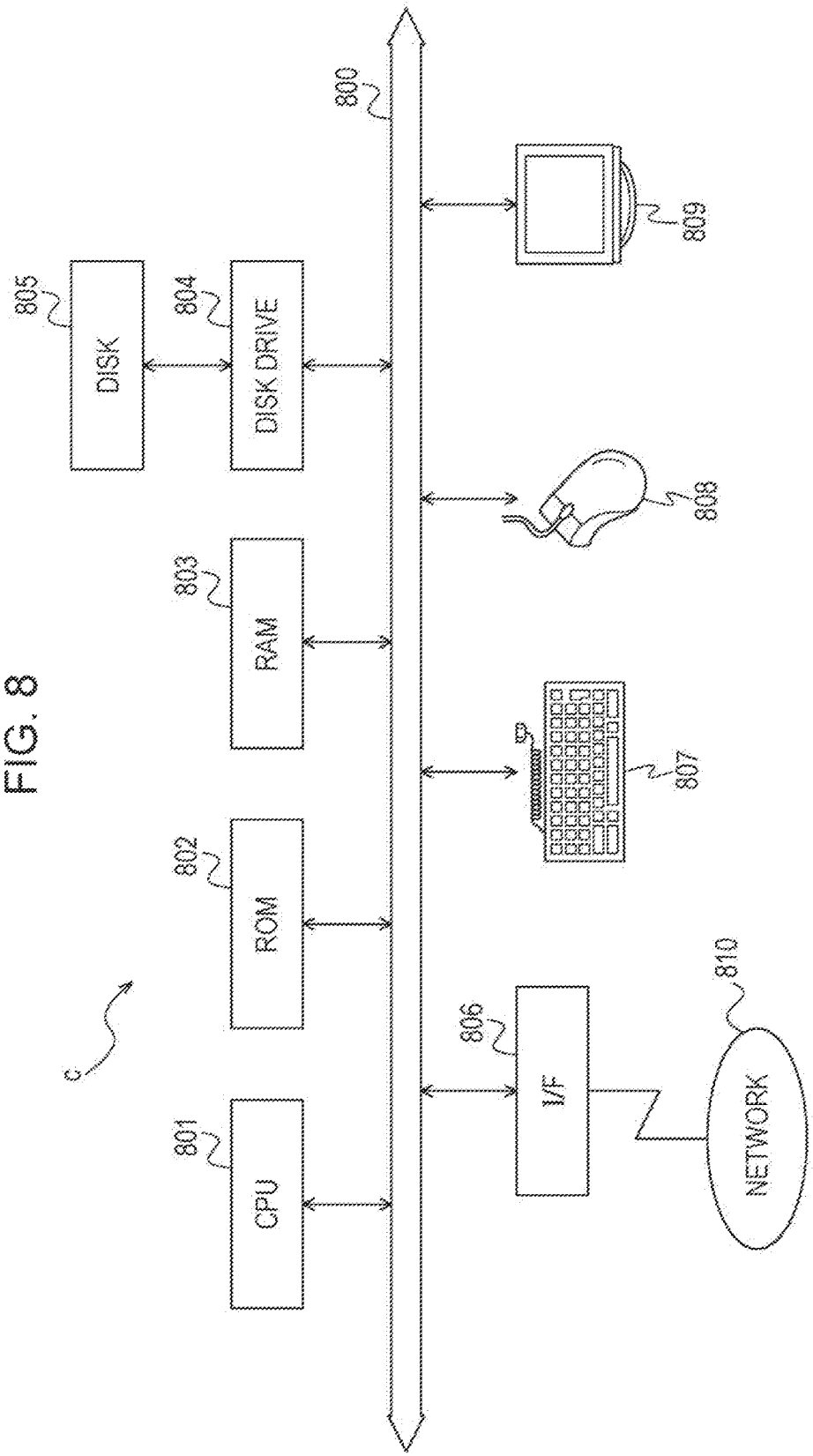
FIG. 8 is an explanatory diagram that illustrates a hardware configuration example of a terminal device c.

FIG. 8 is an explanatory diagram that illustrates a hardware configuration example of the terminal device c. The terminal device c has a central processing unit (CPU) 801, a read only memory (ROM) 802, a random access memory (RAM) 803, a disk drive 804, and a disk 805. A learning model difference providing device has an interface (I/F) 806, a keyboard 807, a mouse 808, and a display 809. Further, the CPU 801, the ROM 802, the RAM 803, the disk drive 804, the I/F 806, the keyboard 807, the mouse 808, and the display 809 are connected with each other by a bus 800.

Here, the CPU 801 conducts control of a whole client terminal device c. The ROM 802 stores programs such as a boot program. The RAM 803 is used as a work area of the CPU 801. The disk drive 804 controls reading and writing of data with respect to the disk 805 while following control by the CPU 801. The disk 805 stores data that are written by the control by the disk drive 804. As the disk 805, a magnetic disk, an optical disk, and so forth may be raised.

The I/F 806 is connected with a network 810 such as a local area network (LAN), a wide area network (WAN), or the Internet through a communication line and is connected with other devices such as servers via the network 810. Then, the I/F 806 conducts an interface between the network 810 and internal portions and controls inputs and outputs of data from external devices. As the I/F 806, a modem, a LAN adapter, or the like may be employed, for example.

The keyboard 807 and the mouse 808 are interfaces that receive inputs of various kinds of data by operations of the user. The display 809 is an interface that outputs data in accordance with an instruction of the CPU 801.

Further, although not illustrated, the terminal device c may be provided with an input device that takes in images and movies from a camera and an input device that takes in sounds from a microphone. Further, although not illustrated, the terminal device c may be provided with an output device such as a printer.

(Hardware Configuration Example of Server)

Next, a description will be made about hardware configuration examples of the cloud application management server 200 and the model management server 400. Here, the cloud application management server 200 and the model management server 400 will be represented as "server S".

Figure 9:
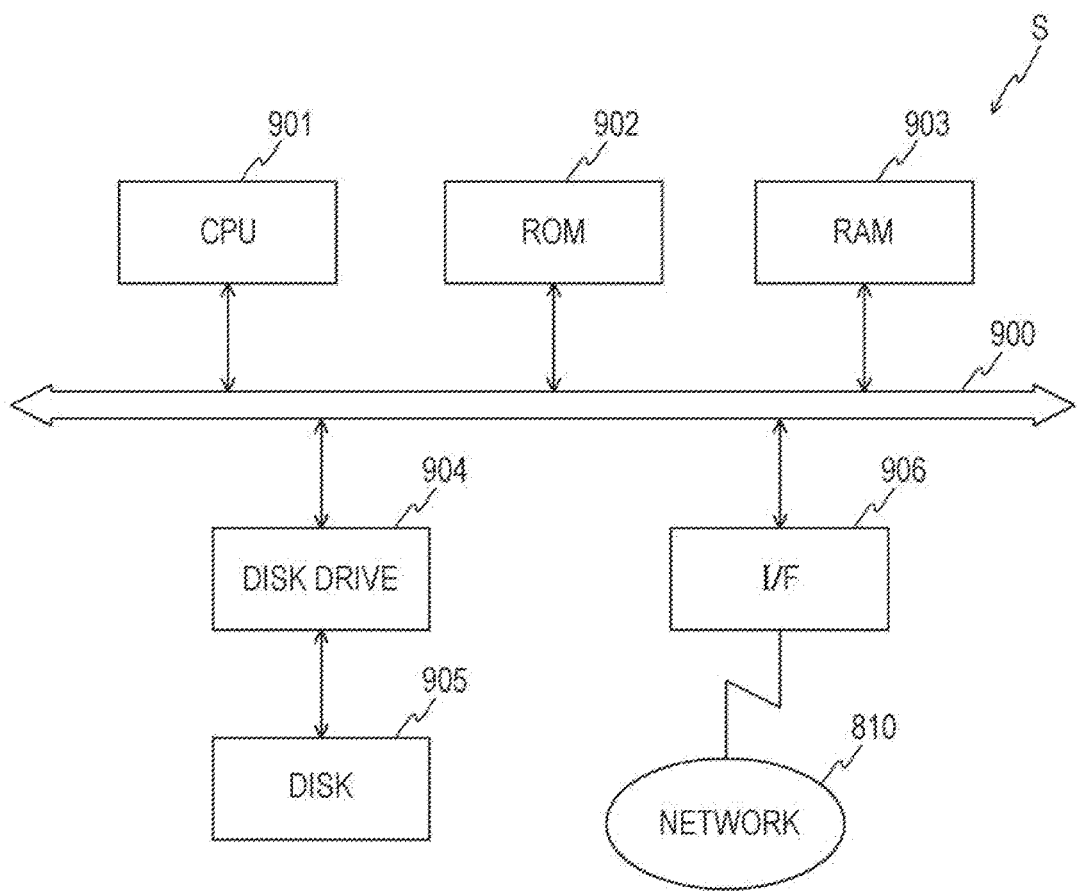
FIG. 9 is an explanatory diagram that illustrates a hardware configuration example of a server S.

FIG. 9 is an explanatory diagram that illustrates a hardware configuration example of the server S. The server S has a CPU 901, a ROM 902, a RAM 903, a disk drive 904, a disk 905, and an I/F 906.

The CPU 901, the ROM 902, the RAM 903, the disk drive 904, and the I/F 906 are connected with each other by a bus 900.

Here, the CPU 901 conducts control of the whole server S. The ROM 902 stores various kinds of programs. The programs that are stored in the ROM 902 are loaded to the CPU 901 and thereby cause the CPU 901 to execute coded processes. The RAM 903 is used as the work area of the CPU 901.

The I/F 906 is connected with the network 810 through a communication line and is connected with other devices such as the terminal devices c via the network 810. Then, the I/F 906 conducts an interface between the network 810 and internal portions and controls inputs and outputs of data from other computers. As the I/F 906, a modem, a LAN adapter, or the like may be employed, for example.

The disk drive 904 controls reading and writing of data with respect to the disk 905 while following control by the CPU 901. The disk 905 stores data that are written by the control by the disk drive 904. As the disk 905, a magnetic disk, an optical disk, and so forth may be raised, for example.

Further, the server S may have a solid state drive (SSD), a keyboard, a mouse, a display, and so forth, for example, other than the above-described configuration portions.

(Functional Configuration Example of Learning Model Difference Providing System)

Figure 10:
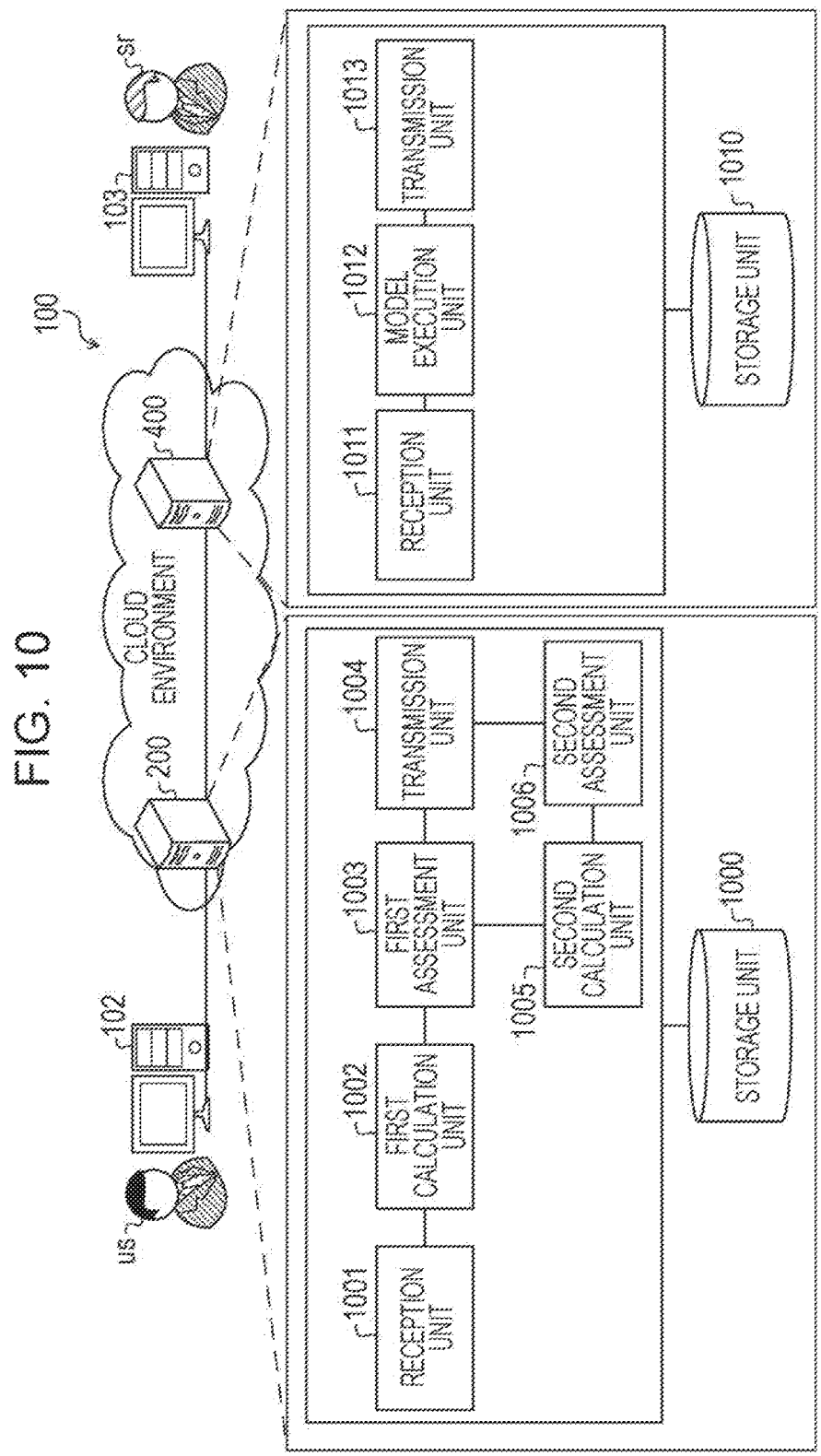
FIG. 10 is a block diagram that illustrates a functional configuration example of the learning model difference providing system.

FIG. 10 is a block diagram that illustrates a functional configuration example of the learning model difference providing system. The learning model difference providing system 100 has the user terminal device 102, the cloud application management server 200, the model management server 400, and the provider terminal device 103, for example.

The cloud application management server 200 has a storage unit 1000, a reception unit 1001, a first calculation unit 1002, a first assessment unit 1003, a transmission unit 1004, a second calculation unit 1005, and a second assessment unit 1006. The storage unit 1000 is a storage device such as the ROM 902, the RAM 903, or the disk 905, for example. A process by a control unit from the reception unit 1001 to the second assessment unit 1006 is coded in a program that is stored in the storage device such as the ROM 902, the RAM 903, or the disk 905 which is accessible for the CPU 901, which is illustrated in FIG. 9, for example. Then, the CPU 901 reads out the program from the storage device and executes the process that is coded in the program. Accordingly, the process by the control unit is realized.

User information, the setting information of the cloud application, data that are being created or have been created by the cloud application, and so forth are stored in the storage unit 1000, with respect to each of the users us. Further, a table for managing the learning model is stored in the storage unit 1000. For example, the users us that use the learning model, prediction information that is predicted by the learning model, actual reflection data, and so forth are stored in the table for managing the learning model, with respect to each of the learning models. As for examples of various kinds of information, a description will be made about an example in FIG. 11 and subsequent drawings where the cloud application is an electrical CAD.

The reception unit 1001 receives various kinds of data from the user terminal device 102 via the network 810. The transmission unit 1004 transmits various kinds of data to the user terminal device 102 via the network 810. Further, the reception unit 1001 receives various kinds of data from the model management server 400. The transmission unit 1004 transmits various kinds of data to the model management server 400 via the network 810. Further, the reception unit 1001 receives various kinds of data from the provider terminal device 103 via the network 810. The transmission unit 1004 transmits various kinds of data to the model management server 400 via the network 810.

The first calculation unit 1002 calculates the mismatch degree between prediction data about arbitrary data included in data that are input, which are obtained by the data which are input by using the application program and the learning model, and reflection data that are specified for the arbitrary data.

Next, the first assessment unit 1003 assesses whether or not the calculated mismatch degree exceeds the first degree. The first degree is predetermined by the servicer sr or the like of the learning model and is stored in the storage unit 1000 or the like.

In a case where the mismatch degree is assessed as exceeding the first degree, the transmission unit 1004 transmits the mismatch degree to the provider terminal device 103.

Further, the first assessment unit 1003 assesses whether or not the calculated mismatch degree exceeds a second degree. The second degree is predetermined by the servicer sr or the like of the learning model and is stored in the storage unit 1000 or the like. The second degree is set the same as the first degree or lower than the first degree, for example. In this embodiment, the second degree is set lower than the first degree. Accordingly, the divergence between the prediction data by the learning model and the actual reflection data may be evaluated in stages.

Further, the second calculation unit 1005 calculates the ratio between the number of the data whose mismatch degrees are assessed as exceeding the second degree among the data and the number of the data. In a case where the learning model is used plural times, the ratio serves as an index of how much the mismatch of the learning model is.

Further, the second assessment unit 1006 assesses whether or not the calculated ratio exceeds a prescribed ratio. The prescribed ratio is predetermined by the servicer sr or the like of the learning model and is stored in the storage unit 1000 or the like.

In a case where the ratio is assessed as exceeding the prescribed ratio, the transmission unit 1004 transmits the ratio to the provider terminal device 103. Further, the transmission unit 1004 transmits the calculated ratio to the user terminal device 102.

Here, respective pieces of identification information of the users us of the plural users us are stored in the storage unit 1000 while being associated with the pieces of identification information of the learning models that correspond to the users us among the plural learning models in accordance with the purposes of use of the application program. The identification information of the learning model is a learning model identification (ID). Here, the identification information of the user us will also be referred to as user account. Here, as the user account, for example, an email address, a message address, or the like may be used.

The reception unit 1001 receives, from the user terminal device 102, a notification request for the identification information of the learning model that corresponds to an arbitrary user us that uses the application program.

In response to the received notification request, the transmission unit 1004 transmits the learning model ID of the learning model that is associated with the user account of the arbitrary user us and the calculated ratio about the learning model that corresponds to the arbitrary user us to the user terminal device 102 as a request source of the notification request.

Accordingly, the user us may refer to a list of the usable learning models and may refer to prediction accuracies. Thus, the user us may select the learning model to be used based on the prediction accuracies.

The model management server 400 has a storage unit 1010, a reception unit 1011, a model execution unit 1012, and a transmission unit 1013. The storage unit 1010 is the storage device such as the ROM 902, the RAM 903, or the disk 905, for example. A process by a control unit from the reception unit 1011 to the transmission unit 1013 is coded in a program that is stored in the storage device such as the ROM 902, the RAM 903, or the disk 905 that is accessible for the CPU 901, which is illustrated in FIG. 9, for example. Then, the CPU 901 reads out the program from the storage device and executes the process that is coded in the program. Accordingly, the process by the control unit is realized.

The learning models are stored in the storage unit 1010. The reception unit 1011 receives the identification information of the learning model and input data that are given to the learning model. The identification information of the learning model is the learning model ID, for example.

Further, in this embodiment, a delivery of data among the user terminal device 102, the provider terminal device 103, and the model management server 400 is performed via the cloud application management server 200.

The reception unit 1001 receives a prediction request for the learning model from the user terminal device 102. The reception unit 1001 receives information that indicates the prediction request, for example. The information that indicates the prediction request includes the learning model ID and input data that are given to the learning model. The transmission unit 1004 transfers the information that indicates the prediction request to the model management server 400.

The reception unit 1011 receives the information that indicates the prediction request. Then, the model execution unit 1012 acquires, from the storage unit 1010, the learning model that is indicated by the learning model ID included in the information which indicates the prediction request. The model execution unit 1012 gives the input data included in the information that indicates the prediction request to the acquired learning model and outputs the prediction information. Then, the transmission unit 1013 transmits a prediction result for the prediction request to the cloud application management server 200.

The reception unit 1001 receives the prediction result for the prediction request from the model management server 400. Then, the transmission unit 1004 transmits the received prediction result to the user terminal device 102 as a transmission source of the prediction request. Further, the storage unit 1000 stores the prediction result that is received by the reception unit 1001.

Further, the reception unit 1001 receives the reflection data for which actual reflection is performed from the user terminal device 102. Then, the storage unit 1000 stores the reflection data. Accordingly, the calculation of the mismatch degree by the first calculation unit 1002 may be performed.

Based on the above description, a description will be made about a specific process in the system with a case where the cloud application is the electrical CAD as an example.

Figure 11:
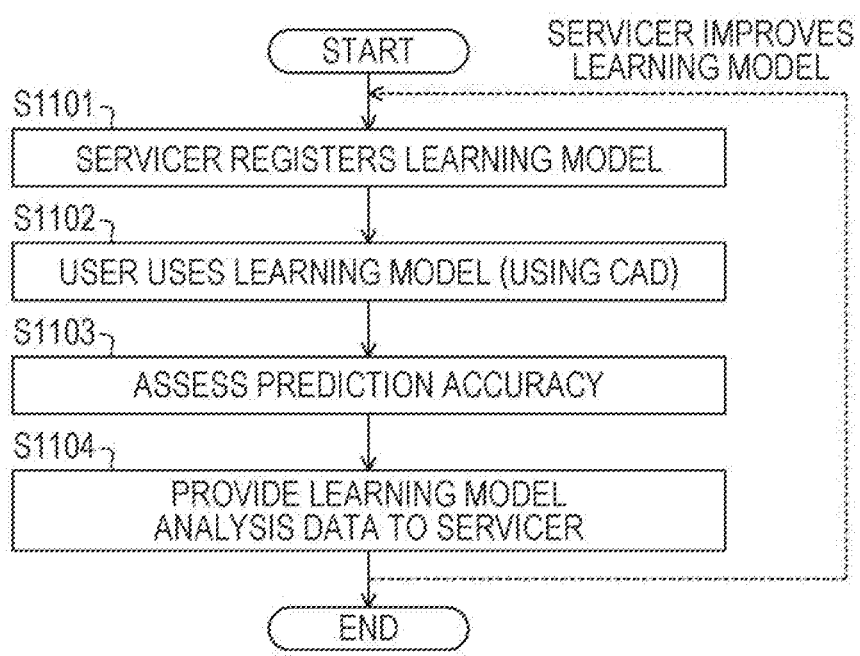
FIG. 11 is a flowchart that illustrates an example of process procedures that are performed by the system.

FIG. 11 is a flowchart that illustrates an example of process procedures that are performed by the system. Here, an example will be described where the electrical CAD is used as the cloud application. The servicer sr performs registration of the learning model in the model management server 400 via the provider terminal device 103 (step S1101). The user us uses the learning model in accordance with the CAD while using the CAD via the user terminal device 102 (step S1102).

The model management server 400 assesses the prediction accuracy (step S1103). The prediction accuracy is the above-described ratio. The model management server 400 provides learning model analysis data to the servicer sr (step S1104) and finishes a series of processes. Further, the servicer sr improves the learning model in accordance with the learning model analysis data that are provided. Then, the provider terminal device 103 returns to step S1101.

Figure 12:
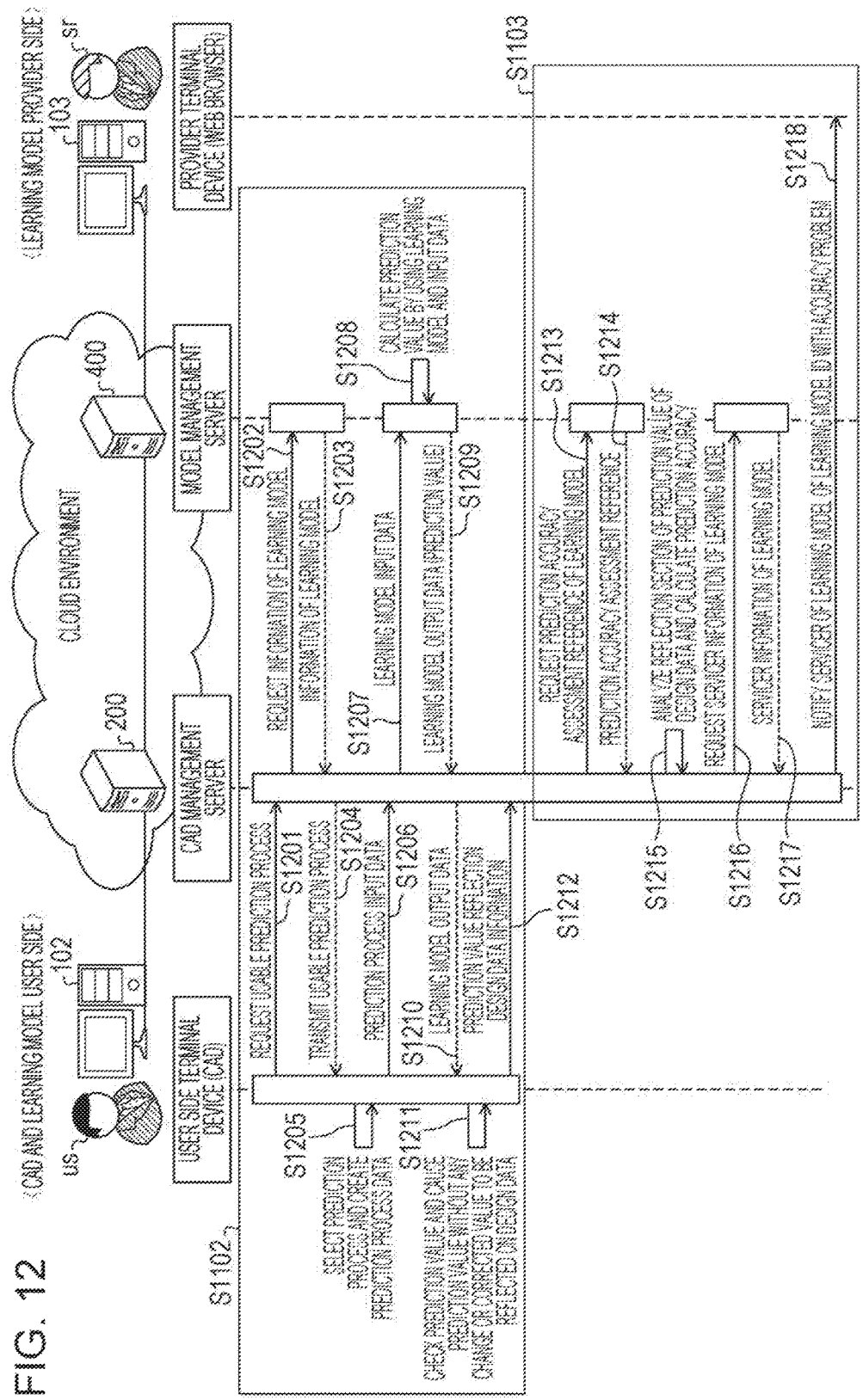
FIG. 12 is a timing diagram that illustrates a simple example of usage of the learning model and assessment of a prediction accuracy.

FIG. 12 is a timing diagram that illustrates a simple example of usage of the learning model and assessment of the prediction accuracy. First, the user terminal device 102 requests a list of usable prediction processes (step S1201). Next, a CAD management server 200 requests information of the learning model (step S1202). The model management server 400 transmits the information of the learning model (step S1203). Next, the CAD management server 200 transmits the list of the usable prediction processes to the user terminal device 102 (step S1204).

The user terminal device 102 receives selection of the prediction process by the user us from the list of the usable prediction processes. Then, the user terminal device 102 creates prediction process data (step S1205). The user terminal device 102 transmits prediction process input data to the CAD management server 200 (step S1206).

Next, the CAD management server 200 transmits the prediction process input data as learning model input data to the model management server 400 (step S1207).

Next, the model management server 400 calculates the prediction value by using the specified learning model and the input data (step S1208). The model management server 400 transmits the prediction value as learning model output data to the CAD management server 200 (step S1209).

The CAD management server 200 transmits the received learning model output data to the user terminal device 102 (step S1210).

The user terminal device 102 causes the user us to check the prediction value. Then, the user terminal device 102 causes the prediction value without any change or a corrected value to be reflected on the design data in accordance with an instruction of the user us (step S1211). The user terminal device 102 transmits the design data information for which the reflection is performed to the CAD management server 200 (step S1212).

The CAD management server 200 requests a prediction accuracy assessment reference of the learning model from the model management server 400 (step S1213). The model management server 400 transmits the prediction accuracy assessment reference in response to the request from the CAD management server 200 (step S1214).

The CAD management server 200 analyzes a reflection section of the prediction value of the design data. The CAD management server 200 calculates the prediction accuracy based on analysis results and the prediction accuracy assessment reference (step S1215). Then, the CAD management server 200 requests servicer sr information of the learning model from the model management server 400 (step S1216). The servicer sr information is address information of the email, a message application, or the like, for example. The model management server 400 transmits the servicer sr information of the learning model in response to the request from the CAD management server 200 (step S1217). Then, the CAD management server 200 notifies the servicer sr of the learning model of the learning model ID that has an accuracy problem (step S1218).

Figure 13:
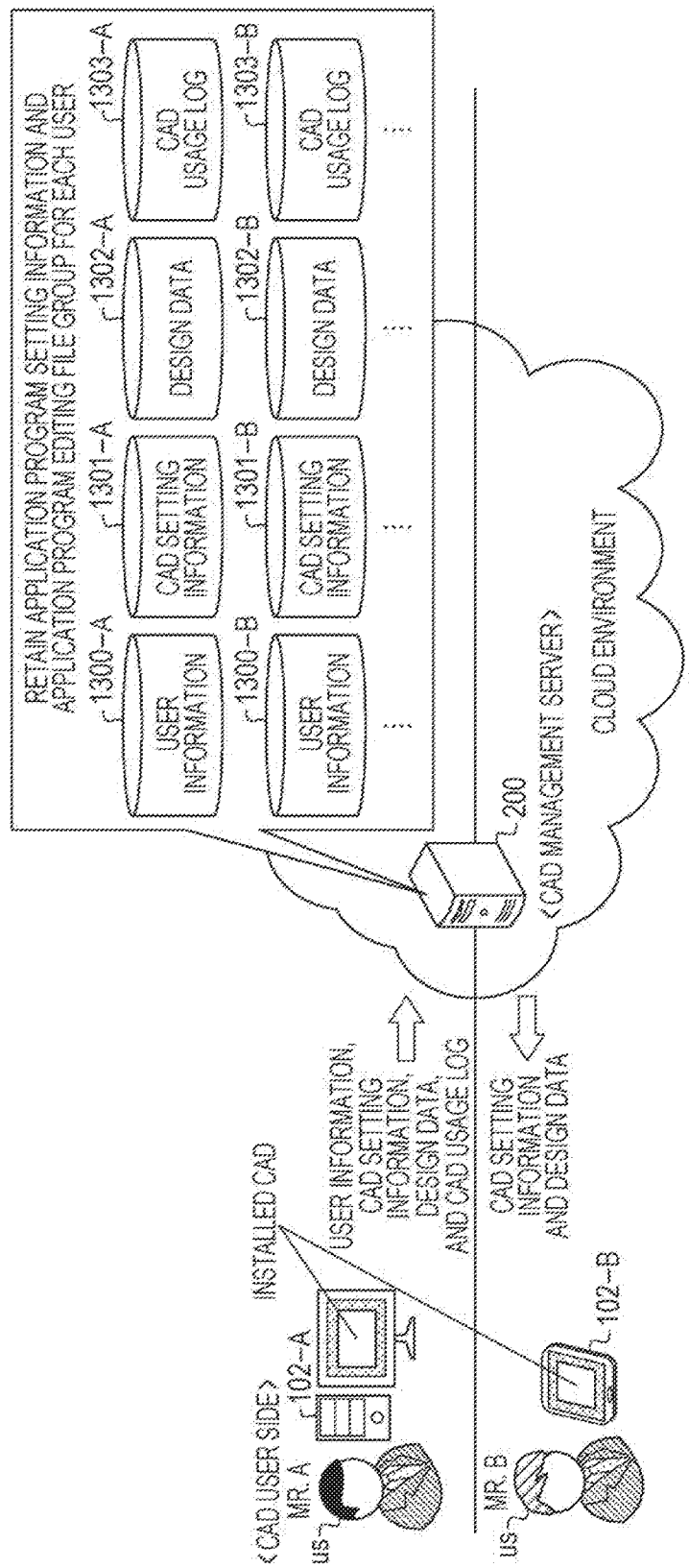
FIG. 13 is an explanatory diagram that illustrates a usage example of an electrical CAD.

FIG. 13 is an explanatory diagram that illustrates a usage example of the electrical CAD. Here, as an example of the cloud application, the electrical CAD is raised as an example. The CAD is installed in each of the user terminal devices 102. The user terminal device 102 transmits user information 1300, CAD setting information 1301, design data 1302, and a CAD usage log 1303 to the CAD management server 200. The CAD management server 200 stores the user information 1300, the CAD setting information 1301, the design data 1302, and the CAD usage log 1303 for each of the users.

Then, in a case where the user terminal device 102 requests information from the CAD management server 200, the CAD management server 200 transmits the CAD setting information 1301, the design data 1302, and so forth to the user terminal device 102.

Figures 14, 15:
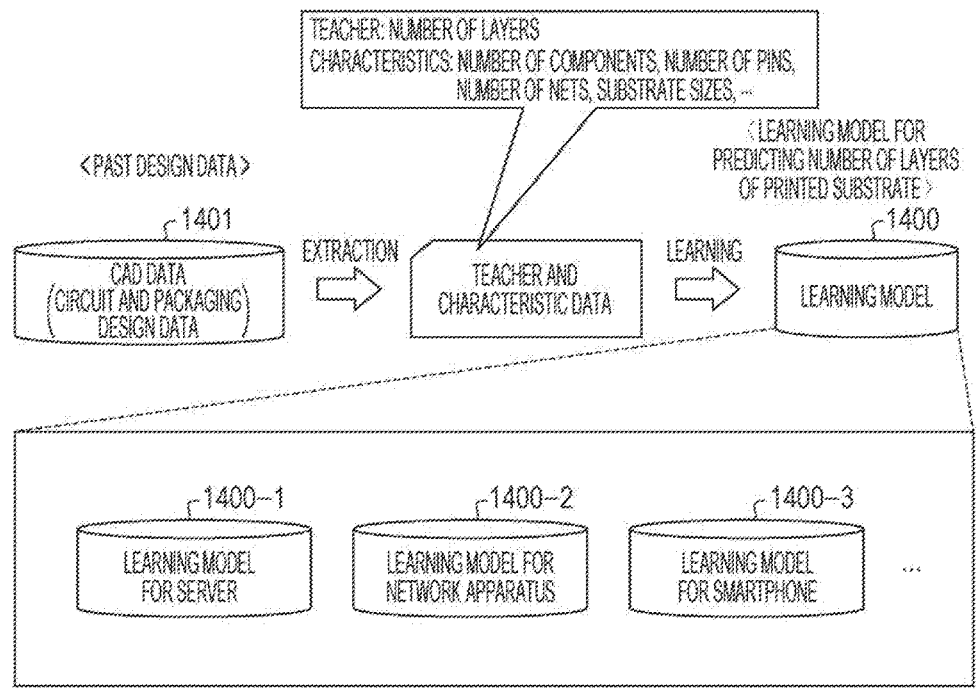
FIG. 14 is an explanatory diagram that illustrates a creation example of the learning model.
FIG. 15 is an explanatory diagram that illustrates a table example (No. 1) that is stored in a CAD management server.

FIG. 14 is an explanatory diagram that illustrates a creation example of the learning model. A description will be made about a learning model example in accordance with the purpose of use of the electrical CAD. A learning model 1400 predicts data about an arbitrary item that is included in the design data 1302 created by the electrical CAD. As the data that is predicted, for example, the number of layers or the like of a printed substrate that is included in a target device may be raised. Further, the data that are predicted are not limited but may be the number of wiring layers, lengths of wiring, and so forth, for example.

The servicer sr performs characteristic extraction from past design data 1401, for example. In a case where a teacher is the number of layers of the printed substrate, the servicer sr extracts the number of components, the number of pins, the number of nets, a substrate size, and so forth as the characteristics from the past design data 1401. Then, the servicer sr creates the learning model 1400 that predicts the number of layers of the printed substrate based on the extracted characteristics and the teacher.

As the purposes of use of the electrical CAD, for example, products, technologies, and so forth may be raised. As the technologies, manufacturing processes and so forth may be raised. The servicer sr may create plural learning models 1400 by changing the design data 1302 and the characteristics for each of the products or each of the technologies. In the example in FIG. 14, as the learning model 1400 that outputs the number of layers of the printed substrate as the prediction value, a learning model 1400-1 for a server, a learning model 1400-2 for a network apparatus, a learning model 1400-3 for a smartphone, and so forth are created.

FIG. 15 is an explanatory diagram that illustrates a table example (No. 1) that is stored in the CAD management server. The CAD management server 200 has a learning model management server table 1500 for managing the model management server 400, for example. The learning model management server table 1500 is stored in the storage device such as the disk 905, for example. The learning model management server table 1500 has fields of server names and IP addresses. In the learning model management server table 1500, a record (for example, 1501-1 or the like) is stored by setting information in each of the fields. The name of the model management server 400 is set in the field of the server name. The IP address of the model management server 400 is set in the field of the IP address.

Figure 16:
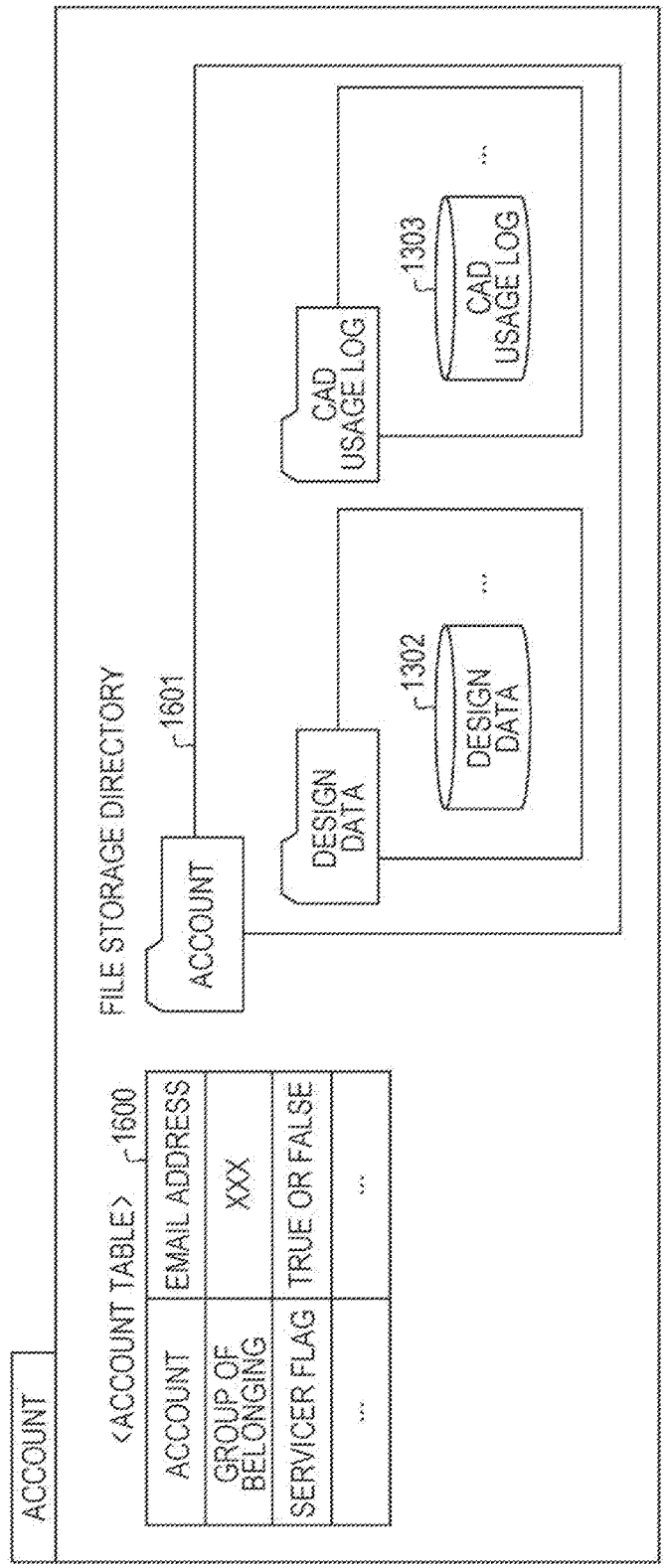
FIG. 16 is an explanatory diagram that illustrates a table example (No. 2) that is stored in the CAD management server.

FIG. 16 is an explanatory diagram that illustrates a table example (No. 2) that is stored in the CAD management server. The CAD management server 200 has an account table 1600 for managing an account that is allocated to each of the users us and servicers sr for authentication, for example. The account table 1600 is stored in the storage device such as the disk 905. Further, the CAD management server 200 allocates a file storage directory 1601 to each of the accounts in the storage device such as disk 905. For example, the CAD management server 200 creates an account for each of the users us and servicers sr of the CAD in order to perform the authentication to the CAD management server 200.

The account table 1600 has fields of the account, a group of belonging, a servicer flag, and so forth. The email address information or the like of the user us or the servicer sr is set in the field of the account. The group to which the user us and the servicer sr belong is set in the field of the group of belonging. The users us and the servicers sr of the CAD are in advance grouped. For example, in a case where the users us of the CAD are grouped for each of the products of design and where the user us belongs to a design group of the server, "server" or the like is set in the field of the group of belonging.

Further, in the field of the servicer flag, the information that assesses whether or not the user us of the CAD management server 200 that is indicated by the account is the servicer sr is set. In a case where the user us of the CAD management server 200 that is indicated by the account is the servicer sr, "True" is set in the field of the servicer flag. In a case where the user us of the CAD management server 200 that is indicated by the account is the user us of the CAD, "False" is set in the field of the servicer flag.

The file storage directory 1601 is a storage area that is capable of storing various kinds of files for each of the accounts in the storage device such as the disk 905. In the file storage directory 1601, the design data 1302, the CAD usage log, and so forth are stored while being related with the account that is set in the account table 1600. A specific name for each of the accounts is provided for the file in the file storage directory 1601.

Figure 17:
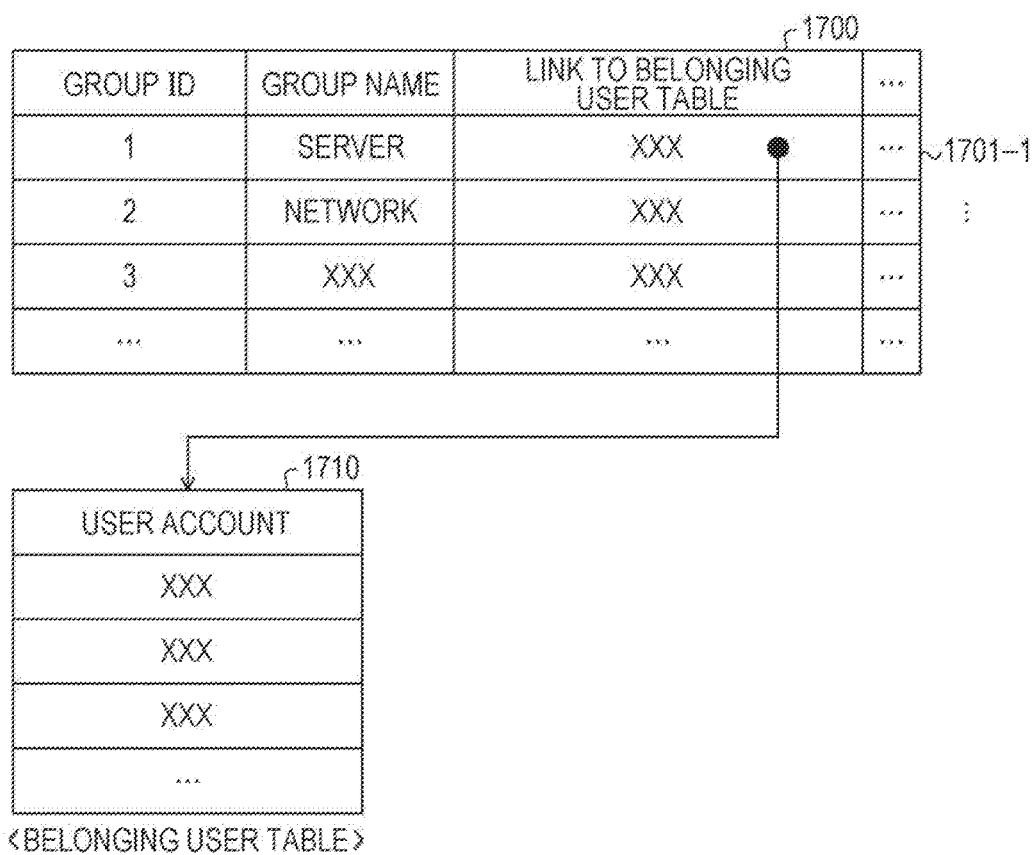
FIG. 17 is an explanatory diagram that illustrates a table example (No. 3) that is stored in the CAD management server.

FIG. 17 is an explanatory diagram that illustrates a table example (No. 3) that is stored in the CAD management server. The CAD management server 200 has a group table 1700 and a belonging user table 1710, for example. The group table 1700 and the belonging user table 1710 are stored in the storage device such as the disk 905, for example.

First, the group table 1700 is a table for managing each group in which the users us of the CAD are grouped, for example. In the example in FIG. 17, it is assumed that the users us of the CAD are grouped by the product as a unit, for example.

The group table 1700 has fields of a group ID, a group name, and a link to the belonging user table 1710. In the group table 1700, records (for example, 1701-1 and so forth) are stored by setting information in the fields.

The identification information of the group is set in the field of the group ID. The name of the group is set in the field of the group name. The identification information of a table for managing the user accounts of the users us that belong to the group is set in the field of the link to the belonging user table 1710.

The belonging user table 1710 is the table for managing the user accounts of the users us that belong to the group. The belonging user table 1710 is created for each of the groups. The belonging user table 1710 has a field of the user account. The user account such as email address information of the user us of the CAD that belongs to the group is set in the field of the user account.

Figure 18:
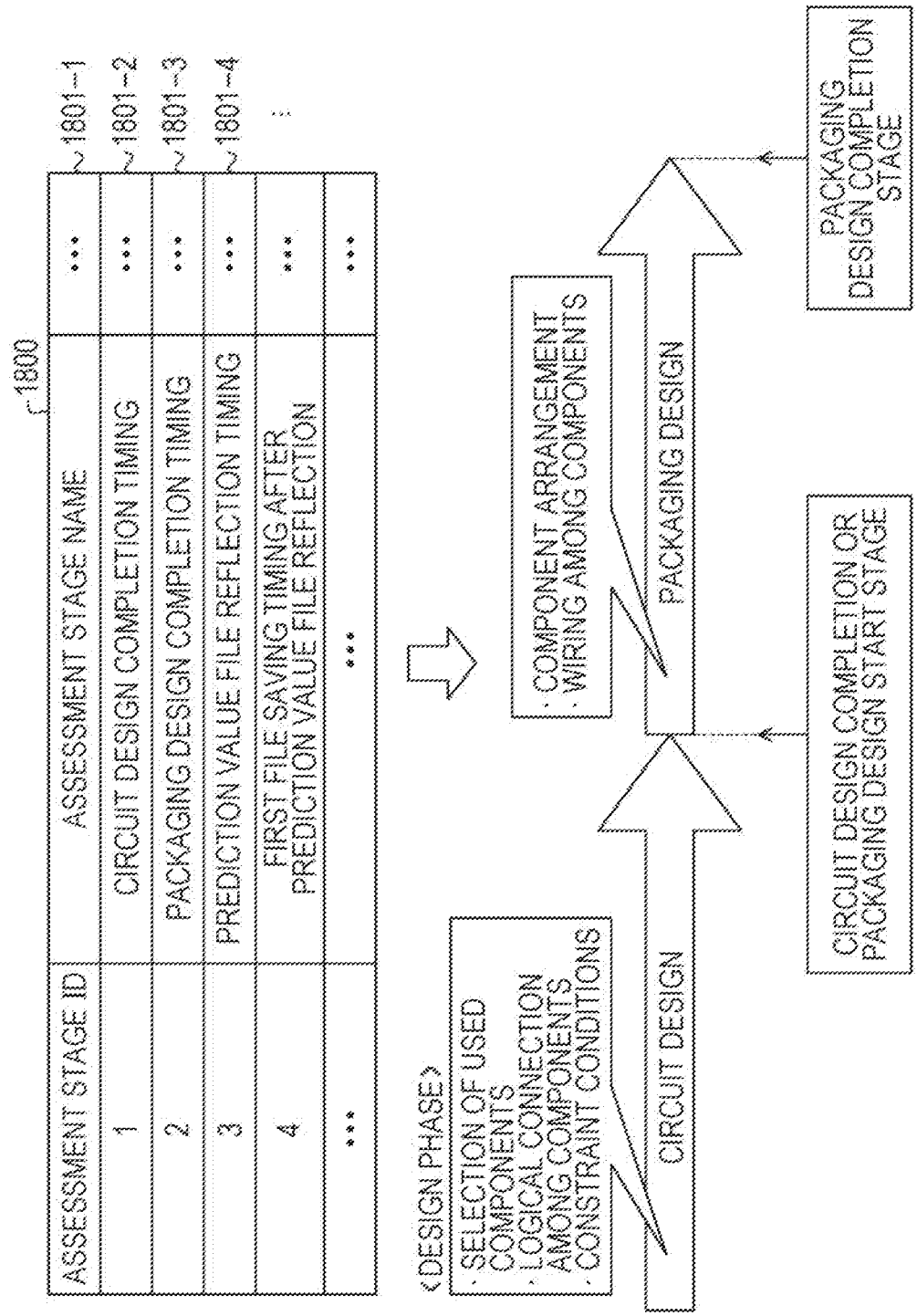
FIG. 18 is an explanatory diagram that illustrates a table example (No. 4) that is stored in the CAD management server.

FIG. 18 is an explanatory diagram that illustrates a table example (No. 4) that is stored in the CAD management server. The CAD management server 200 has a prediction accuracy assessment stage table 1800, for example. The prediction accuracy assessment stage table 1800 is stored in the storage device such as the disk 905, for example.

First, the prediction accuracy assessment stage table 1800 is a table that represents a timing at which the prediction accuracy may be assessed, for example. The prediction accuracy assessment stage table 1800 has fields of an assessment stage ID and an assessment stage name. In the prediction accuracy assessment stage table 1800, records (for example, 1801-1 to 1801-4 and so forth) are stored by setting information in the fields. The identification information of the assessment stage is set in the field of the assessment stage ID. The name of the assessment stage is set in the field of the assessment stage name. Here, the assessment stage name is set to the extent that in a case where the servicer sr takes a look at the assessment stage name, the servicer sr may discriminate and specify at which timing the prediction accuracy is assessed.

Raising electrical design as an example, the assessment of the prediction accuracy may be performed in each design phase. The design phases include a circuit design completion stage or a packaging design start stage in which logic design is performed, a packaging design completion stage, and so forth. In the circuit design, for example, selection of used components, decisions of logical connection relationships among the components, specification of constraint conditions, and so forth are performed. In the packaging design, component arrangement, wiring among the components, and so forth are performed. In a case where the timing of the assessment is the circuit design completion stage or the packaging design start stage, the assessment stage name is "circuit design completion timing". In a case where the timing of the assessment is the packaging design completion stage, the assessment stage name is "packaging design completion timing".

Further, the assessment of the prediction accuracy may be performed when characteristic information that corresponds to the prediction value is reflected on the design data 1302. In a case where the timing of the assessment is the timing when the characteristic information that corresponds to the prediction value is reflected, the assessment stage name is "prediction value file reflection timing". Further, the assessment of the prediction accuracy may be performed when the design data 1302 are saved after the characteristic information that corresponds to the prediction value is reflected. In a case where the timing of the assessment is the timing when the design data 1302 are saved for the first time after the characteristic information is reflected, the assessment stage name is "first file saving timing after prediction value file reflection".

Figure 19:
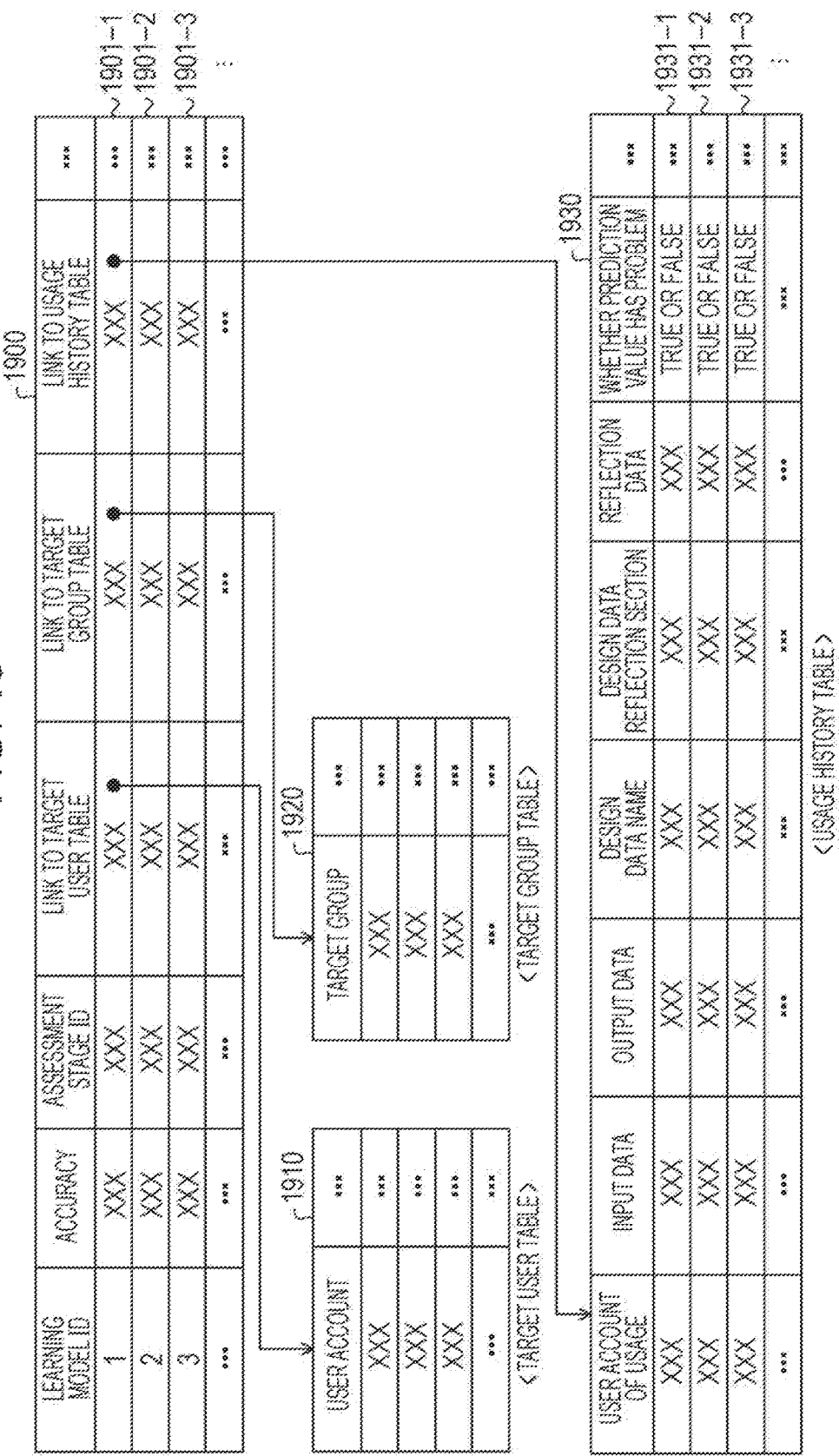
FIG. 19 is an explanatory diagram that illustrates a table example (No. 5) that is stored in the CAD management server.

FIG. 19 is an explanatory diagram that illustrates a table example (No. 5) that is stored in the CAD management server. The CAD management server 200 has a model ID management table 1900. The model ID management table 1900 is stored in the storage device such as the disk 905, for example.

First, the model ID management table 1900 is a table for managing tables that are related to the learning model IDs, for example. The model ID management table 1900 has fields of the learning model ID, accuracy, the assessment stage ID, a link to a target user table, a link to a target group table, and a link to a usage history table. In the model ID management table 1900, records (for example, 1901-1 to 1901-3 and so forth) are stored by setting information in the fields.

The identification information of the learning model is set in the field of the learning model ID. The assessment accuracy that is calculated is set in the field of the accuracy. The assessment stage ID that indicates the timing for assessing the accuracy of the learning model is set in the field of the assessment stage ID. The model ID management table 1900 is related with the prediction accuracy assessment stage table 1800 by the assessment stage ID.

The link to the target user table that indicates the target user us of the CAD, the user us using the learning model, is set in the field of the link to the target user table. The target user table 1910 has a field of the user account. The target user table 1910 is created for each of the learning models. The target user table 1910 is stored in the storage device such as the disk 905, for example. The user account of the target user us of the CAD, the user us using the learning model, is set in the field of the user account.

Further, returning to the description of the model ID management table 1900, the information of the target group that uses the leaning model among the groups in which the users us of the CAD are grouped is set in the field of the link to the target group table 1920. The target group table 1920 is created for each of the learning models. The target group table 1920 has a field of the target group. The group name of the target group of the learning model is set in the field of the target group. The target group table 1920 is stored in the storage device such as the disk 905, for example.

Returning to the description of the model ID management table 1900, the link to the usage history table of the learning model is set as the link to the usage history table. A usage history table 1930 of the learning model is a table that indicates a history of usage of the learning model. The usage history table 1930 of the learning model is stored in the storage device such as the disk 905, for example.

The usage history table 1930 is created for each of the learning models. The usage history table 1930 has fields of a user account of usage, input data, output data, a design data name, a design data reflection section, the reflection data, and whether the prediction value has a problem. In the usage history table 1930, records (for example, 1931-1 to 1931-3 and so forth) are stored by setting information in the fields.

The user account of the user that uses the learning model is set in the field of the user account of usage. The input data that are created by the user terminal device 102 to be given to the learning model are set in the field of the input data. The prediction value that is obtained by learning model is set in the field of the output data. The name of the target design data 1302 that use the learning model is set in the field of the design data name. The information that indicates the section for which reflection is performed among the data included in the design data 1302 is set in the field of the design data reflection section. For example, as illustrated in FIG. 20 which will be described later, in a case where the reflection is performed for the number of layers of the substrate in substrate data included in the design data 1302, "substrate data—number of layers" is set in the field of the design data reflection section.

The specified reflection data are set in the field of the reflection data. The reflection data is the correct value for the prediction value that is obtained by the learning model. The information that indicates whether or not the prediction value has a problem is set in the field of whether the prediction value has a problem. In a case where the prediction value is assessed as having a problem, "True" is set in the field of whether the prediction value has a problem. In a case where the prediction value is assessed as not having a problem, "False" is set in the field of whether the prediction value has a problem. An assessment method about whether or not the prediction value has a problem will be described later.

Figure 20:
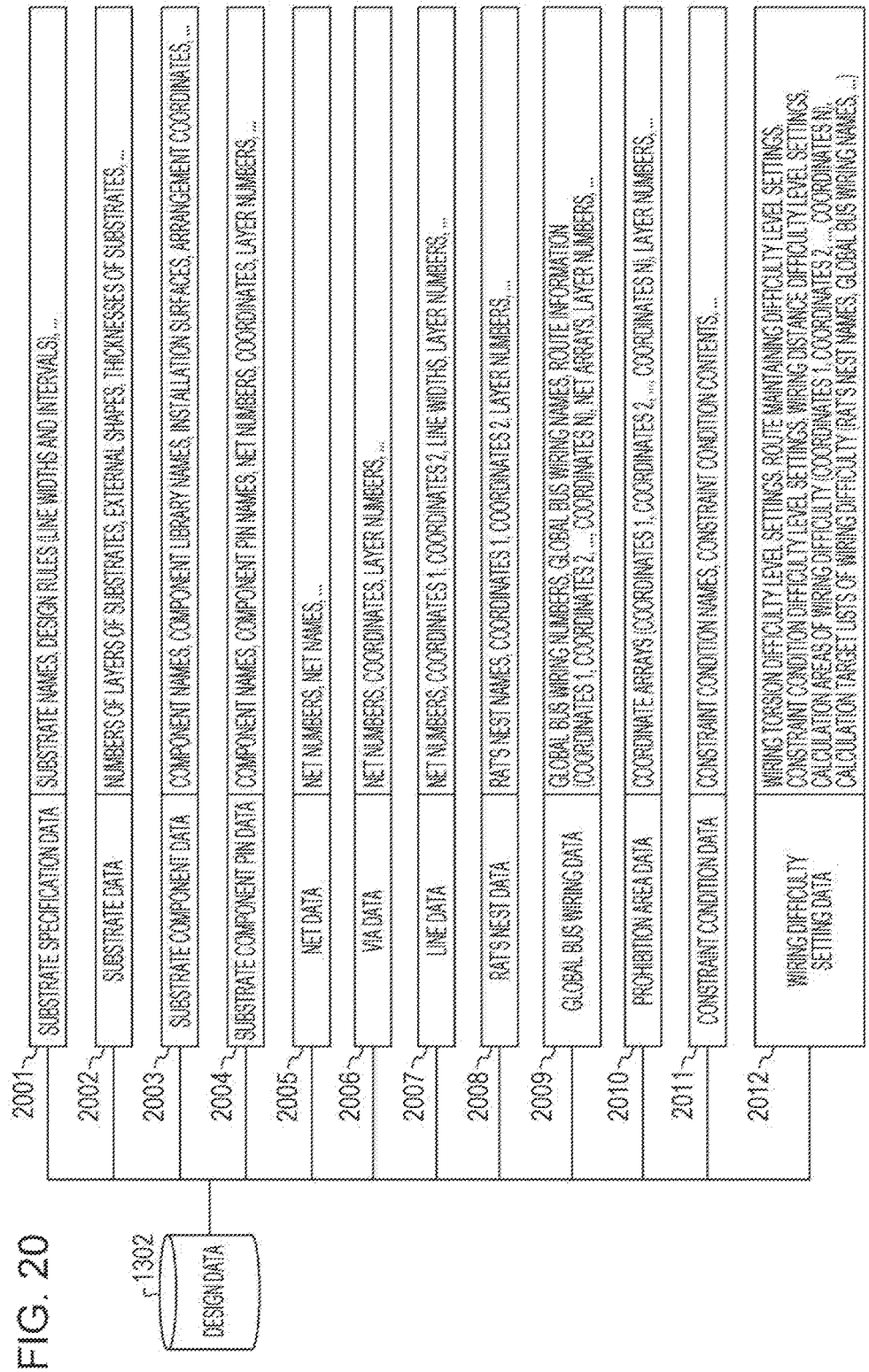
FIG. 20 is an explanatory diagram that illustrates a design data example.

FIG. 20 is an explanatory diagram that illustrates a design data example. The design data 1302 are data that are created by the CAD and are data that indicate a device as a design target. As described above, the design data 1302 are stored in the file storage directory 1601 or the like of each of the accounts.

The design data 1302 have substrate specification data 2001, substrate data 2002, substrate component data 2003, substrate component pin data 2004, net data 2005, via data 2006, line data 2007, rat's nest data 2008, global bus wiring data 2009, prohibition area data 2010, constraint condition data 2011, wiring difficulty setting data 2012, and so forth, for example.

The substrate specification data 2001 are information that includes items such as a substrate name and a design rule, for example. The design rule may include a line width, an interval of a gap between components, and so forth.

The substrate data 2002 are information that includes items such as the number of layers of the substrate, an external shape, and a thickness of the substrate. The substrate component data 2003 are information that includes items such as a component name, a component library name, an installation surface, and arrangement coordinates. The substrate component pin data 2004 are information that includes items such as a component name, a component pin name, a net number, coordinates, and a layer number. The net data 2005 are information that includes items such as the net number and a net name for each of the nets.

The via data 2006 are information that includes items such as the net number, coordinates, and the layer number for each of the vias. The net number is a net number that indicates the net with which the via is connected. The coordinate values of the via are set in the field of the coordinates. The layer of the printed substrate in which the via is arranged is set in the field of the layer number.

The line data 2007 are information that includes items such as the net number, coordinates 1, coordinates 2, the line width, and the layer number for each of the lines. The coordinates 1 and the coordinates 2 are the coordinate values of a start point of the line and the coordinate values of an end point of the line. In a case of a wiring pattern in which the line changes the direction, the line data 2007 may have coordinate values of a turning point of the wiring pattern and so forth.

The rat's nest data 2008 are information that includes items such as a rat's nest name, coordinates 1, coordinates 2, and the layer number for each of the rat's nests. The global bus wiring data 2009 are information that includes items such as a global bus wiring number, a global bus wiring name, route information, a net array, and the layer number. The global bus wiring number is information that includes items such as the global bus wiring number, the global bus wiring name, the route information, the net array, and the layer number for each of the buses and lines. The bus and line may be abbreviated and also referred to as bus. For example, in a case of a data bus or the like, the bus has as many wiring patterns as approximately 8 to 32 wiring patterns. The route information includes the coordinate values of each point on a route of the wiring pattern of the bus.

The prohibition area data 2010 are information that includes items such as a coordinate array that represents points of the external shape of the prohibition area and the layer number for each of the prohibition areas of the components and the wiring patterns. The constraint condition data 2011 are information that includes items such as the constraint condition name and a constraint condition content for each of the constraint conditions. The wiring difficulty setting data 2012 are information that includes an item of each wiring difficulty level.

Figure 21:
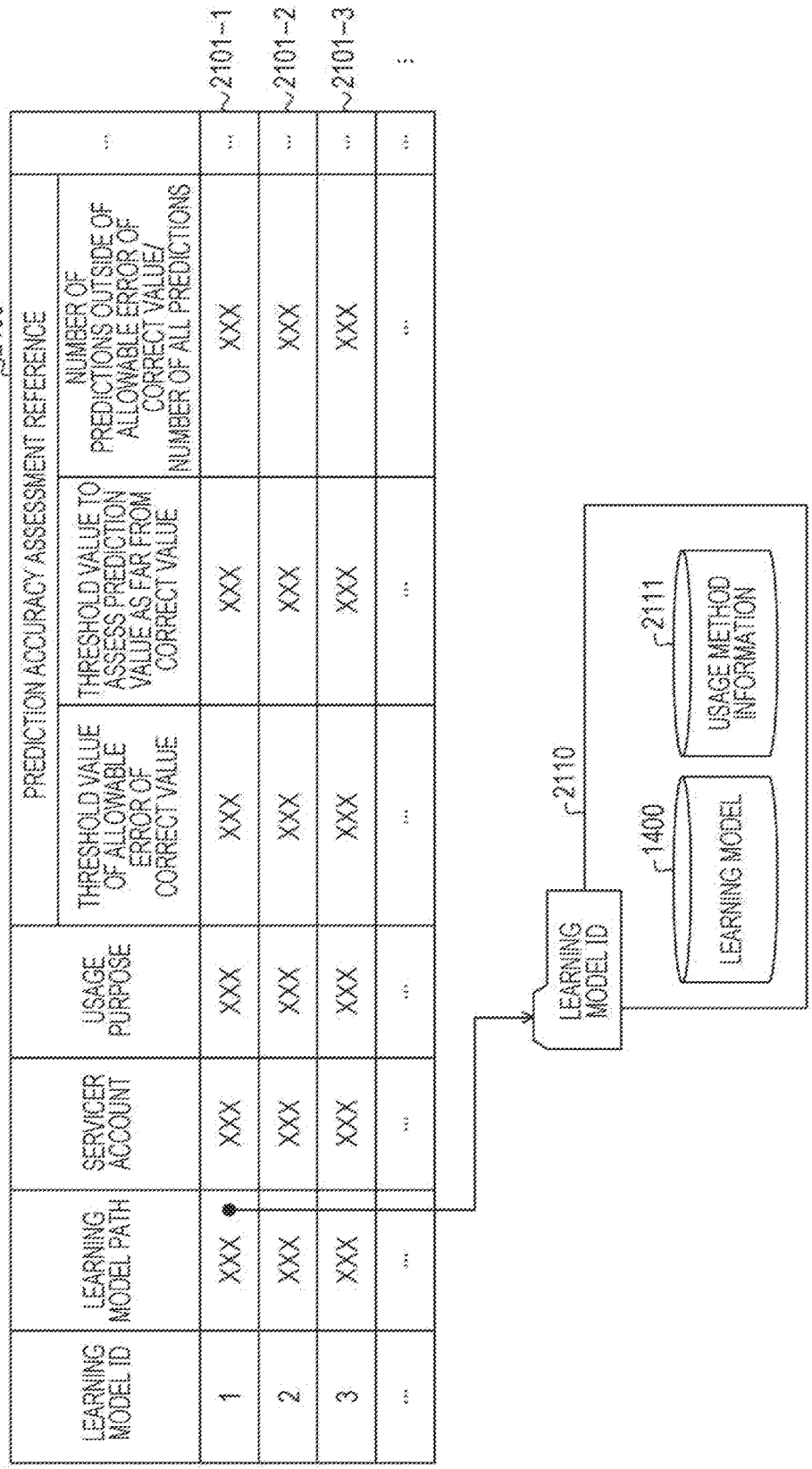
FIG. 21 is an explanatory diagram that illustrates an example of a learning model management table that is retained in a model management server.

FIG. 21 is an explanatory diagram that illustrates an example of a learning model management table that is retained in the model management server. A learning model management table 2100 is information for managing each of the learning models. The learning model management table 2100 is stored in the storage device such as the disk 905 of the model management server 400.

The learning model management table 2100 has fields of the learning model ID, a learning model path, a servicer account, a usage purpose, and the prediction accuracy assessment reference. In the learning model management table 2100, records (for example, 2101-1 to 2101-3) are stored by setting information in the fields.

The identification information of the learning model is set in the field of the learning model ID. Link information to a learning model directory 2110 is set in the field of the learning model path. The learning model directory 2110 is an area of the storage device such as the disk 905 in which the learning model 1400 and usage method information 2111 which are related with the leaning model ID are stored.

The account of the servicer sr of the learning model is set in the field of the servicer account. The servicer account may include the email address information of the provider terminal device 103, for example. The usage purpose of the learning model 1400 is set in the field of the usage purpose.

A reference value for assessing whether or not the prediction value has a problem by the calculated prediction accuracy is set in the field of the prediction accuracy assessment reference. The prediction accuracy assessment reference includes three reference values of "threshold value of allowable error of correct value", "threshold value to assess prediction value as far from correct value", and "number of predictions outside of allowable error of correct value/number of all predictions".

First, "threshold value of allowable error of correct value" is a range in which the difference value between the correct value and the prediction value may be assessed as the allowable error. "Threshold value of allowable error of correct value" is the above-described second degree. Next, "threshold value to assess prediction value as far from correct value" is a range in which the difference value between the correct value and the prediction value may be assessed as large. "Threshold value to assess prediction value as far from correct value" is the above-described first degree. Then, "number of predictions outside of allowable error of correct value/number of all predictions" is a threshold value of "the number of predictions whose difference values between the correct values and the prediction values are assessed as not in the first degree/the number of all predictions". "Number of predictions outside of allowable error of correct value/number of all predictions" is the above-described prescribed ratio.

Next, detailed descriptions will be made about procedures of a registration process of the learning model, a usage process of the learning model, and a prediction accuracy assessment process, which are illustrated in FIG. 11.

(Registration Process Procedures of Learning Model)

Figure 22:
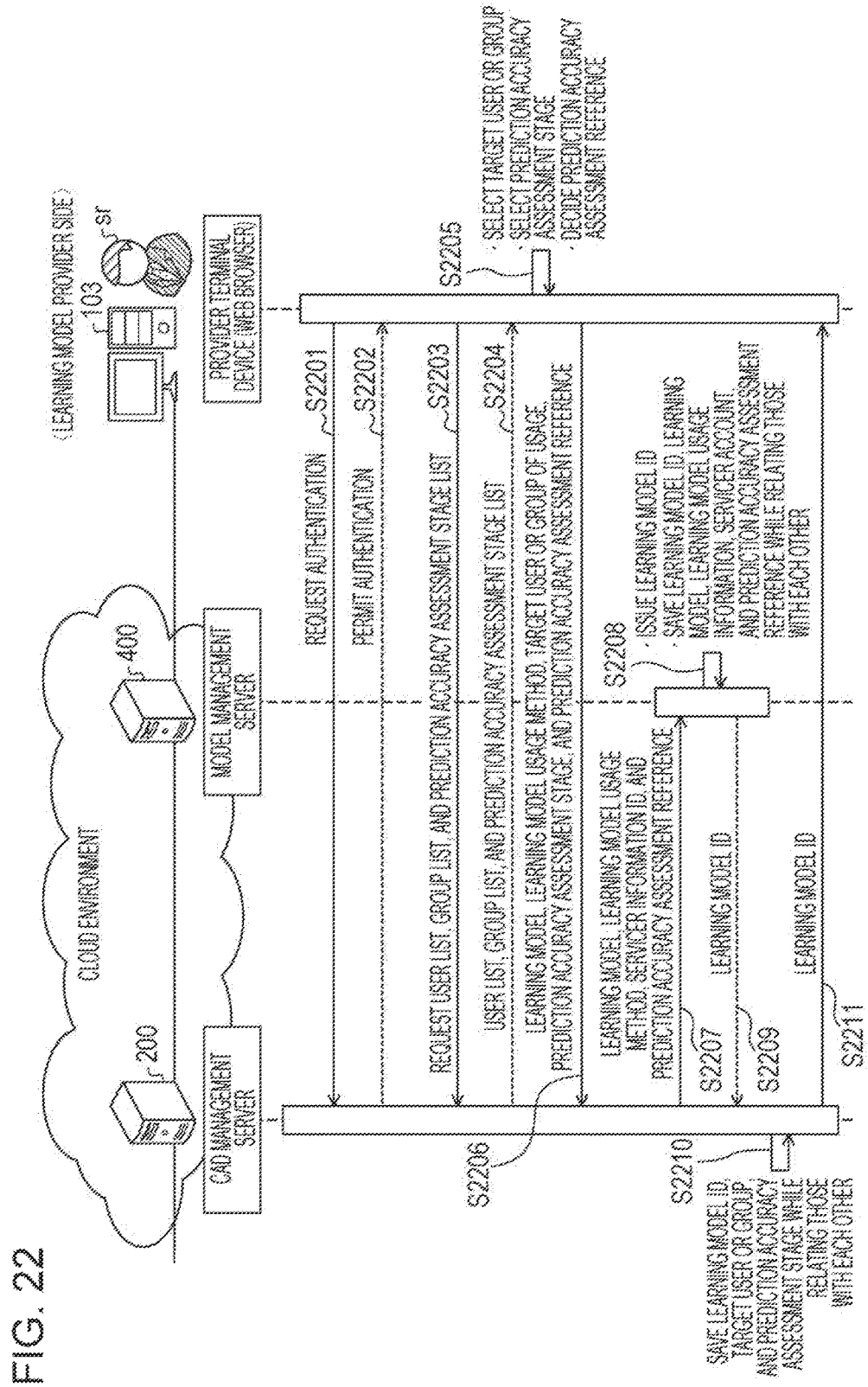
FIG. 22 is a sequence diagram that illustrates registration process procedures of the learning model.

FIG. 22 is a sequence diagram that illustrates registration process procedures of the learning model. Here, a description will be made about the registration process procedures of the learning model by the servicer sr, which are illustrated in FIG. 11. First, the provider terminal device 103 displays a web browser or the like. Then, the provider terminal device 103 performs an authentication request via the web browser in accordance with the input by the servicer sr (step S2201). Here, the servicer sr inputs the email address or the like as the user account to the web browser, for example.

Next, the CAD management server 200 performs the authentication in response to the authentication request. Here, the CAD management server 200 permits the authentication and notifies the provider terminal device 103 of authentication permission (step S2202). Next, the provider terminal device 103 requests a user list, a group list, and a prediction accuracy assessment stage list (step S2203).

In a case where the CAD management server 200 receives the request from the provider terminal device 103, the CAD management server 200 creates the user list, the group list, and the prediction accuracy assessment stage list from the account table 1600, the group table 1700, and the prediction accuracy assessment stage table 1800. The CAD management server 200 transmits the user list, the group list, and the prediction accuracy assessment stage list that are created to the provider terminal device 103 (step S2204).

The provider terminal device 103 displays the user list, the group list, and the prediction accuracy assessment stage list that are received. Then, the provider terminal device 103 receives inputs of selection of the target user us or the group of the learning model by the servicer sr, selection of a prediction accuracy assessment stage, and the prediction accuracy assessment reference (step S2205).

FIG. 23 is an explanatory diagram that illustrates examples of the inputs of the selection of a target, the selection of an accuracy assessment stage, and an accuracy assessment reference. The provider terminal device 103 displays a screen 2300 on the display 809 or the like.

The screen 2300 includes an item in which the user account of the learning model may be selected from the user list. The screen 2300 includes an item in which the group ID of the learning model may be selected from the group list. The screen 2300 includes an item in which the assessment stage ID which indicates the timing for assessing the prediction accuracy of the learning model may be selected from the prediction accuracy assessment stage list.

Further, the screen 2300 includes an item in which "threshold value of allowable error of prediction value" may be input. Further, the screen 2300 includes an item in which "threshold value to assess correct value as far from prediction value" may be input. Further, the screen 2300 includes an item in which "number of predictions outside of allowable error of correct value/number of all predictions" may be input.

For example, the servicer sr does not select the user account from the user list. The servicer sr selects "2: network" as the group ID from the group list.

For example, the servicer sr selects "2: packaging design completion timing" as the assessment stage ID from the prediction accuracy assessment stage list.

The servicer sr inputs "1" as "threshold value of allowable error of prediction value". That is, in a case where the difference value between the prediction value and the correct value is one layer or less, the prediction value is assessed as close to the correct value. The servicer sr inputs "3" as "threshold value to assess correct value as far from prediction value". That is, in a case where the difference value between the prediction value and the correct value indicates the separation by three layers or more, the prediction value is assessed as far from the correct value. The servicer sr inputs "0.1" as "number of predictions outside of allowable error of correct value/number of all predictions". That is, in a case where 10[%] is not in a prediction range of one layer or less, the accuracy of the learning model is questionable.

Returning to the description of FIG. 22, the provider terminal device 103 transmits the learning model, the usage method of the learning model, and the target user us or group of usage, the prediction accuracy assessment stage, and the prediction accuracy assessment reference, which are selected, to the CAD management server 200 (step S2206).

FIG. 24 is an explanatory diagram that illustrates an information example of the usage method of the learning model. In step S2206, the usage method information 2111 of the learning model that is transmitted to the CAD management server 200 indicates the usage purpose, items of the input data given to the learning model, and items of the output data, for example. In a case of the learning model that predicts the number of layers of the printed substrate, the usage purpose is "prediction of the number of layers". The items of the input data are "the number of components, the number of component pins, the number of nets, the substrate area, and so forth", and the items of the output data is "the predicted number of layers".

Returning to the description of FIG. 22, the CAD management server 200 transmits the learning model 1400, the usage method information 2111 of the learning model, a servicer information ID, and the prediction accuracy assessment reference to the model management server 400 (step S2207). The model management server 400 issues the learning model ID and saves the learning model ID, the learning model 1400, the usage method information 2111 of the learning model, the servicer account, and the prediction accuracy assessment reference while relating those with each other (step S2208).

Figure 25:
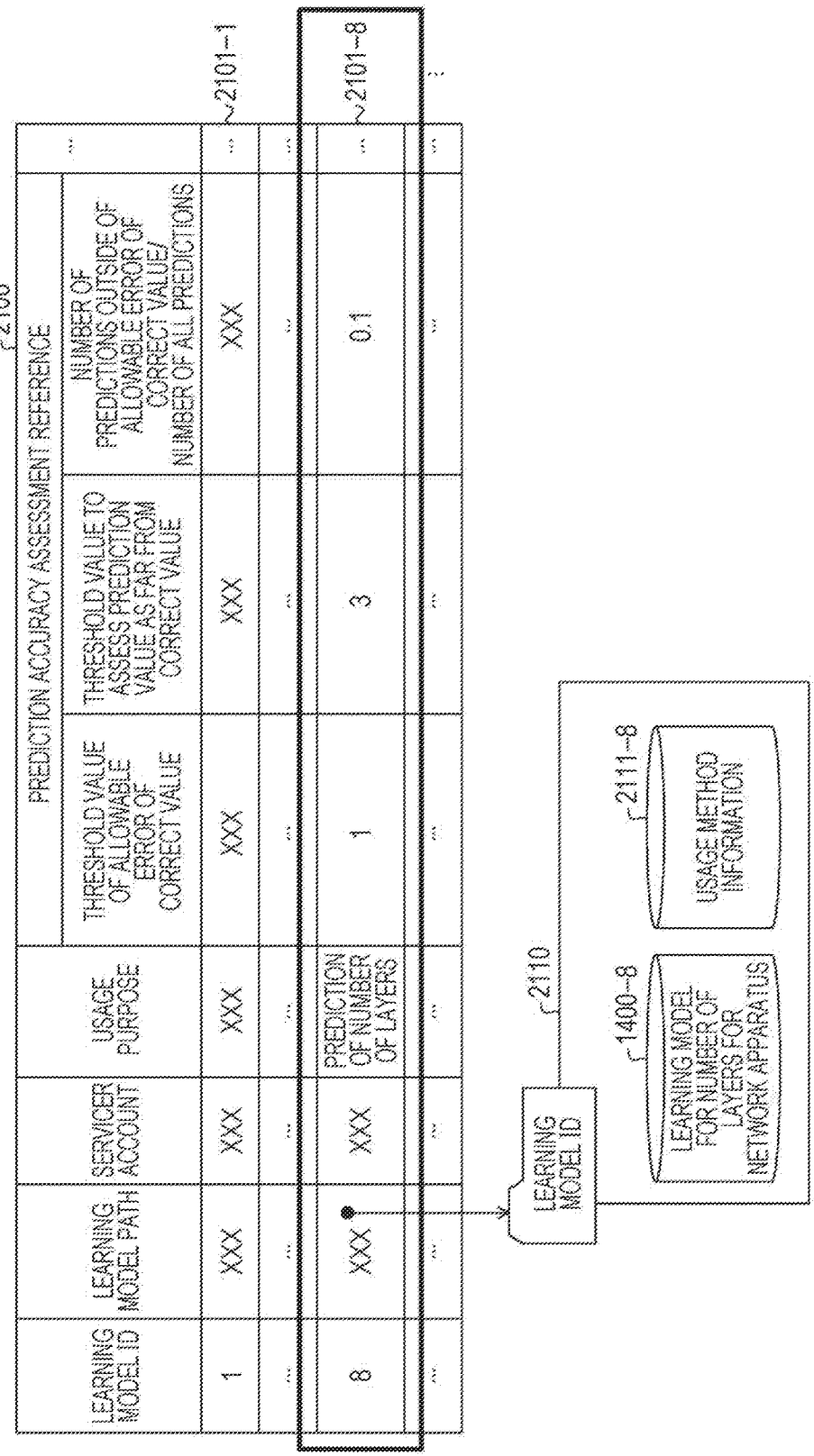
FIG. 25 is an explanatory diagram that illustrates a registration example of the learning model.

FIG. 25 is an explanatory diagram that illustrates a registration example of the learning model. In step S2208, the model management server 400 stores the learning model ID, the learning model 1400, and the usage method information 2111, while relating those with each other, in the learning model directory 2110 that corresponds to the issued learning model ID.

Then, the model management server 400 stores the learning model ID, the learning model path to the learning model directory 2110, the servicer account, the usage purpose, and the prediction accuracy assessment reference, while relating those with each other, in the learning model management table 2100. Accordingly, a new record 2101-8 is generated in the learning model management table 2100.

Returning to the description of FIG. 22, the model management server 400 notifies the CAD management server 200 of the issued learning model ID (step S2209). Next, the CAD management server 200 saves the notified learning model ID, the received target user us or group, and the received prediction accuracy assessment stage while relating those with each other (step S2210).

Figure 26:
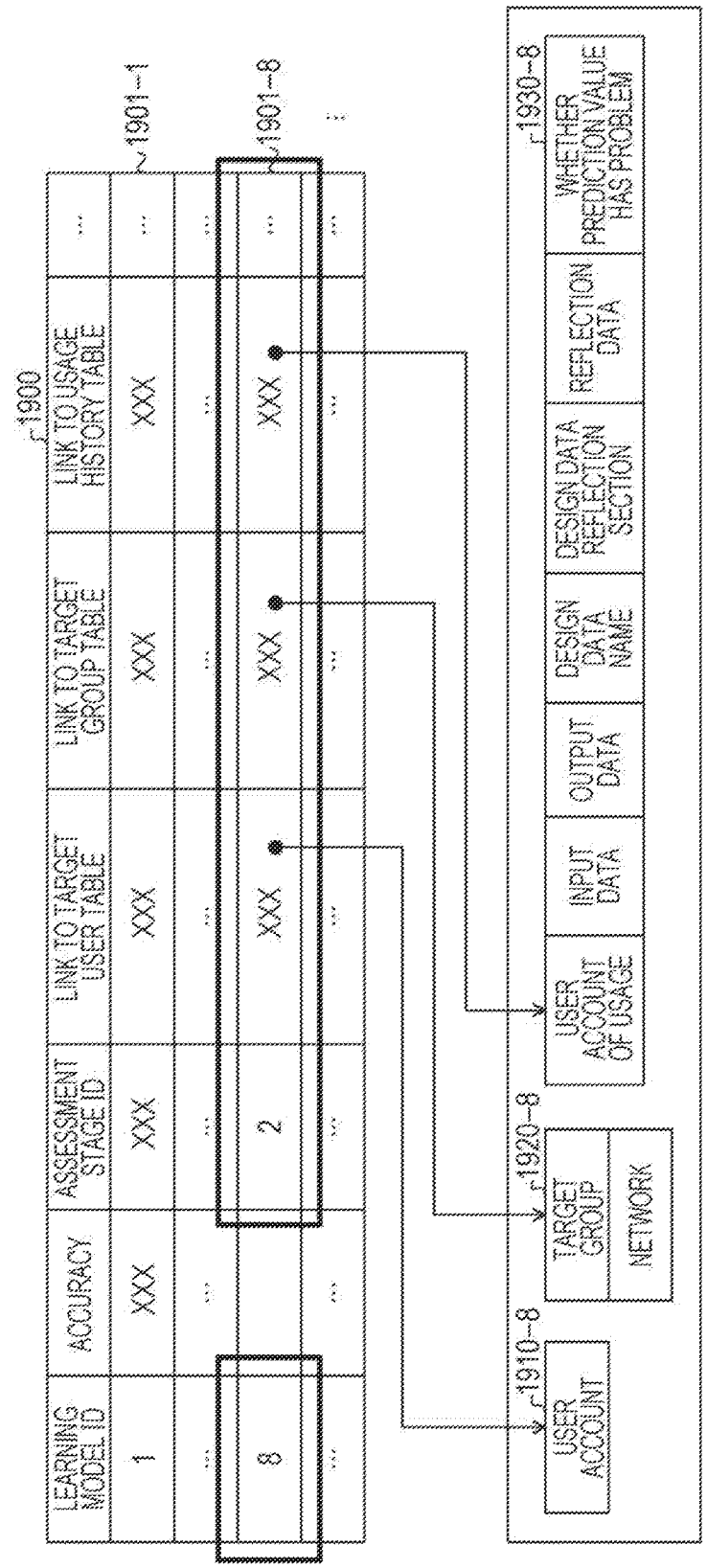
FIG. 26 is an explanatory diagram that illustrates a registration example in a model ID management table.

FIG. 26 is an explanatory diagram that illustrates a registration example in the model ID management table. The CAD management server 200 saves the learning model ID notified in step S2209, and the target user us or group and the prediction accuracy assessment stage which are received in step S2206, while relating those with each other.

Returning to the description of FIG. 22, the CAD management server 200 transmits the learning model ID to the provider terminal device 103 (step S2211). Accordingly, the servicer sr may anew register the learning model.

(Registration Process Procedures of Learning Model)

Figure 27:
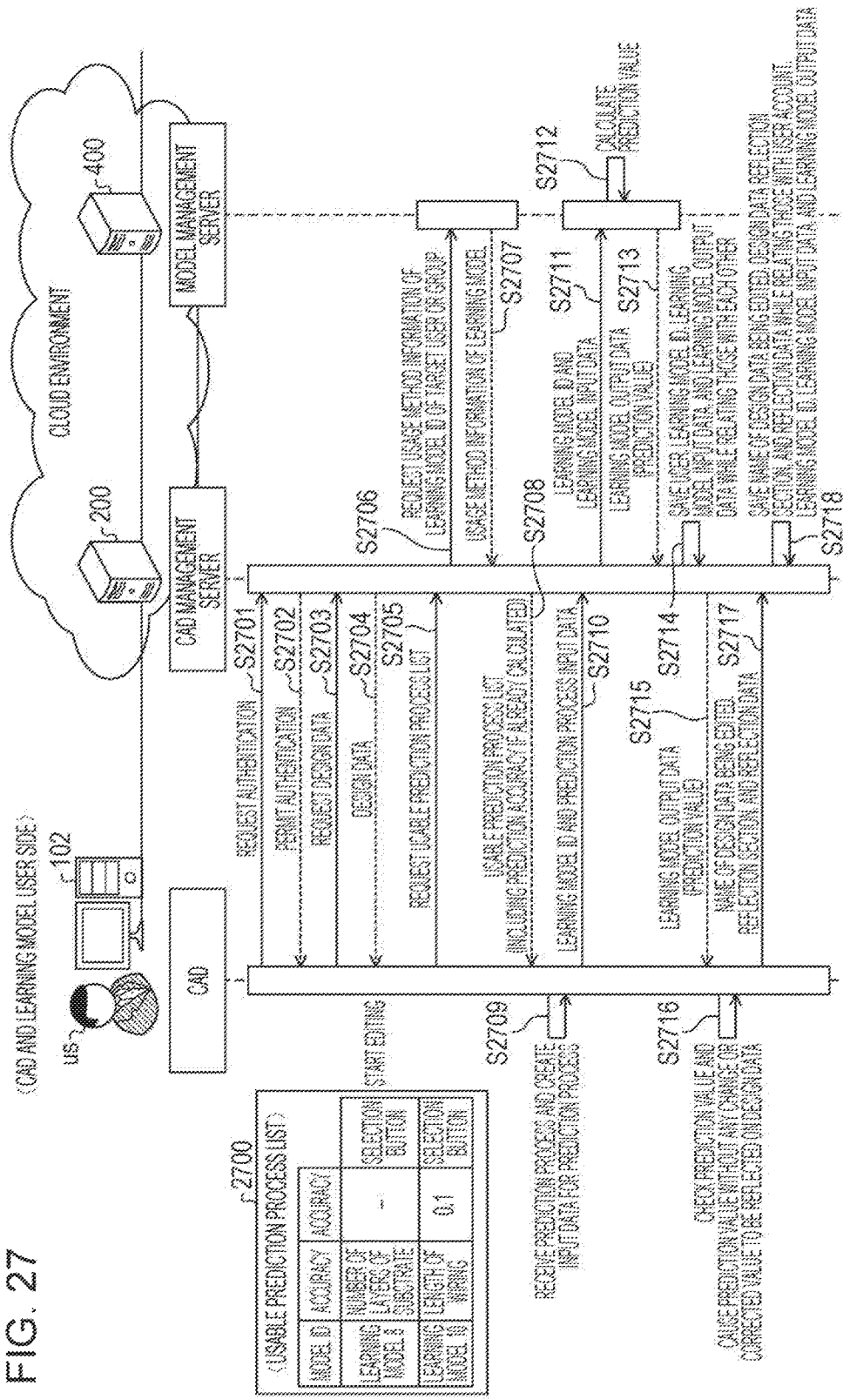
FIG. 27 is a sequence diagram that illustrates registration process procedures of the learning model.

FIG. 27 is a sequence diagram that illustrates registration process procedures of the learning model. Here, a description will be made about the registration process procedures of the learning model by the servicer sr, which is illustrated in FIG. 11. The user terminal device 102 performs the authentication request by the email address or the like (step S2701). The CAD management server 200 performs the authentication in response to the authentication request. Here, the cloud application management server permits the authentication (step S2702).

In a case where the authentication is permitted, the user terminal device 102 requests the design data 1302 (step S2703). Then, the CAD management server 200 transmits the design data 1302 in response to the request from the user terminal device 102 (step S2704). Accordingly, the user us starts editing the design data 1302 by using the CAD.

The user terminal device 102 requests a usable prediction process list from the CAD management server 200 (step S2705). The CAD management server 200 searches for the learning model ID, in which the user account of the requesting user us is included in the target user table 1910 which is linked to the model ID management table 1900, in response to the request from the user terminal device 102. Further, the CAD management server 200 searches for the learning model ID, in which the group to which the user account of the requesting user us belongs is included in the target groups which are linked to the model ID management table 1900. Then, the CAD management server 200 requests the usage method information 2111 of the learning model ID in which the user us or the group to which the user us belongs is searched for from the model management server 400 (step S2706).

The model management server 400 extracts the usage method information 2111 that corresponds to the requested learning model ID from the learning model management table 2100. Then, the model management server 400 transmits the extracted usage method information 2111 of the learning model to the CAD management server 200 (step S2707).

Next, the CAD management server 200 creates the usable prediction process list based on the learning model ID that is searched for and the received usage method information 2111 of the learning model. In a case where the accuracy is already set in a record 2101 that includes the learning model ID which is searched for based on the model ID management table 1900, the CAD management server 200 relates the learning model ID included in the usable prediction process list with the accuracy. Then, the CAD management server 200 transmits the created usable prediction process list to the user terminal device 102 (step S2708).

The user terminal device 102 causes the display 809 to display the received usable prediction process list. A screen 2700 that is displayed on the display 809 includes the learning model ID, the usage method information, and the prediction accuracy for each of the usable learning models, for example. The user terminal device 102 receives selection of the prediction process by the user us from the usable prediction process list. Then, the user terminal device 102 creates input data for the prediction process from the design data 1302 that are being edited (step S2709). Here, it is assumed that the prediction process that predicts the number of layers of the printed substrate is selected. As described above, the information that indicates the number of components, the number of component pins, the number of nets, the substrate area, and so forth is generated from the design data 1302 as the input data. For example, in a case where a creation command for the input data is already created in the CAD, the user terminal device 102 creates the input data by executing the creation command. Further, in a case where there is lack in the input data, the user terminal device 102 advises the user us to input lacking information, receives the lacking information, and thereby creates the input data.

The user terminal device 102 transmits the learning model ID that corresponds to the selected prediction process and the created input data, while relating those with each other, to the CAD management server 200 (step S2710). The CAD management server 200 transmits the learning model ID and the input data of the learning model to the model management server 400 (step S2711).

The model management server 400 calculates the prediction value by using the learning model that corresponds to the specified learning model ID and the input data (step S2712). Then, the model management server 400 transmits the output data of the learning model to the CAD management server 200 (step S2713).

The CAD management server 200 saves the requesting user us, the learning model ID, the input data of the learning model, and the output data of the learning model while relating those with each other (step S2714).

Figure 28:
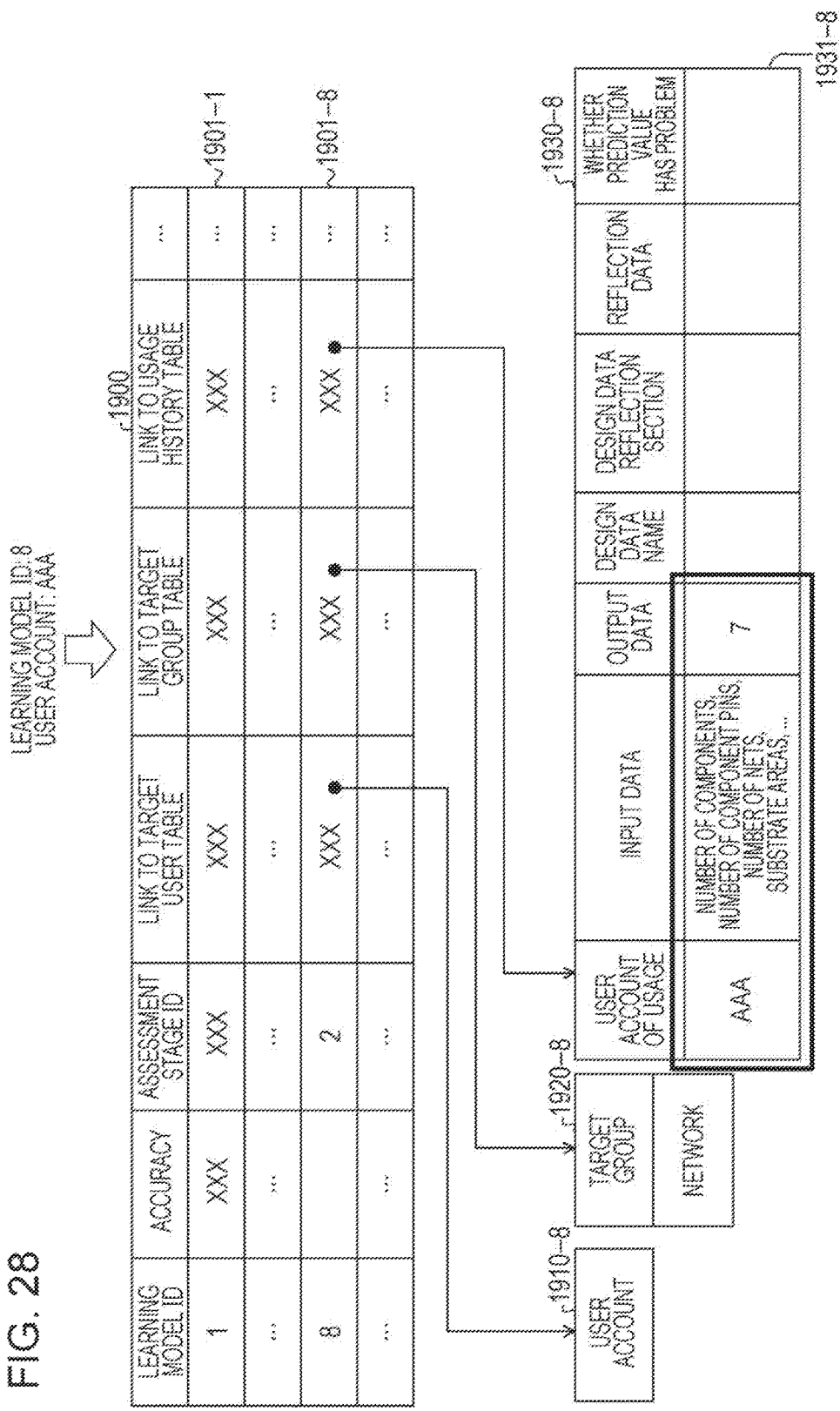
FIG. 28 is an explanatory diagram that illustrates update examples (No. 1) of tables that are related to the model ID management table.

FIG. 28 is an explanatory diagram that illustrates update examples (No. 1) of tables that are related to the model ID management table. In step S2714, the CAD management server 200 refers to the usage history table 1930 that corresponds to the learning model ID. Then, the CAD management server 200 stores "AAA" as the user account, the input data, and "7" as the output data, while relating those with each other, in the usage history table 1930.

Returning to the description of FIG. 27, the CAD management server 200 transmits the output data of the learning model to the user terminal device 102 (step S2715). Then, the user terminal device 102 displays the received output data of the learning model. The user us checks the prediction value. Then, the user terminal device 102 causes the prediction value without any change or a corrected value to be reflected on the design data 1302 in response to an input of the user us (step S2716).

Figure 29:
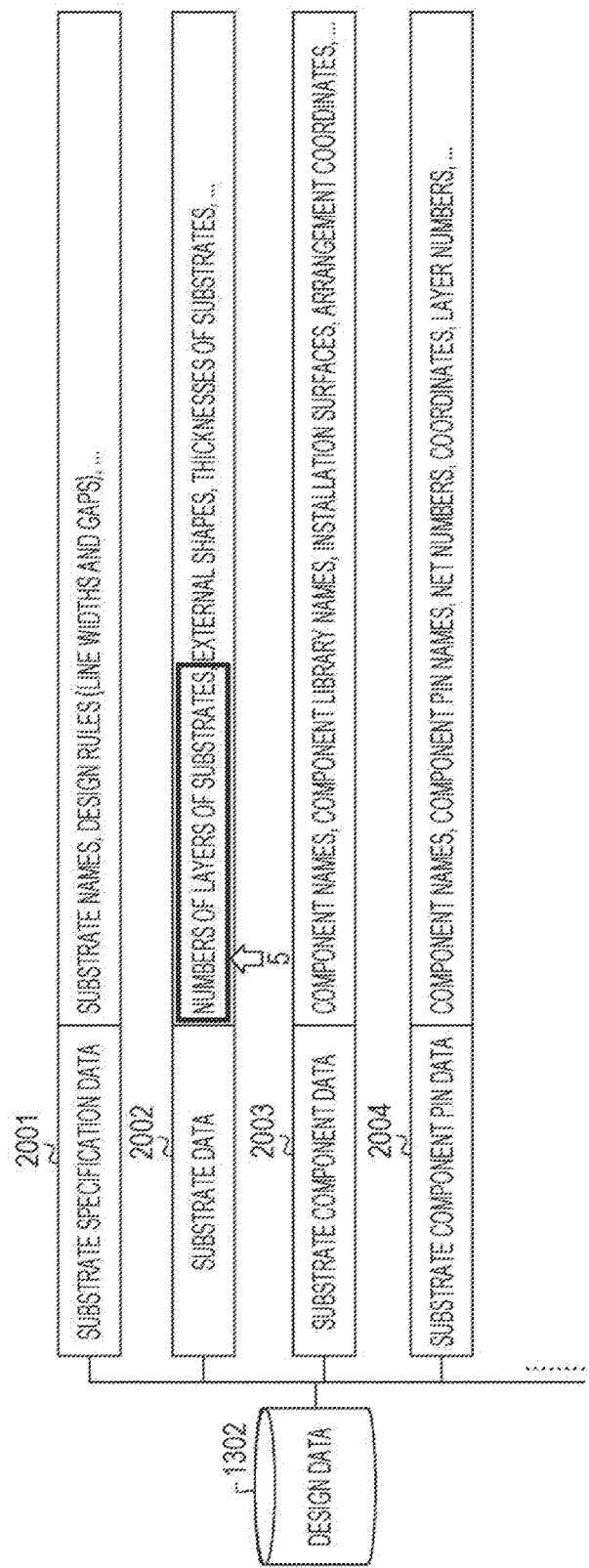
FIG. 29 is an explanatory diagram that illustrates a reflection example on the design data.

FIG. 29 is an explanatory diagram that illustrates a reflection example on the design data. In step S2724, the user terminal device 102 sets "5" as the reflection data that is input based on the prediction value as the number of layers of the substrate of the substrate data 2002 that are included in the design data 1302.

Returning to the description of FIG. 27, the user terminal device 102 transmits the name of the design data that are being edited, the reflection section, and the reflection data (step S2717). Then, the CAD management server 200 saves the name of the design data that are being edited, the reflection section, and the reflection data while relating those with the user account, the learning model ID, the learning model input data, and the learning model output data (step S2718).

Figure 30:
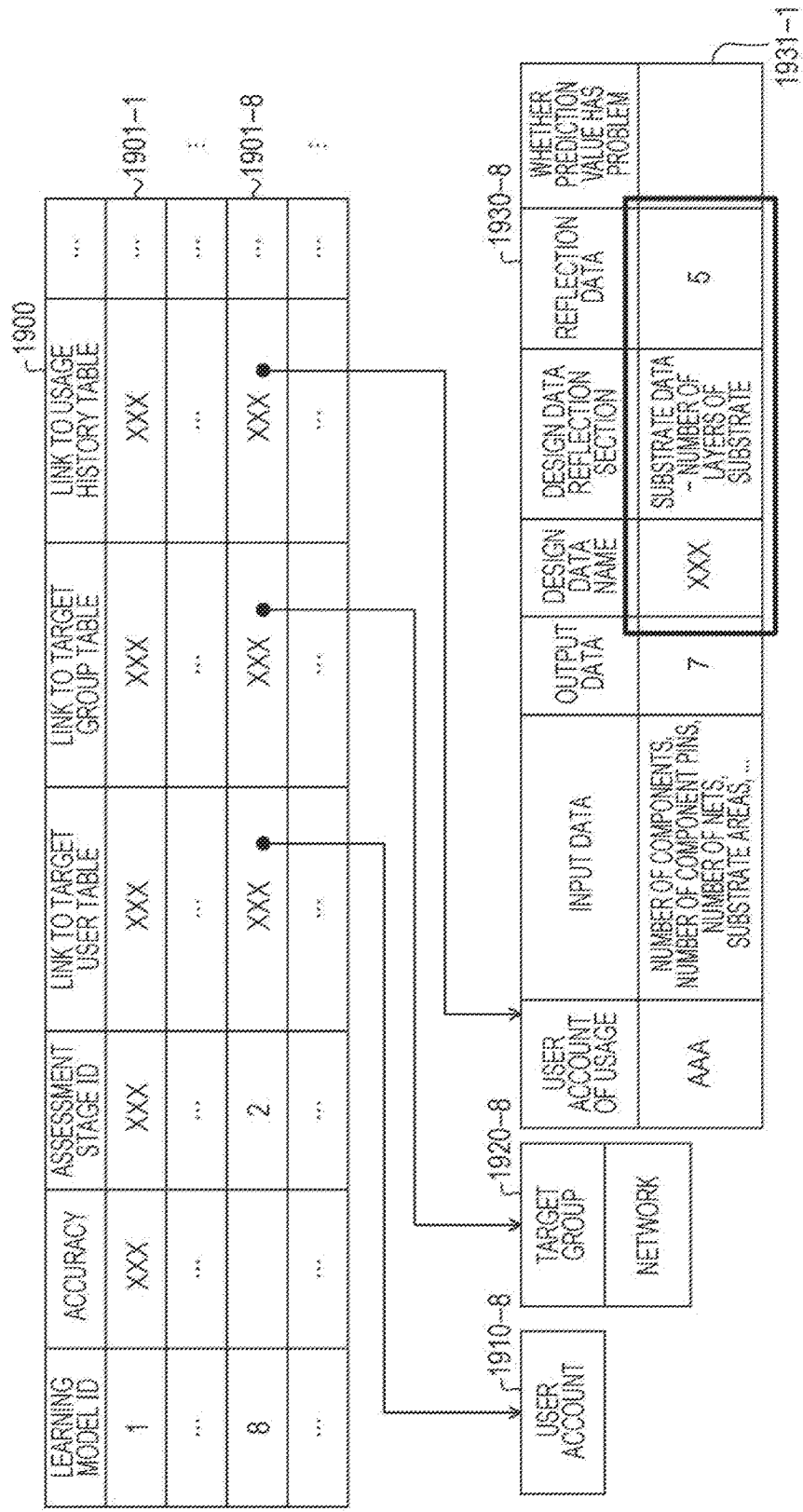
FIG. 30 is an explanatory diagram that illustrates update examples (No. 2) of tables that are related to the model ID management table.

FIG. 30 is an explanatory diagram that illustrates update examples (No. 2) of tables that are related to the model ID management table. In step S2718, the CAD management server 200 saves the name of the design data that are being edited, the design data reflection section, and the reflection data for the record 1931-1 that has the user account of the requesting user us of the usage history table 1930 which corresponds to the learning model ID.

(Prediction Accuracy Assessment Process Procedure Example 1)

Figure 31:
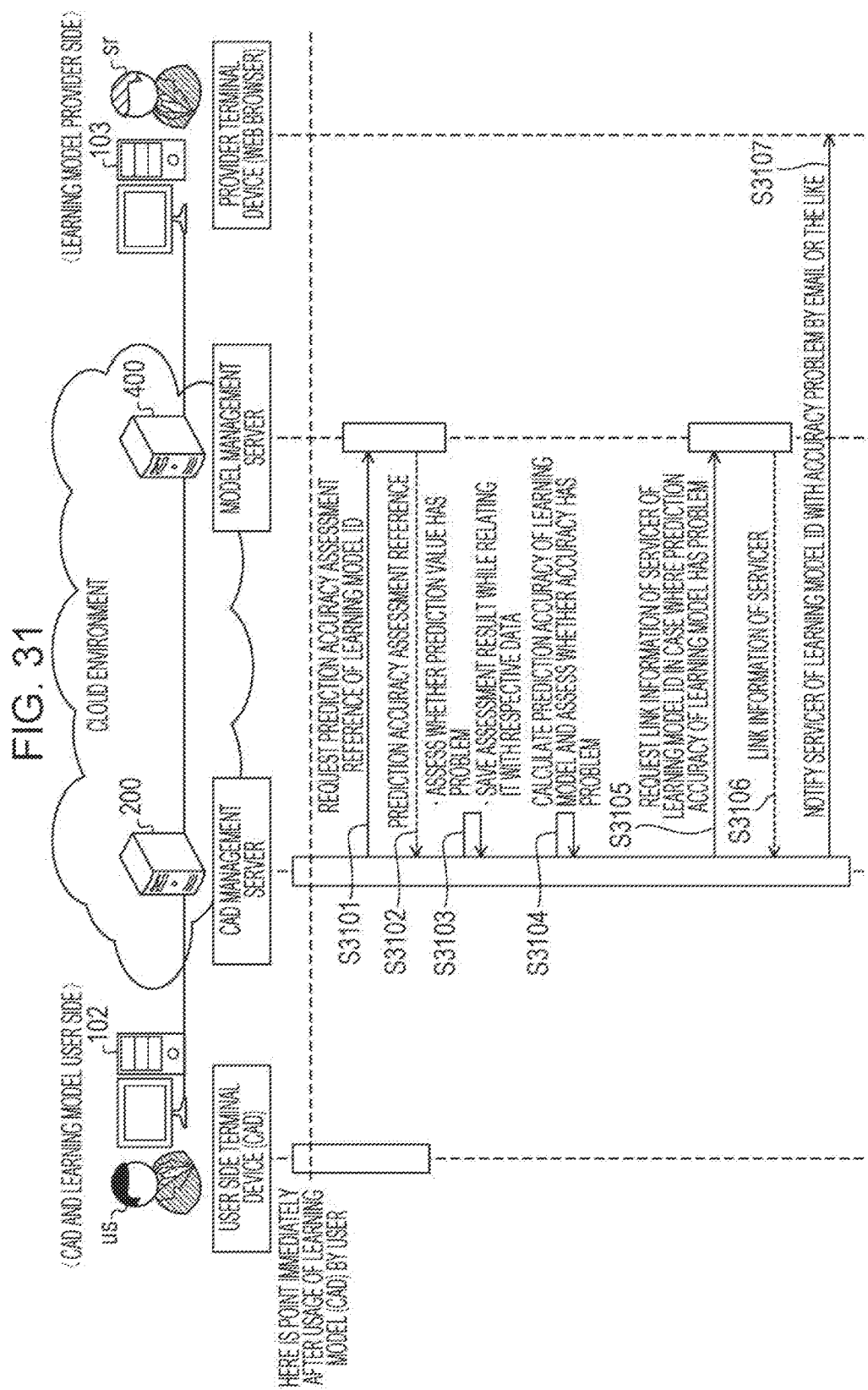
FIG. 31 is a sequence diagram that illustrates a prediction accuracy assessment process procedure example 1 of the learning model.

FIG. 31 is a sequence diagram that illustrates a prediction accuracy assessment process procedure example 1 of the learning model. In an assessment process procedure example 1, a description will be made about procedures in a case where the timing at which the prediction accuracy is assessed is a prediction value file reflection stage.

At the timing for assessing the prediction accuracy, the CAD management server 200 requests the prediction accuracy assessment reference of the learning model ID (step S3101). The model management server 400 transmits the prediction accuracy assessment reference (step S3102).

Next, the CAD management server 200 assesses whether or not the prediction value has a problem based on the prediction value, the reflection data, and the prediction accuracy assessment reference. Then, the CAD management server 200 saves an assessment result while relating it with the data (step S3103).

Figure 32:
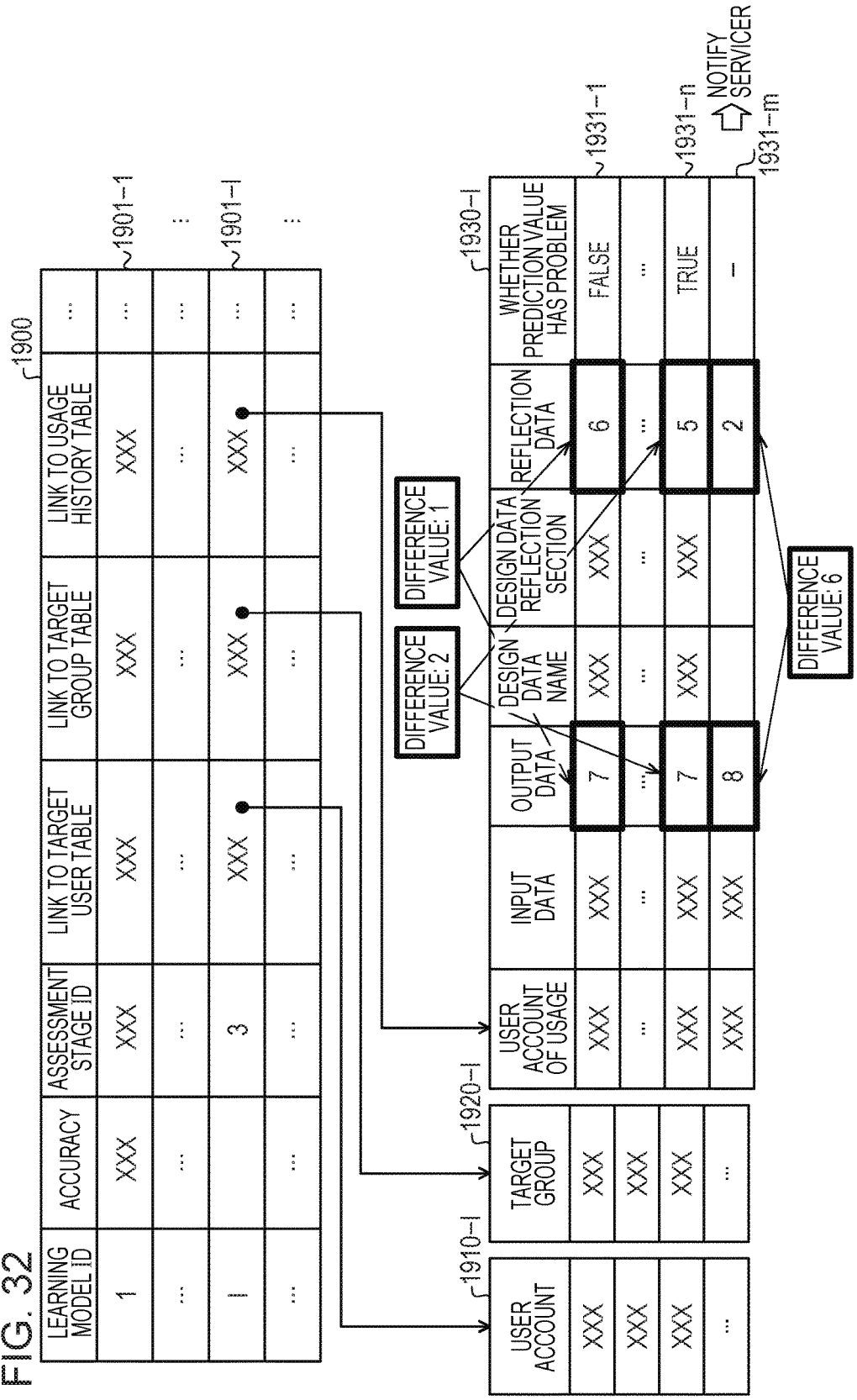
FIG. 32 is an explanatory diagram that illustrates assessment examples of prediction values.

FIG. 32 is an explanatory diagram that illustrates assessment examples of the prediction values. The CAD management server 200 determines whether or not the difference value between the output data and the reflection data exceeds the second degree. The second degree is ±1. In a case where a determination is made that the difference value between the output data and the reflection data does not exceed the second degree, the CAD management server 200 determines that the prediction value does not have a problem. In a case where a determination is made that the prediction value does not have a problem, the CAD management server 200 sets "False" in the field of whether the prediction value has a problem.

In a case where a determination is made that the difference value between the output data and the reflection data is in the second degree, the CAD management server 200 determines that the prediction value has a problem. In a case where a determination is made that the prediction value has a problem, the CAD management server 200 sets "True" in the field of whether the prediction value has a problem.

Raising the record 1931-1 as an example, because the output data is "7" and the reflection data is "6", a determination is made that the prediction value does not have a problem, and "False" is set. Raising a record 1931-$n$ as an example, because the output data is "7" and the reflection data is "5", a determination is made that the prediction value has a problem, and "True" is set.

Further, in a case where the difference value between the output data and the reflection data exceeds the second degree, the CAD management server 200 determines whether or not the difference value between the output data and the reflection data exceeds the first degree. In a case where the difference value between the output data and the reflection data exceeds the first degree, the CAD management server 200 assesses the prediction value as far from the correct value. Then, in a case where the prediction value is assessed as far from the correct value, the CAD management server 200 immediately notifies the provider terminal device 103 that the prediction value is far from the correct value. As a notification method, for example, the email or the like may be raised. Here, for example, the CAD management server 200 notifies the provider terminal device 103, by email or the like, of the difference value and the learning model ID while relating those with each other. Accordingly, a fact that the prediction value is far from the reflection data that is the correct value is notified to the servicer sr.

Raising a record 1931-$m$ as an example, because the output data is "8" and the reflection data is "2", the difference value between the output data and the reflection data exceeds the first degree. Thus, the prediction value is assessed as far from the correct value, and this assessment is notified to the servicer sr.

Next, returning to the description of FIG. 31, the CAD management server 200 calculates the prediction accuracy of the learning model and assesses whether the accuracy has a problem (step S3104).

Figure 33:
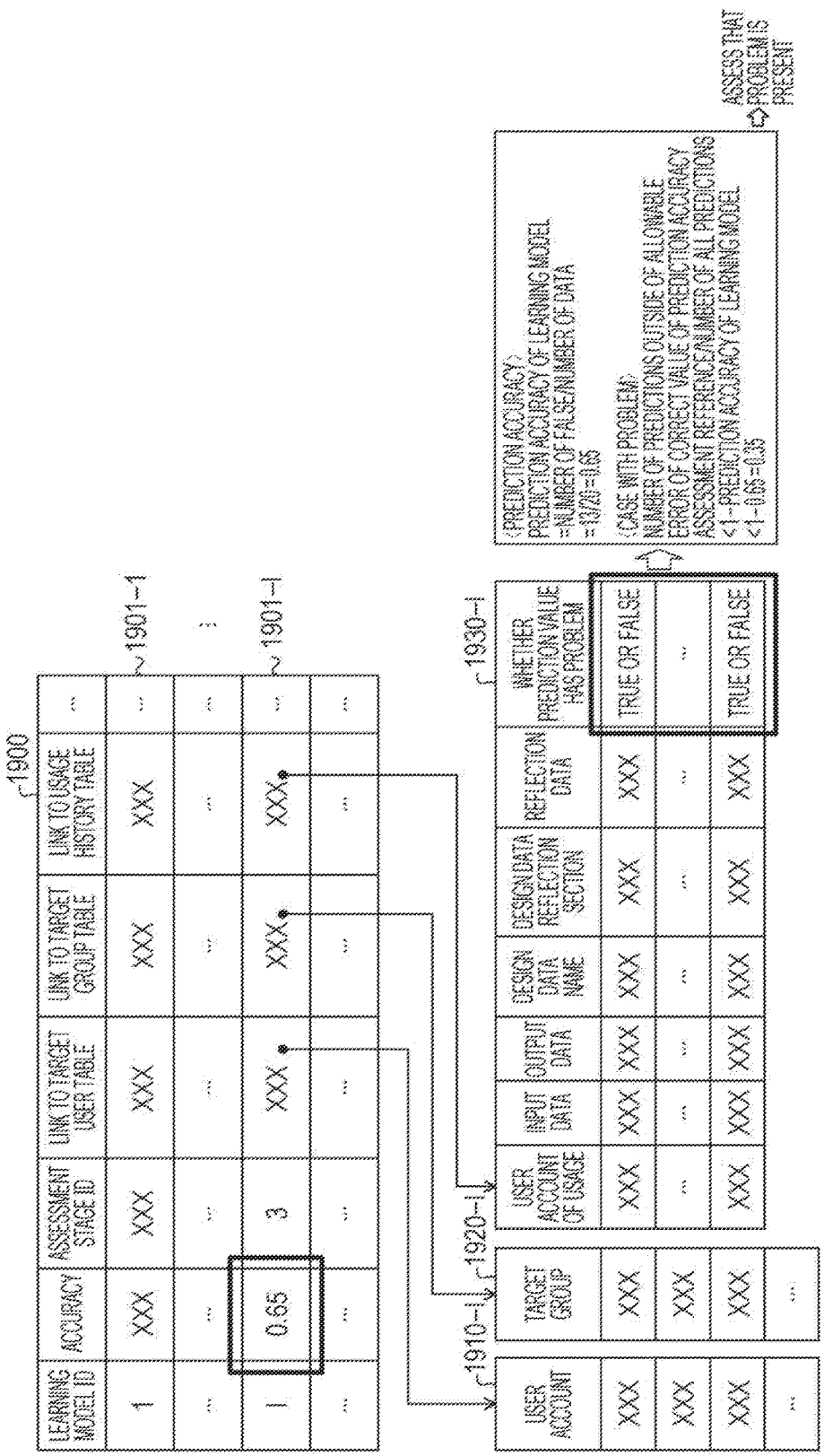
FIG. 33 is an explanatory diagram that illustrates an assessment example of a prediction accuracy.

FIG. 33 is an explanatory diagram that illustrates an assessment example of the prediction accuracy. The CAD management server 200 calculates the prediction accuracy based on the number of predictions that are not in the first degree and the number of all predictions.

As illustrated in FIG. 33, the CAD management server 200 calculates the prediction accuracy by following expression (1).

The prediction accuracy of the learning model=the number of false that is registered in the usage history table 1930 of the learning model/the number of data that are registered in the usage history table 1930    (1)

In the example in FIG. 33, because the number of false is 13 and the number of all data is 20, the prediction accuracy is 0.65. The CAD management server 200 stores the calculated prediction accuracy in the model ID management table 1900.

As illustrated in FIG. 33, the CAD management server 200 assesses the prediction accuracy as having a problem in a case where following relational expression (2) holds true.

The designated value<1−the prediction accuracy of the learning model    (2)

As described above, the designated value is a threshold value about "the number of predictions in which the difference value between the prediction value and the correct value is not in the first degree of the prediction accuracy assessment reference/the number of all predictions".

In the example in FIG. 33, because the designated value is 0.1 and the prediction accuracy is 0.65, the CAD management server 200 assesses the prediction accuracy of the learning model as having a problem.

Returning to the description of FIG. 31, in a case where the prediction accuracy of the learning model is assessed as having a problem, the CAD management server 200 requests the servicer account of the servicer sr that provides the leaning model ID from the model management server 400 (step S3105).

The model management server 400 transmits the servicer account to the CAD management server 200 (step S3106). The CAD management server 200 notifies the provider terminal device 103 of the learning model ID of the leaning model that is assessed as having an accuracy problem and the prediction accuracy of the learning model based on the servicer account as the address such as the email address (step S3107). Accordingly, the prediction accuracy may be assessed and fed back to the servicer sr.

(Prediction Accuracy Assessment Process Procedure Example 2)

Figure 34:
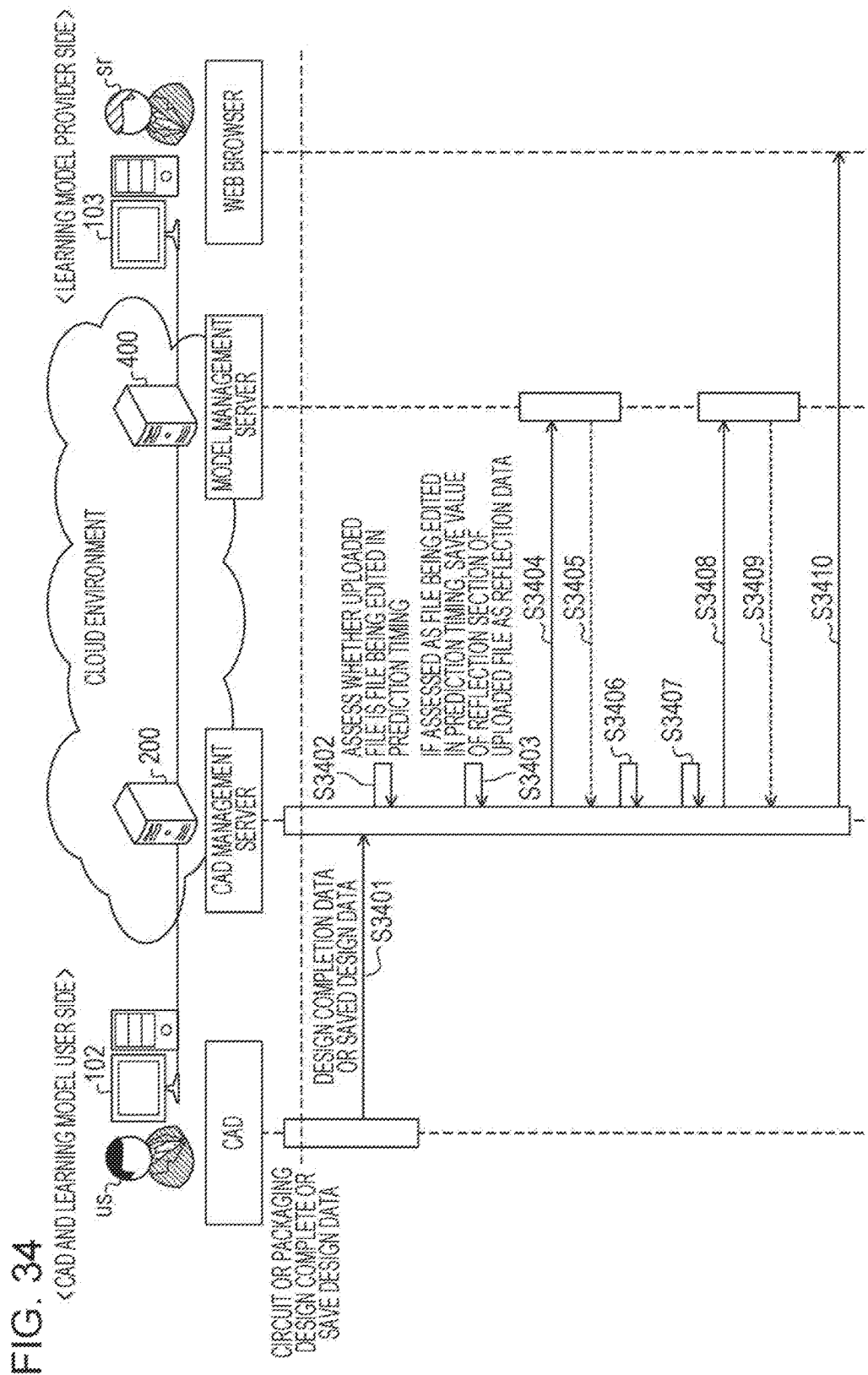
FIG. 34 is a sequence diagram that illustrates a prediction accuracy assessment process procedure example 2 of the learning model.

FIG. 34 is a sequence diagram that illustrates a prediction accuracy assessment process procedure example 2 of the learning model. In an assessment process procedure example 2, a description will be made about procedures in a case where the timing at which the prediction accuracy is assessed is a circuit or packaging design completion stage or a design data saving stage.

The user terminal device 102 transmits the design data 1302 in which the design is completed or the saved design data 1302 to the CAD management server 200 (step S3401). The CAD management server 200 assesses whether or not uploaded design data are the design data 1302 that use the prediction by the learning model (step S3402).

Figure 35:
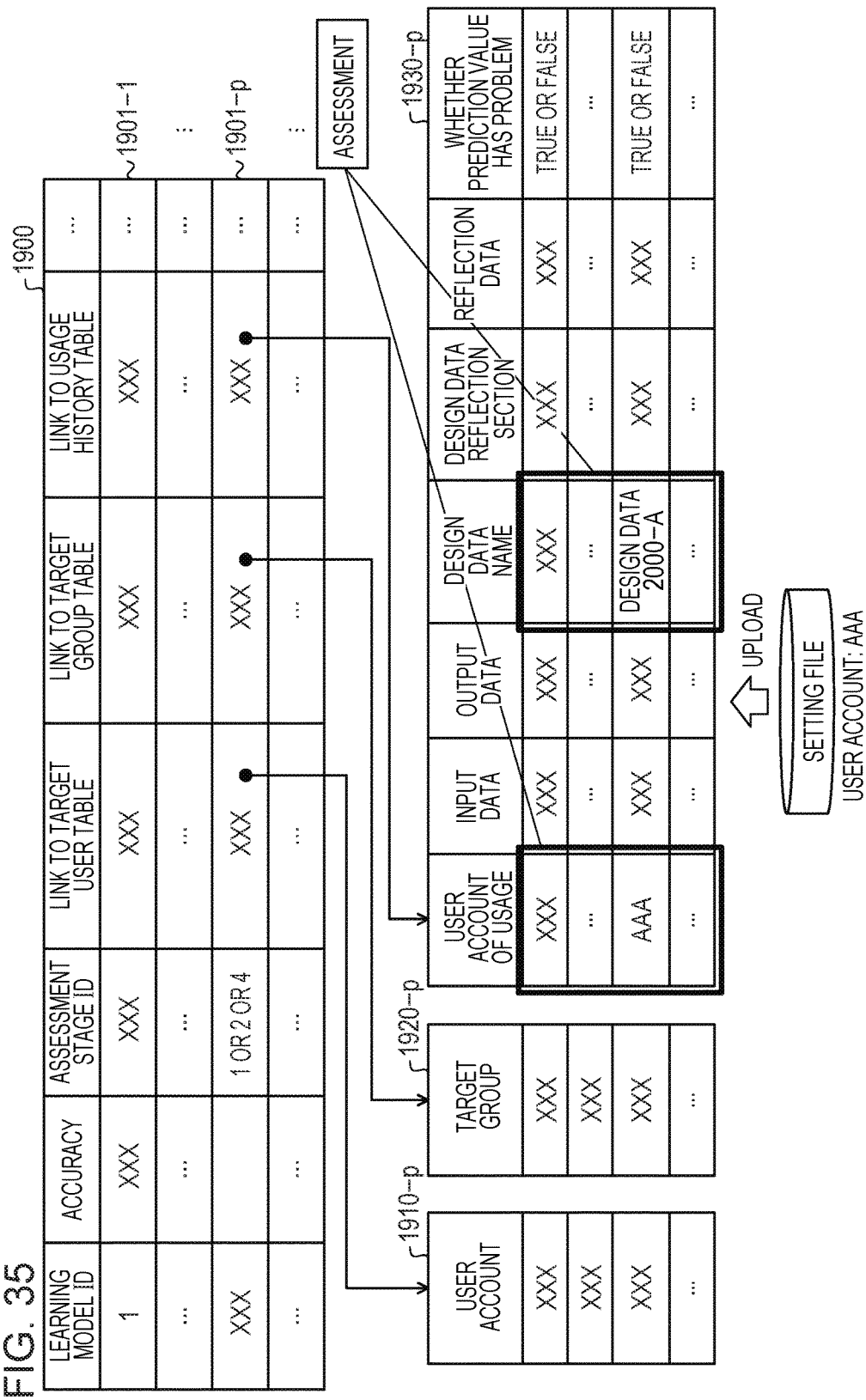
FIG. 35 is an explanatory diagram that illustrates an assessment example of whether the design data are design data that use prediction by the learning model.

FIG. 35 is an explanatory diagram that illustrates an assessment example of whether the design data are the design data that use the prediction by the learning model. In step S3402, the CAD management server 200 analyzes a design situation of the uploaded design data 1302 based on a usage log of the user us. For example, in a case where an operation for the arrangement of components is not performed in an analysis timing of the design situation in a previous time but the operation for the arrangement of the components is performed in the analysis timing of the design situation in a present time, the CAD management server 200 assesses that the stage is the circuit design completion or packaging design start stage.

Then, in a case where an assessment is made that the prediction accuracy assessment stage is reached, the CAD management server 200 assesses whether or not the user account and a file name of the uploaded design data match the user account of usage of the learning model and the design data name.

Figure 36:
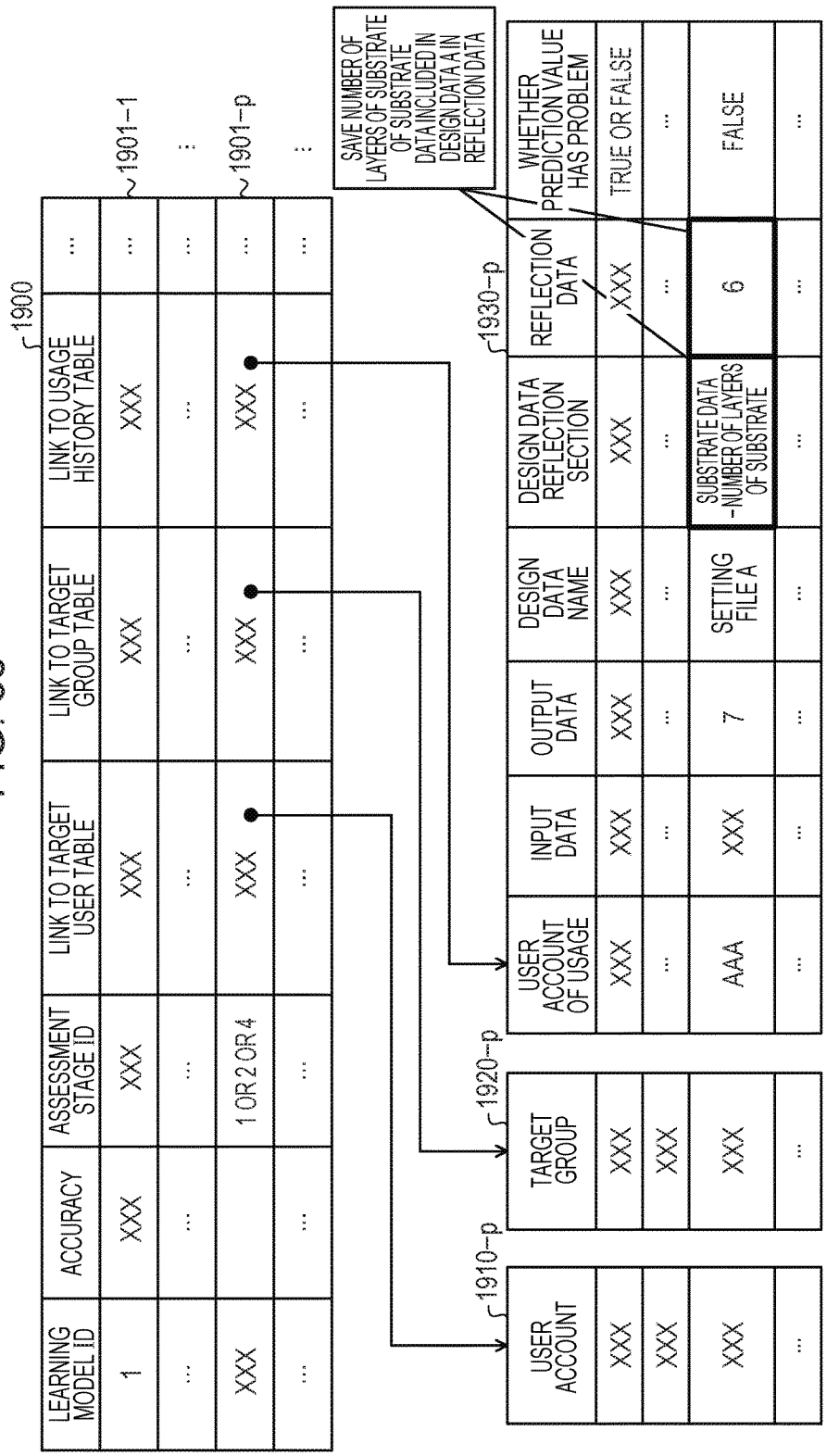
FIG. 36 is an explanatory diagram that illustrates a reflection example of an uploaded file.

FIG. 36 is an explanatory diagram that illustrates a reflection example of an uploaded file. In a case where the user account and the file name of the uploaded design data 1302 are assessed as matching the user account of usage of the learning model and the design data name, the CAD management server 200 saves a value of the reflection section of the uploaded file as the reflection data.

Returning to the description of FIG. 34, next step S3404 to step S3410 are similar to the processes of step S3101 to step S3107 that are illustrated in FIG. 31, and a detailed description will thus not be made.

(Providing Process Procedures of Analysis Data)

Figure 37:
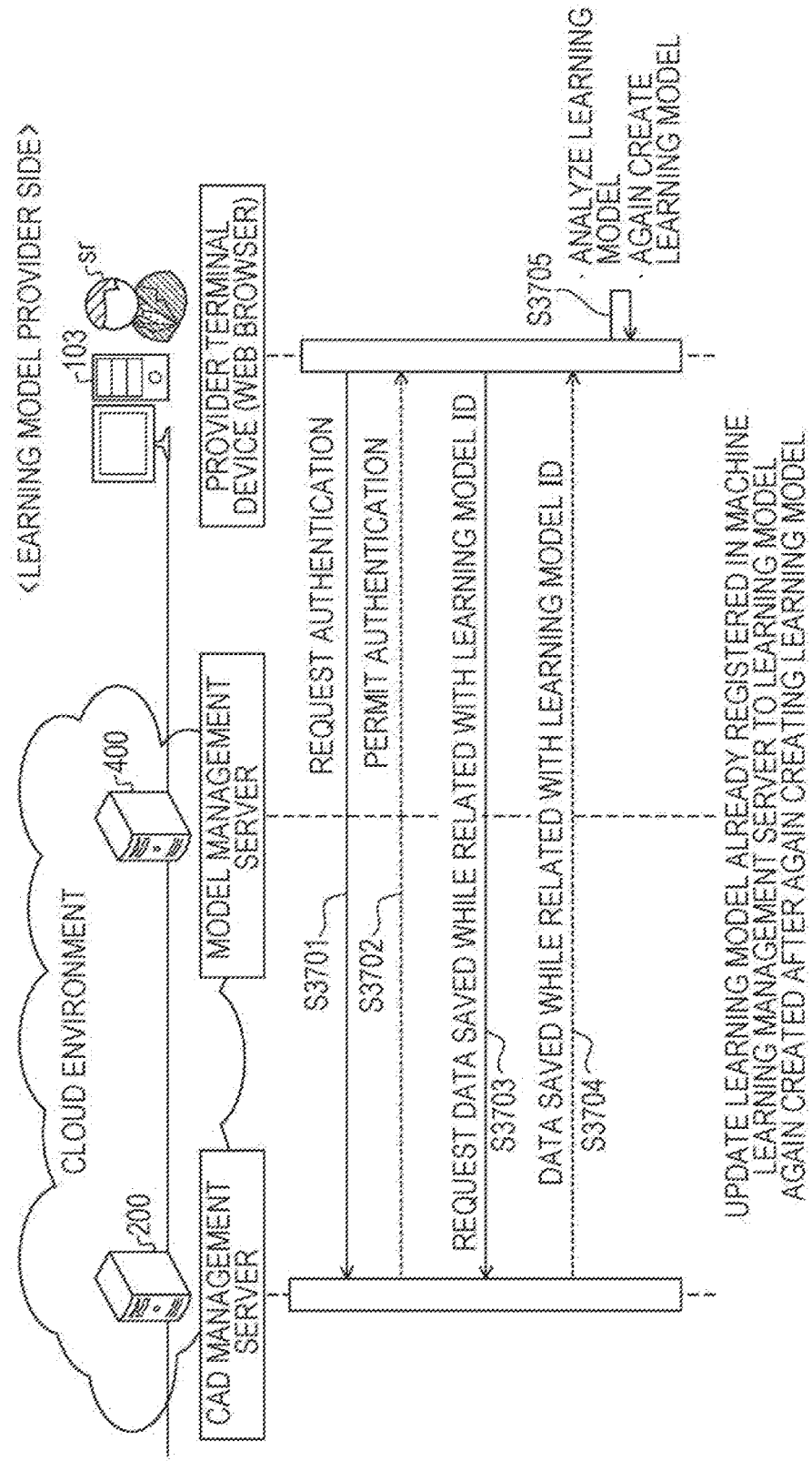
FIG. 37 is a sequence diagram that illustrates an example of providing process procedure of analysis data for the learning model.

FIG. 37 is a sequence diagram that illustrates an example of providing process procedure of analysis data for the learning model. The provider terminal device 103 performs the authentication request to the CAD management server 200 (step S3701). Here, the servicer sr performs interchanges or the like of data and requests with the CAD management server 200 via the web browser.

Next, the CAD management server 200 performs the authentication in response to the authentication request. As described above, the authentication is performed by the user account such as the email address or a user ID. Here, the CAD management server 200 permits the authentication (step S3702).

Next, the provider terminal device 103 requests transmission of data that are saved while related with the learning model ID (step S3703). Then, the CAD management server 200 transmits the data that are saved while related with the learning model ID to the provider terminal device 103 (step S3704).

Figure 38:
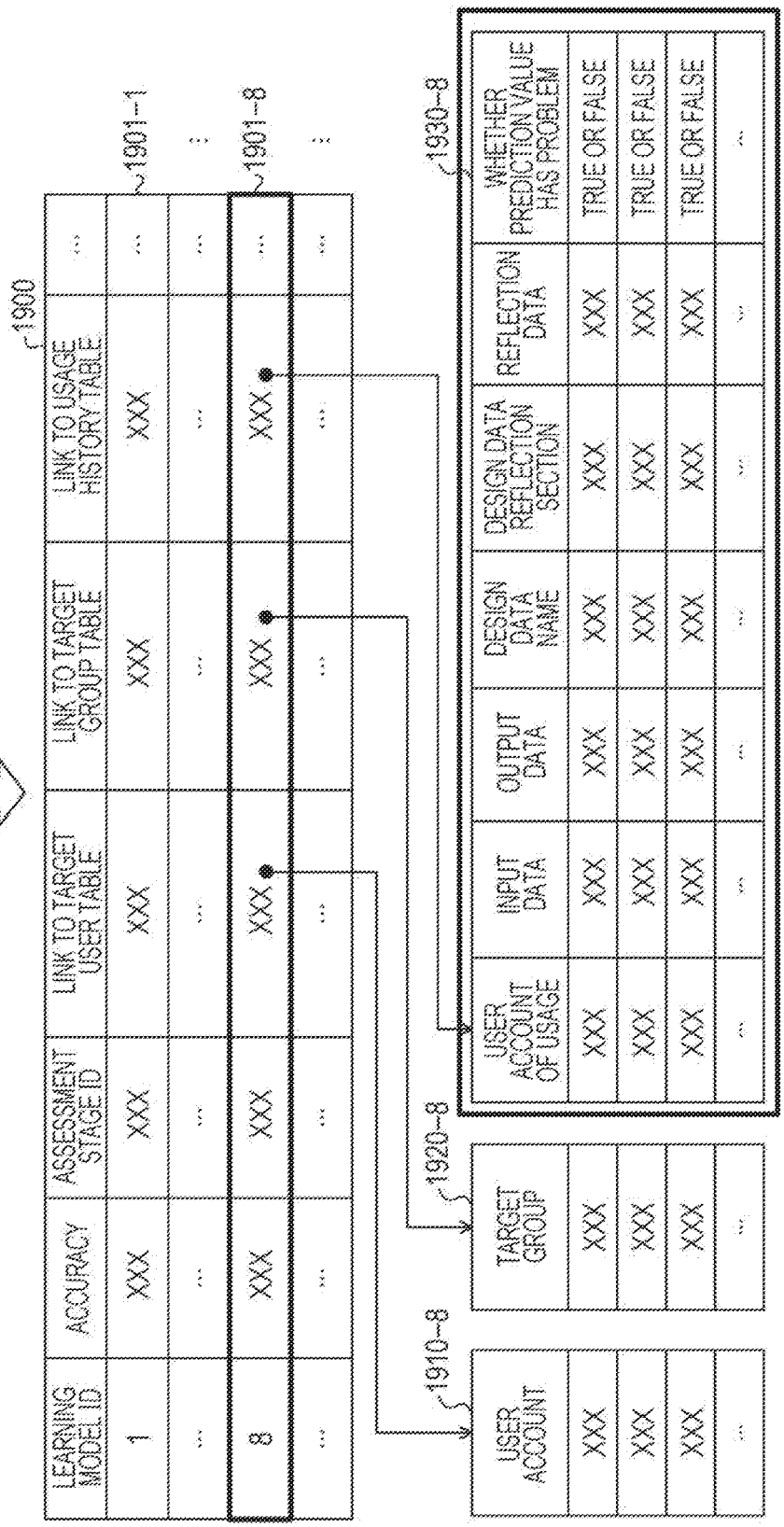
FIG. 38 is an explanatory diagram that illustrates examples of data that are related to a learning model ID.

FIG. 38 is an explanatory diagram that illustrates examples of the data that are related to the learning model ID. In step S3704, the CAD management server 200 searches for the record that corresponds to the learning model ID from the model ID management table 1900 based on the learning model ID that is transmitted by the provider terminal device 103.

For example, a record-8 that corresponds to a learning model ID "8" is detected. The cloud application management server acquires the usage history table 1930 by a link to the usage history table included in the record-8. Then, in step S3704, the CAD management server 200 transmits the acquired usage history table 1930 to the provider terminal device 103.

Returning to the description of FIG. 37, the provider terminal device 103 again creates the learning model by analyzing the acquired usage history table 1930 (step S3705).

(Notification Process Procedures to User us)

Figure 39:
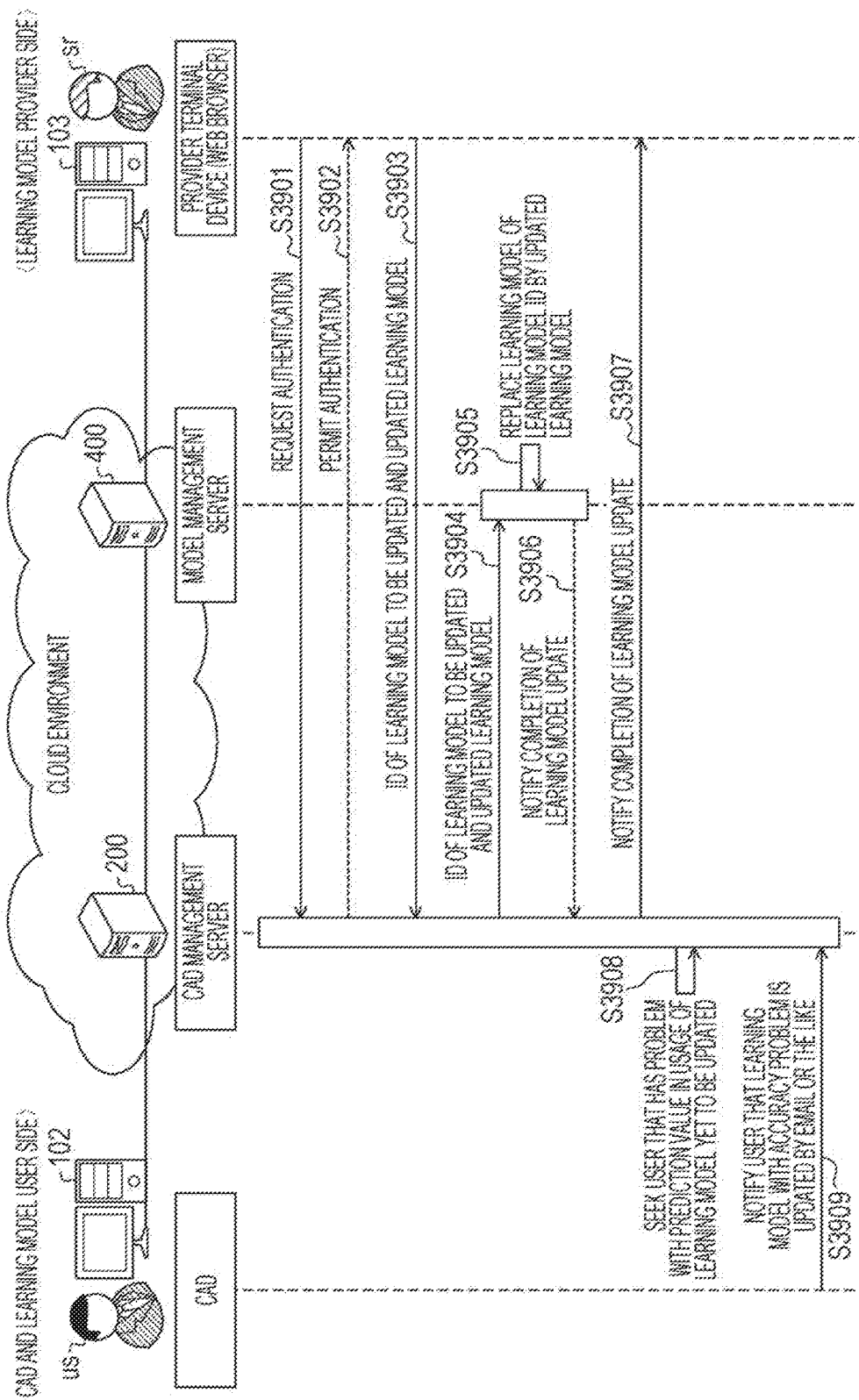
FIG. 39 is a sequence diagram that illustrates an example of notification process procedure to a user in a case of leaning model update.

FIG. 39 is a sequence diagram that illustrates an example of notification process procedure to the user in a case of leaning model update. The provider terminal device 103 performs the authentication request to the CAD management server 200 (step S3901). Next, the CAD management server 200 performs the authentication in response to the authentication request. Here, the CAD management server 200 permits the authentication (step S3902). The provider terminal device 103 transmits the learning model ID as an update target and the updated learning model (step S3903).

The CAD management server 200 transmits the received learning model ID as the update target and the updated learning model to the model management server 400 (step S3904). A machine learning management server replaces the learning model of the learning model ID that is retained by the learning model that is received and updated (step S3905).

Figure 40:
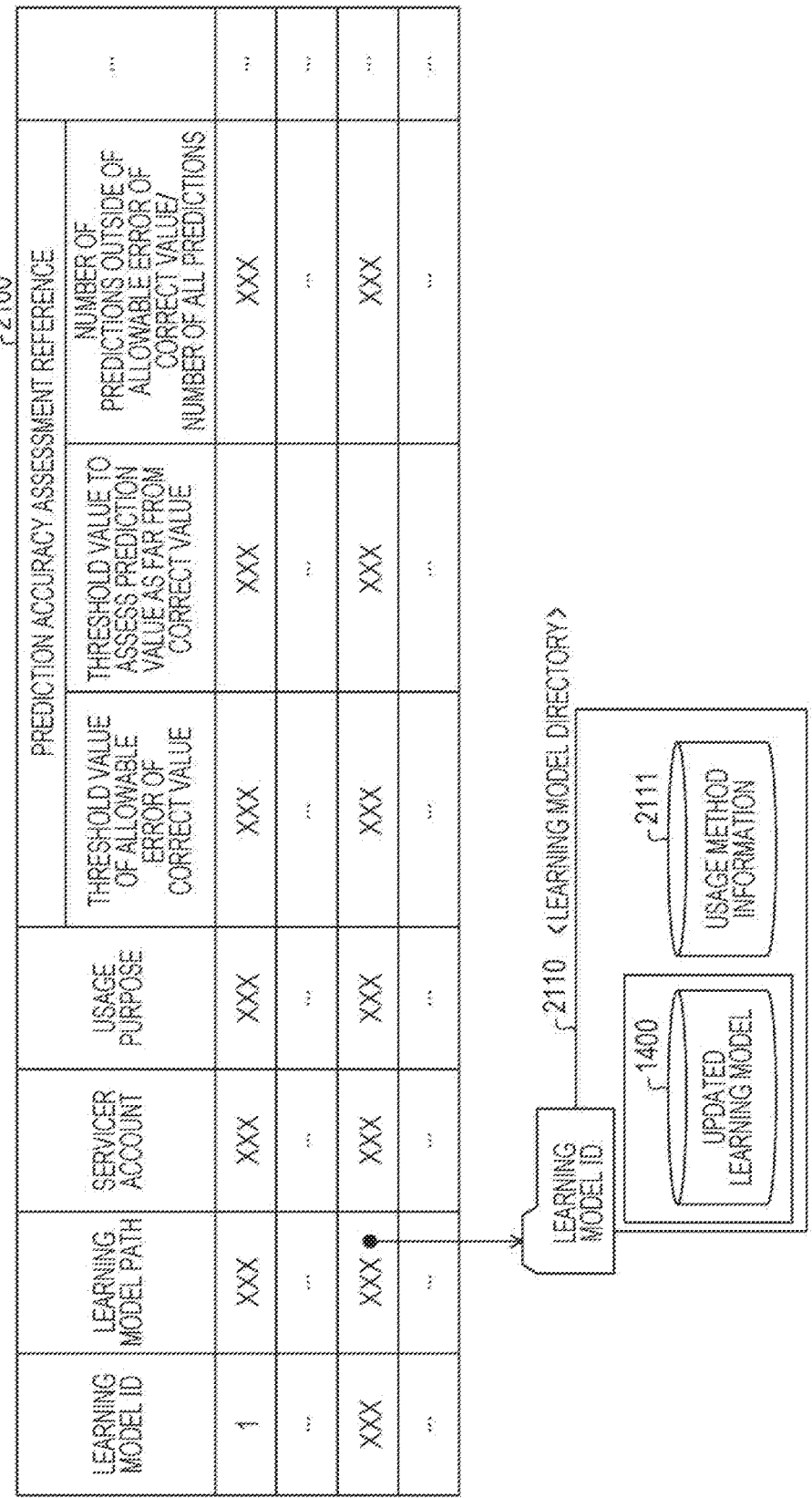
FIG. 40 is an explanatory diagram that illustrates an update example of the learning model.

FIG. 40 is an explanatory diagram that illustrates an update example of the learning model. In step S3905, the model management server 400 searches for the record 2101 that corresponds to the received learning model ID from the learning model management table 2100. Then, in step S3905, the model management server 400 replaces the learning model stored in the directory that corresponds to the learning model ID by the learning model that is received and updated based on the learning model path included in the detected record 2101.

Returning to the description of FIG. 39, the model management server 400 notifies the CAD management server 200 of completion of the update of the learning model (step S3906). Next, the CAD management server 200 notifies the provider terminal device 103 of the completion of the update of the learning model (step S3907). The CAD management server 200 seeks the user account of the user us whose prediction value is assessed as having a problem when the learning model yet to be updated is used (step S3908). Then, the CAD management server 200 notifies that the learning model having an accuracy problem is updated based on the detected user account (step S3909).

Figure 41:
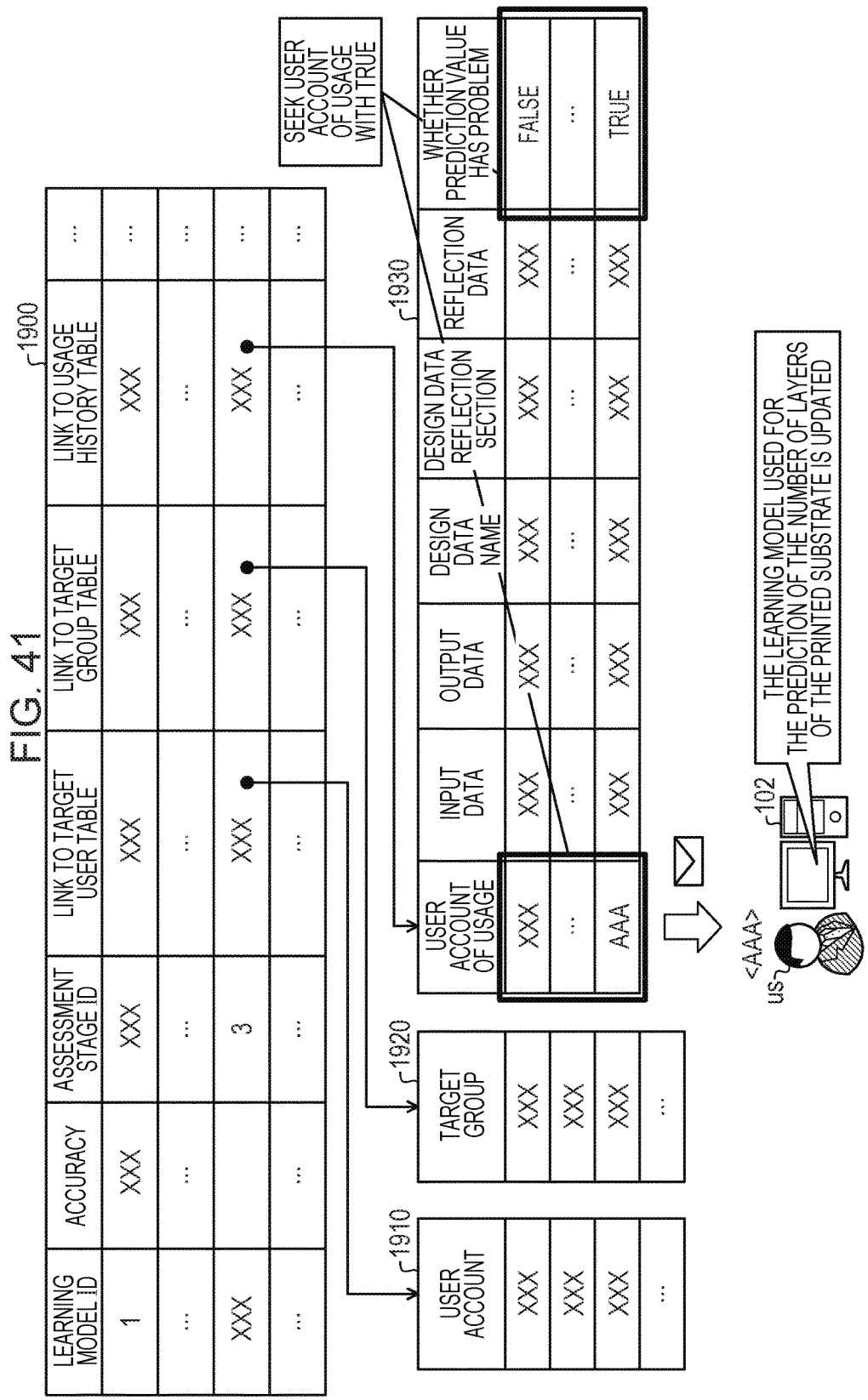
FIG. 41 is an explanatory diagram that illustrates a notification example of update of the learning model.

FIG. 41 is an explanatory diagram that illustrates a notification example of the update of the learning model. In step S3908, the CAD management server 200 searches for a record 1901 that corresponds to the learning model ID as the update target from the model ID management table 1900. The CAD management server 200 refers to the usage history table 1930 based on the link to the usage history table included in the detected record.

Then, the CAD management server 200 seeks the user account of usage with which the flag of whether the prediction value has a problem is "True" from the usage history table 1930 that corresponds to the learning model ID. In the example of FIG. 41, a user account of usage "AAA" is detected. In a case where the user account of usage is the address of the email, the cloud application management server notifies that the learning model having low prediction accuracy is updated by email based on the user account of usage. Then, the user terminal device 102 displays that the learning model is updated.

In such a manner, in a case where the learning model is updated, the user us whose prediction accuracy is assessed as low may be notified about the update of the learning model.

Figure 42:
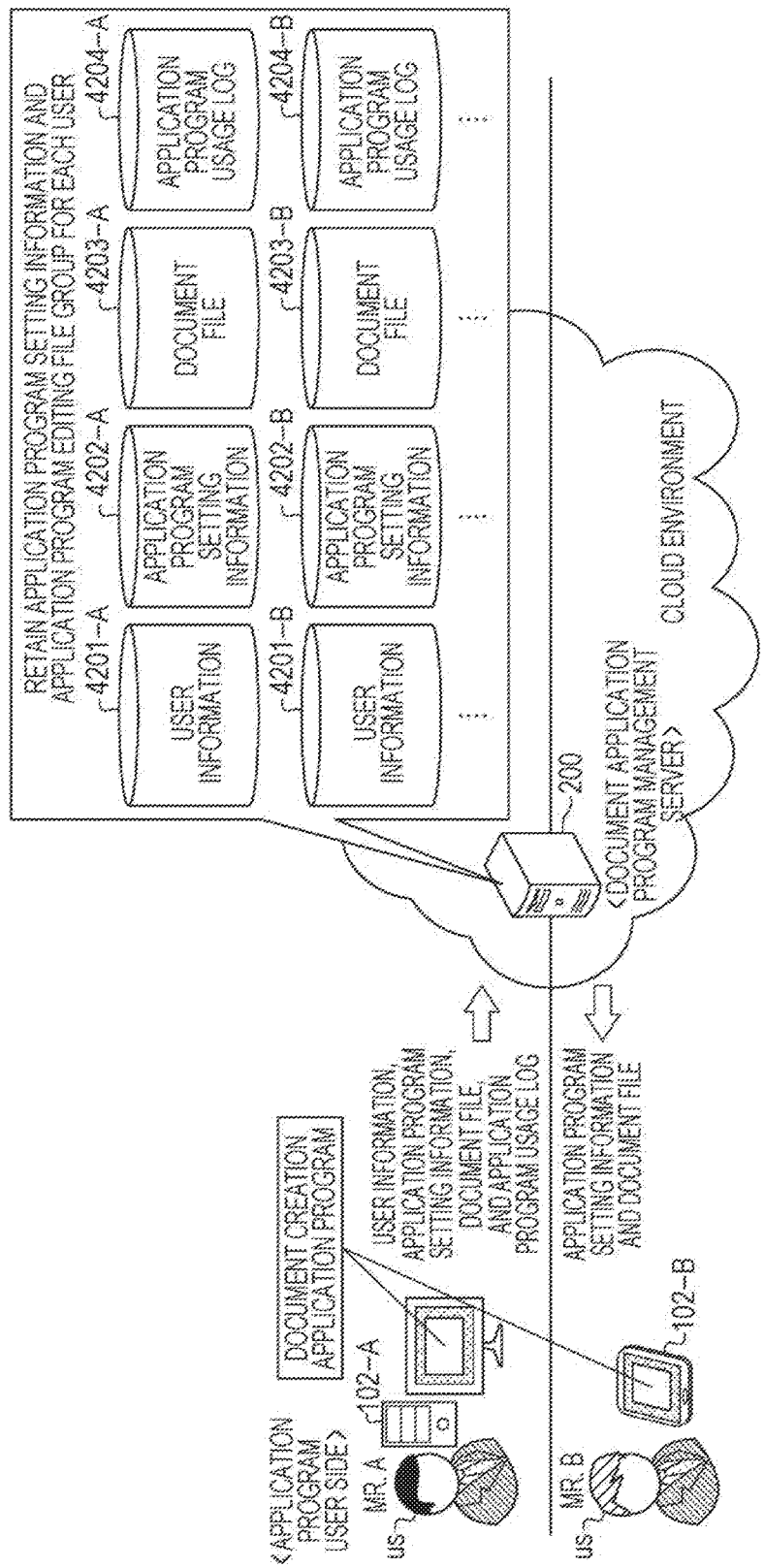
FIG. 42 is an explanatory diagram that illustrates an example where the cloud application is a document creation application program.

FIG. 42 is an explanatory diagram that illustrates an example where the cloud application is the document creation application program. As the cloud application that uses the learning model, for example, the document creation application program may be employed. The document creation application program is installed in the user terminal device 102. A document application program management server retains user information 4201, application program setting information 4202, and an application program editing file group such as a document file 4203 and an application program usage log 4204 for each of the users.

Figure 43:
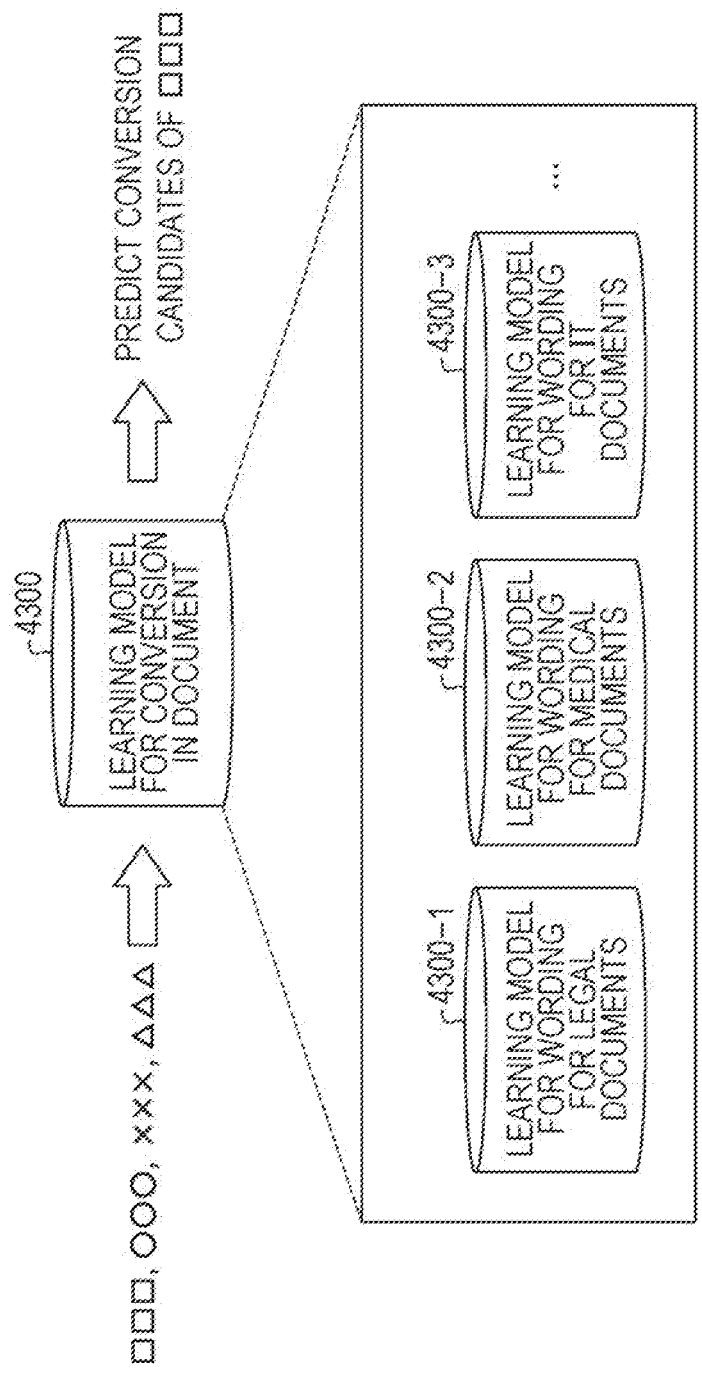
FIG. 43 is an explanatory diagram that illustrates a learning model example in accordance with purposes of use of the document creation application program.

FIG. 43 is an explanatory diagram that illustrates a learning model example in accordance with purposes of use of the document creation application program. As a learning model 4300 for the document creation application program, for example, a model that predicts conversion of wording may be raised. As the conversion of wording, for example, conversion of input kana characters to kanji characters may be raised.

The learning model 4300 is prepared in accordance with the purposes of use of the document creation application program. For example, documents that are created by the document creation application program may be categorized into legal documents, medical documents, IT documents, and so forth by the purposes of use.

For example, in a case where the conversion candidate of a kana character input "ちょう (chou)" is predicted, a learning model 4300-1 for legal documents may predict "庁 (agency (pronunciation: chou))", a learning model 4300-2 for medical documents may predict "腸 (intestine (pronunciation: chou))", and a learning model 4300-3 for IT documents may predict "長 (length (pronunciation: chou))".

In the learning model that predicts the conversion candidates, as the input data of the learning model 4300, for example, immediately prior input characters and so forth may be raised.

In a case where the conversion candidate of ☐☐☐ is predicted while a sentence of "in a learning model difference providing ○○○, ΔΔΔ of xxx is ☐☐☐" is being created, as the example in FIG. 43, "☐☐☐" and "leaning model difference providing ○○○, xxx, ΔΔΔ" are the input data. For example, in a case where "in the conference of gastroenterological medicine, tomorrow's subject is ちょう (chou)" is input, the conversion candidate of "ちょう (chou)" is output as "腸 (chou)".

Next, an assessment of the prediction accuracy will be described. For example, it is assumed that an assessment timing of the prediction accuracy is set as a time after completion of editing of the document data. In a case where the user terminal device 102 uploads the document data to a document application program server, the cloud application management server 200 analyzes the uploaded document data and identifies the conversion section that matches the "input data".

The cloud application management server 200 searches for sections, in which "learning model difference providing ○○○", "xxx", and "ΔΔΔ" are written, in the order of "learning model difference providing ○○○", "xxx", and "ΔΔΔ", from the document data, for example. Then, the cloud application management server 200 identifies a word next to the detected section as the section in which "☐☐☐" is converted.

The cloud application management server 200 assesses whether or not the identified section matches the prediction data of the conversion candidate of "☐☐☐". In a case where the prediction data is "⊙⊙⊙" and the identified section is "⊙⊙⊙", the cloud application management server 200 assesses the identified section as matching the prediction data of the conversion candidate of "☐☐☐". Next, in a case where the prediction data is "⊙⊙⊙" and the identified section is "★★★", the cloud application management server 200 assesses the identified section as not matching the prediction data of the conversion candidate of "☐☐☐". In such a manner, the cloud application management server 200 may calculate the prediction accuracy by assessing the mismatch degree. As for the calculation of the prediction accuracy, the cloud application is similar to the case of the CAD, and a detailed description will thus not be made.

Further, the prediction accuracy of the learning model may similarly be assessed about the cloud applications other than the CAD and a document application program.

As described in the foregoing, in a case where the mismatch degree between the prediction value of the data in the input data obtained by the input data in the application program and the learning model and the specified value of the data is high, the information processing device 101 notifies the device of the providing source of the learning model of the mismatch degree. Accordingly, the information about the divergence of the learning model 104 may be provided to the provider of the learning model. Therefore, the provider may consider correction to the learning model in accordance with the mismatch degree and may support an improvement in the prediction accuracy of the learning model.

Further, in a case where the ratio between the number of data, about which the mismatch degree calculated about individual data of plural input data is assessed as exceeding the second degree, and the number of all data exceeds the prescribed ratio, the information processing device 101 transmits the ratio to the device of the providing source. Accordingly, the information about the divergence of the learning model about the learning model having low accuracy may be provided to the provider. The device of the providing source may recognize that the prediction values that are obtained by the learning model are divergent from actual values in plural data. Therefore, the information processing device 101 may support correction to the learning model.

Further, the information processing device 101 transmits the calculated ratio to the device that corresponds to the user that uses the application program. Accordingly, the user of the learning model may perform an assessment about how reliable the prediction value of the learning model is.

Further, the information processing device 101 transmits the identification information of the learning model that corresponds to an arbitrary user and the calculated ratio about the learning model that corresponds to the arbitrary user to the request source of the notification request for the identification information of the learning model that corresponds to the arbitrary user that uses the application program. Accordingly, providing destinations of the learning model may be limited, and provision of the learning model that the provider does not intend may thereby be restrained. Further, even if plural learning models are present, usable learning models are clear for the user, and the user may thus use the learning model that is suitable for the user.

Further, in a case where the application program is the CAD, the information processing device 101 calculates the mismatch degree between the prediction data about an arbitrary item included in the design data and the specified data about the arbitrary item. Accordingly, the accuracy of the prediction values of the number of layers of the printed substrate and so forth that are included in a device as a design target may be improved.

Note that the learning model difference providing method that has been described in this embodiment may be realized by executing the learning model difference providing program that is in advance prepared by a computer such as a personal computer or a workstation. The learning model difference providing program is recorded in a computer-readable recording medium such as a magnetic disk, an optical disk, or a universal serial bus (USB) flash memory and is executed by being read out from the recording medium by a computer. Further, the learning model difference providing program may be distributed via the network 810 such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A computer-readable and non-transitory storage medium having stored a learning model difference providing program which causes a computer to execute:
storing, in a memory, identification information of each user among plural users which uses an application program and identification information of a learning model, among plural learning models, which is associated with the identification information of the user and capable of outputting prediction data in accordance with a purpose of use among purposes of use of the application program;
calculating, for each piece of data of plural pieces of data input by the plural users, respectively, a mismatch degree between,
first data predicted by the learning model about arbitrary input data, among the plural pieces of data, that is input by using the application program, the first data being obtained by the learning model in accordance with the purpose of use of the application program, and
second data specified by a user, among the plural users, as arbitrary input data, among the plural pieces of data, input by the user associated with the application program,
to obtain, based on the first and second data, a plurality of mismatch degrees corresponding to the application program associated with the plural users, respectively;
assessing whether the calculated mismatch degree exceeds a first degree;
transmitting the mismatch degree to a providing source of the learning model in a case where the mismatch degree is assessed as exceeding the first degree;
assessing whether a ratio of a number of the plurality of calculated mismatch degrees that exceed a second degree to a number of the plural pieces of data input by the plural users exceeds a predetermined ratio; and
transmitting the ratio as learning model analysis information, in a case where the ratio is assessed as exceeding the predetermined ratio, to a computer implementing the learning model to cause the computer to correct the learning model according to the learning model analysis information.

2. The storage medium of the learning model difference providing program according to claim 1, causing the computer to further execute:
transmitting the learning model analysis information to a terminal that corresponds to the user that uses the application program.

3. The storage medium of the learning model difference providing program according to claim 1, causing the computer to further execute:
receiving a notification request for identification information of the learning model that corresponds to the user that uses the application program; and
transmitting identification information of the learning model that corresponds to the user and the learning model analysis information that is calculated about the learning model, in response to the received notification request by referring to the memory.

4. The storage medium of the learning model difference providing program according to claim 1,
wherein the application program is an application program that supports design of an apparatus based on design data, and
the calculating of the mismatch degree, calculates a mismatch degree between the first data being about an item in the design data that is input by using the application program and design data that is specified for the item by the user.

5. A learning model difference providing method that causes a computer to execute a process comprising:
storing, in a memory, identification information of each user among plural users which uses an application program and identification information of a learning model, among plural learning models, which is associated with the identification information of the user and capable of outputting prediction data in accordance with a purpose of use among purposes of use of the application program;

calculating, for each piece of data of plural pieces of data input by the plural users, respectively, a mismatch degree between, first data predicted by the learning model about arbitrary input data, among the plural pieces of data, that is input by using the application program, the first data being obtained by the a learning model in accordance with the purpose of use of the application program, and second data specified by a user, among the plural users, as arbitrary input data, among the plural pieces of data, input by the user associated with the application program, to obtain, based on the first and second data, a plurality of mismatch degrees corresponding to the application program associated with the plural users, respectively;

assessing whether the calculated mismatch degree exceeds a first degree;

transmitting the mismatch degree to a providing source of the learning model in a case where the mismatch degree is assessed as exceeding the first degree;

assessing whether a ratio of a number of the plurality of calculated mismatch degrees that exceed a second degree to a number of the plural pieces of data input by the plural users exceeds a predetermined ratio; and transmitting the ratio as learning model analysis information, in a case where the ratio is assessed as exceeding the predetermined ratio, to a computer implementing the learning model to cause the computer to correct the learning model according to the learning model analysis information.

6. A learning model difference providing system comprising:

a first terminal that executes an application program;

a second terminal of a providing source of a learning model in accordance with a purpose of use of the application program; and an information processing device that manages data which are input by using the application program, wherein the information processing device includes a memory, and a processor that is coupled to the memory and executes a process comprising:

storing, in a memory, identification information of each user among plural users which uses an application program and identification information of a learning model, among plural learning models, which is associated with the identification information of the user and capable of outputting prediction data in accordance with a purpose of use among purposes of use of the application program;

calculating, for each piece of data of plural pieces of data input by the plural users, respectively, a mismatch degree between, first data predicted by the learning model about arbitrary input data, among the plural pieces of data, that is input from the first terminal by using the application program, the first data being obtained by the learning model in accordance with the purpose of use of the application program, and second data specified by a user, among the plural users, as arbitrary input data, among the plural pieces of data, input by the user associated with the application program, to obtain, based on the first and second prediction data, a plurality of mismatch degrees corresponding to the application program associated with the plural users, respectively;

assessing whether the calculated mismatch degree exceeds a first degree;

transmitting the mismatch degree to a providing source of the learning model in a case where the mismatch degree is assessed as exceeding the first degree;

assessing whether a ratio of a number of the plurality of calculated mismatch degrees that exceed a second degree to a number of the plural pieces of data input by the plural users exceeds a predetermined ratio, and transmitting the ratio as learning model analysis information, in a case where the ratio is assessed as exceeding the predetermined ratio, to the second terminal to cause the second terminal to correct the learning model according to the learning model analysis information.

* * * * *